(12) United States Patent
Yoo et al.

(10) Patent No.: US 10,770,355 B2
(45) Date of Patent: Sep. 8, 2020

(54) SEMICONDUCTOR DEVICES WITH VARIOUS LINE WIDTHS AND METHOD OF MANUFACTURING THE SAME

(71) Applicant: Samsung Electronics Co., Ltd., Suwon-si, Gyeonggi-do (KR)

(72) Inventors: Je-min Yoo, Suwon-si (KR); Sang-deok Kwon, Seoul (KR); Yuri Masuoka, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/394,589

(22) Filed: Apr. 25, 2019

(65) Prior Publication Data

US 2020/0058559 A1 Feb. 20, 2020

(30) Foreign Application Priority Data

Aug. 17, 2018 (KR) .......................... 10-2018-0096127

(51) Int. Cl.
| | | |
|---|---|---|
| *H01L 21/82* | (2006.01) | |
| *H01L 21/32* | (2006.01) | |
| *H01L 21/8234* | (2006.01) | |
| *H01L 29/66* | (2006.01) | |

(52) U.S. Cl.
CPC ...... *H01L 21/823468* (2013.01); *H01L 21/32* (2013.01); *H01L 21/823437* (2013.01); *H01L 29/66545* (2013.01)

(58) Field of Classification Search
CPC ............ H01L 21/823468; H01L 21/32; H01L 21/823437; H01L 29/66545

USPC ......................................................... 438/587
See application file for complete search history.

(56) References Cited

U.S. PATENT DOCUMENTS

| | | |
|---|---|---|
| 7,667,248 B2 | 2/2010 | Booth, Jr. et al. |
| 8,099,686 B2 | 1/2012 | Schultz |
| 8,735,296 B2 | 5/2014 | Jung et al. |
| 8,951,868 B1 | 2/2015 | Jain |
| 9,006,107 B2 | 4/2015 | Wang et al. |
| 9,165,765 B1 | 10/2015 | Raley et al. |
| 9,214,360 B2 | 12/2015 | Jang et al. |
| 9,859,174 B1 | 1/2018 | Bi et al. |
| 9,892,977 B2 | 2/2018 | Pae et al. |

(Continued)

FOREIGN PATENT DOCUMENTS

| | | |
|---|---|---|
| KR | 10-2016-0030378 A | 3/2016 |
| KR | 10-2017-0058039 A | 5/2017 |

*Primary Examiner* — Sheikh Maruf
(74) *Attorney, Agent, or Firm* — Harness, Dickey & Pierce, P.L.C.

(57) ABSTRACT

Provided are semiconductor devices having various line widths and a method of manufacturing the semiconductor device. The semiconductor device includes: a substrate including a first region and a second region, a plurality of first gate lines extending in a first direction in the first region and each having a first width in a second; a plurality of second gate lines extending in the first direction in the second region and each having a second width that is different from the first width in the second direction and a pitch that is the same as a pitch of the plurality of first gate lines; a spacer layer covering opposite side walls of each of the plurality of first gate lines and each of the plurality of second gate lines; and a first base layer arranged between the substrate and the spacer layer in the first region.

20 Claims, 51 Drawing Sheets

(56) References Cited

U.S. PATENT DOCUMENTS

| | | | | |
|---|---|---|---|---|
| 2007/0082492 A1* | 4/2007 | Kim | ............... | H01L 27/10885 |
| | | | | 438/694 |
| 2007/0141799 A1* | 6/2007 | Olligs | ............... | H01L 21/76831 |
| | | | | 438/386 |
| 2008/0073708 A1* | 3/2008 | Aiso | ............... | H01L 21/823437 |
| | | | | 257/334 |
| 2009/0289334 A1* | 11/2009 | Rachmady | ............ | H01L 29/4966 |
| | | | | 257/649 |
| 2010/0164051 A1* | 7/2010 | Chae | ............... | H01L 21/823437 |
| | | | | 257/499 |
| 2013/0059435 A1* | 3/2013 | Yang | ............... | H01L 21/32139 |
| | | | | 438/589 |
| 2013/0149854 A1* | 6/2013 | Ishii | ............... | H01L 21/82 |
| | | | | 438/587 |
| 2013/0320456 A1* | 12/2013 | Golonzka | ............ | H01L 21/76805 |
| | | | | 257/368 |
| 2014/0191299 A1* | 7/2014 | Wang | ............... | H01L 29/66545 |
| | | | | 257/288 |
| 2014/0239367 A1* | 8/2014 | Saito | ............... | H01L 27/11568 |
| | | | | 257/319 |
| 2014/0273377 A1* | 9/2014 | Kim | ............... | H01L 29/7848 |
| | | | | 438/283 |
| 2017/0140997 A1* | 5/2017 | Pae | ............... | H01L 29/6653 |
| 2017/0294310 A1* | 10/2017 | Tapily | ............... | H01L 21/0337 |

\* cited by examiner

SEMICONDUCTOR DEVICES WITH VARIOUS LINE WIDTHS AND METHOD OF MANUFACTURING THE SAME

CROSS-REFERENCE TO RELATED APPLICATION

This application claims the benefit of Korean Patent Application No. 10-2018-0096127, filed on Aug. 17, 2018, in the Korean Intellectual Property Office, the disclosure of which is incorporated herein in its entirety by reference.

BACKGROUND

Inventive concepts relates to a semiconductor device and/or a method of manufacturing the semiconductor device, and more particularly, to a semiconductor device having various line widths and/or a method of manufacturing the semiconductor device.

As the desire for miniaturization, high performance, and multi-functionality of electronic appliances has increased, semiconductor devices used in electronic appliances have also been demanded to have high integration, high performance, and multi-functionality. Therefore, there is an increasing desire to implement various line widths in a semiconductor device so that a highly-integrated semiconductor device may have various functions and/or improved performance.

However, in order for a semiconductor device to have various line widths, complex processes are used to implement different line widths, and accordingly, reliability of the semiconductor device degrades and/or manufacturing costs increase.

SUMMARY

Inventive concepts provides a semiconductor device having various line widths with improved reliability, and/or a method of manufacturing the semiconductor device, the method being capable of reducing an increase in manufacturing costs through simplification of processes.

According to some example embodiments of at least some inventive concepts, there is provided a method of manufacturing a semiconductor device, the method including: forming a plurality of dummy gate structures on a substrate, the substrate including a first region and a second region, the plurality of dummy gate structures extending in a first direction and arranged in the first region and the second region, the plurality of dummy gate structures in the first region and the second region having uniform pitches in a second direction different from the first direction, the plurality of dummy gate structures in the first region and the second region having uniform widths in the second direction. The method further comprises forming a first cover layer conformally covering the substrate included in the first region and the plurality of dummy gate structures included in the first region and forming a second cover layer conformally covering the first cover layer in the first region and conformally covering the substrate included in the second region and the plurality of dummy gate structures included in the second region; forming a spacer layer covering a.) the second cover layer that covers opposite side walls of the plurality of dummy gate structures included in the first region and b) the first cover layer that covers opposite side walls of the plurality of dummy gate structures included in the second region; forming a plurality of first gate spaces in the first region and a plurality of second gate spaces in the second region by removing together, from the first region and the second region, the plurality of dummy gate structures, a portion of the first cover layer, and a portion of the second cover layer; and forming a) a plurality of first gate lines filling the plurality of first gate spaces and b) a plurality of second gate lines filling the plurality of second gate spaces.

According to some example embodiments of at least some inventive concepts, there is provided a method of manufacturing a semiconductor device, the method including: preparing a substrate including a first region, a second region, a third region, and a fourth region; forming a plurality of first dummy gate structures in the first region and the second region, the plurality of first dummy gate structures extending in a first direction and each having a first pitch in a second direction different from the first direction and a first width in the second direction; forming a plurality of second dummy gate structures in the third region and the fourth region, the plurality of second dummy gate structures extending in the first direction and each having a second pitch in the second direction, the second pitch different from the first pitch, each of the plurality of second dummy gate structures having a second width in the second direction; forming a first cover layer in the first region and the third region, the first cover layer conformally covering the substrate and the plurality of first dummy gate structures; forming a second cover layer conformally covering the first cover layer in the first region and the third region, and conformally covering the substrate and the plurality of first and second dummy gate structures in the second region and the fourth region; forming a spacer layer covering opposite side walls of each of the plurality of first and second dummy gate structures included in the first region and the third region, and covering opposite side walls of each of the plurality of first and second dummy gate structures included in the second region and the fourth region; forming a plurality of first gate spaces, a plurality of second gate spaces, a plurality of third gate spaces, and a plurality of fourth gate spaces respectively in the first region, the second region, the third region, and the fourth region by removing the plurality of first and second dummy gate structures, a portion of the first cover layer, and a portion of the second cover layer; and forming a plurality of first gate lines filling the plurality of first gate spaces, a plurality of second gate lines filling the plurality of second gate spaces, a plurality of third gate lines filling the plurality of third gate spaces, and a plurality of fourth gate lines filling the plurality of fourth gate spaces.

According to some example embodiments of at least some inventive concepts, there is provided a semiconductor device including: a substrate comprising a first region and a second region; a plurality of first gate lines in the first region, the plurality of first gate lines extending in a first direction, each of the plurality of first gate lines having a first width in a second direction different from the first direction; a plurality of second gate lines in the second region, the plurality of second gate lines extending in the first direction, the plurality of second gate lines each having a second width in the second direction, the second with different from the first width, and a pitch in the second direction that is the same as a pitch of the plurality of first gate lines; a spacer layer covering opposite side walls of each of the plurality of first gate lines and each of the second gate lines; and a first base layer between the substrate and the spacer layer in the first region, the first base layer having a first thickness. In the second region, a bottom surface of the spacer layer and an upper surface of the substrate are in contact with each other.

According to some example embodiments of at least some inventive concepts, there is provided a method of manufacturing a semiconductor device, the method including: forming a plurality of dummy gate structures on a substrate, the substrate including a first region and a second region, the plurality of dummy gate structures extending in a first direction and arranged in the first region and the second region, the plurality of dummy gate structures in the first region and the second region having uniform pitches in a second direction different from the first direction, the plurality of dummy gate structures in the first region and the second region having uniform widths in the second direction, the forming the plurality of dummy gate structures including forming the plurality of dummy gate structures in the first region and the second region using a first photomask, the first photomask including patterns for the dummy gate structures in the first region and the second region; forming a first cover layer conformally covering the substrate included in the first region and the plurality of dummy gate structures included in the first region, the forming the first cover layer including using a second photomask, the second photomask including patterns corresponding to the first region; and forming a second cover layer conformally covering the first cover layer in the first region and conformally covering the substrate included in the second region and the plurality of dummy gate structures included in the second region.

BRIEF DESCRIPTION OF THE DRAWINGS

Embodiments of inventive concepts will be more clearly understood from the following detailed description taken in conjunction with the accompanying drawings in which.

DETAILED DESCRIPTION OF EXAMPLE EMBODIMENTS

Figure 1:
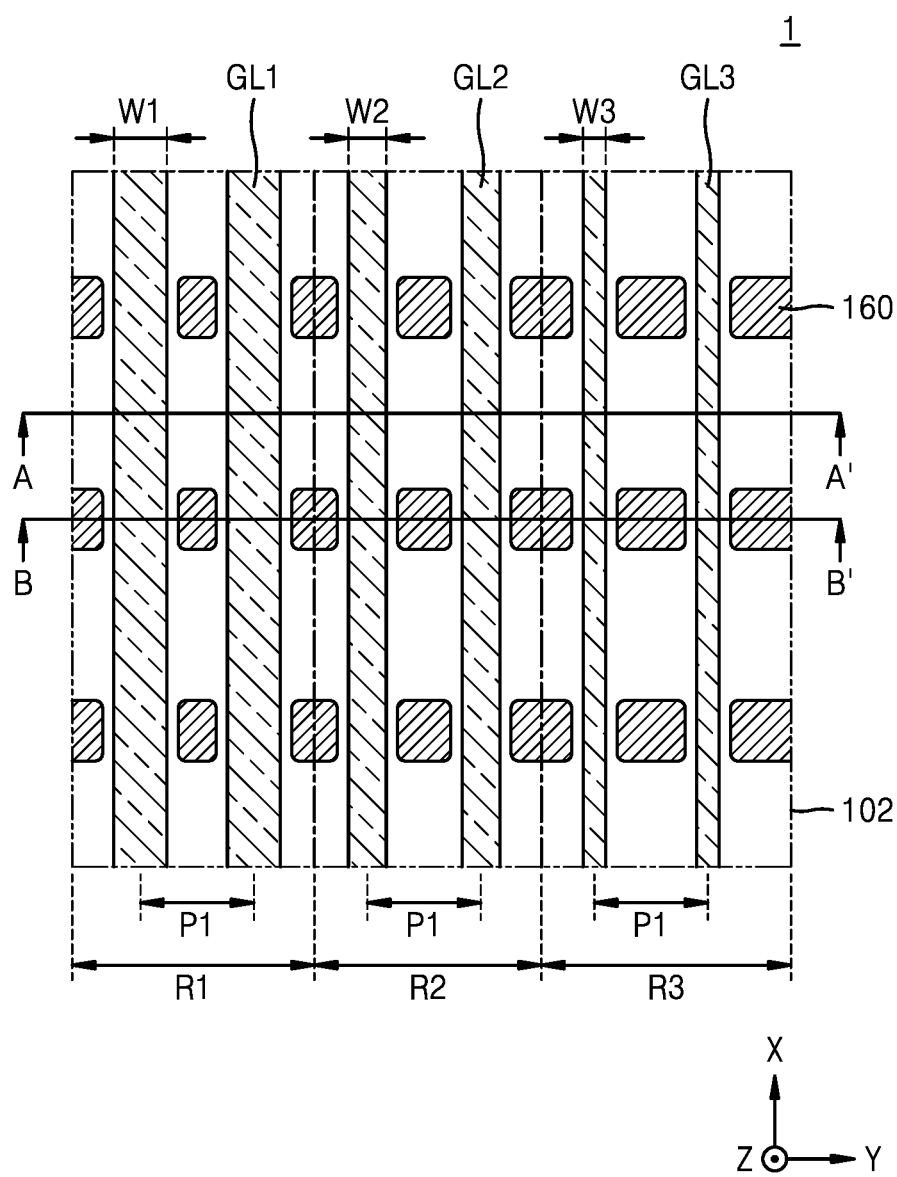
FIG. 1 is a plan view of a layout of a semiconductor device according to one or more example embodiments.

FIG. 1 is a plan view of a layout of a semiconductor device 1 according to one or more example embodiments.

Referring to FIG. 1, the semiconductor device 1 includes a substrate 102 having a first region R1, a second region R2, and a third region R3, and a plurality of gate lines GL1, GL2, and GL3 extending in a first direction (e.g., an X direction) on the substrate 102. The plurality of gate lines GL1, GL2, and GL3 may be arranged on the substrate 102 to have a first pitch P1 therebetween in a second direction (e.g., a Y direction). In some example embodiments, the second direction (Y direction) may be perpendicular to the first direction (X direction). The plurality of gate lines GL1, GL2, and GL3 may include first gate lines GL1 arranged in the first region R1, second gate lines GL2 arranged in the second region R2, and third gate lines GL3 arranged in the third region R3.

The first gate lines GL1 each have a first width W1 and are arranged with a first pitch P1 in the second direction (Y direction), and the first gate lines GL1 may be arranged in parallel with one another other and may extend in the first direction (X direction). The first gate lines GL1 may be arranged in the first region R1. The second gate lines GL2 each have a second width W2 and are arranged with the first pitch P1 in the second direction (Y direction), and the second gate lines GL2 may be arranged in parallel with one another and may extend in the first direction (X direction). The second gate lines GL2 may be arranged in the second region R2. The third gate lines GL3 each have a third width W3 and are arranged with the first pitch P1 in the second direction (Y direction), and the third gate lines GL3 may be arranged in parallel with one another and may extend in the first direction (X direction). The third gate lines may be arranged in the third region R3. The first width W1, the second width W2, and the third width W3 may have different from one another. In some example embodiments, the first width W1 may be greater than the second width W2, and the second width W2 may be greater than the third width W3.

The first region R1, the second region R2, and the third region R3 may be adjacent to one another on the substrate 102, but inventive concepts not limited thereto, and for example, the first region R1, the second region R2, and the third region R3 may be separate from one another. Also, in FIG. 1, the first region R1, the second region R2, and the third region R3 are sequentially arranged in the second direction (Y direction), but are not limited to the example. For example, based on one of the first region R1, the second region R2, and the third region R3, another region may be arranged at a side of the first direction (X direction) on the substrate 102, a side of the second direction (Y direction), or both the sides of the first and second directions (X-Y directions). In detail, the first region R1, the second region R2, and the third region R3 may be different regions on the substrate 102, on which the first, second, and third gate lines GL1, GL2, and GL3 having the same pitch P1 and different widths, that is, the first, second, and third widths W1, W2, and W3 from one another are arranged.

Source/drain regions 160 may be formed partially in the substrate 102 at opposite sides of each of the plurality of gate lines GL1, GL2, and GL3. A pair of source/drain regions 160 and a portion of one of the plurality of gate lines GL1, GL2, GL3 provided between the pair may configure (e.g., correspond to) one transistor.

In FIG. 1, the semiconductor device 1 includes the first, second, and third gate lines GL1, GL2, and GL3 having the same pitch P1 as one another, while having different widths, that is, first, second, and third widths W1, W2, and W3 from one another, but inventive concepts are not limited to the gate lines. For example, the semiconductor device 1 may have patterns other than the gate lines, such as metal line patterns and/or slotted contact or via patterns and/or serpentine line patterns, which have the same pitch as one another and different line widths from one another.

FIGS. 2 to 14B are cross-sectional views for describing a method of manufacturing the semiconductor device 1 and the semiconductor device 1 manufactured by the method, according to one or more example embodiments. FIGS. 2 to 14B ay correspond to a method of manufacturing the semiconductor device 1 in a process order. In detail, FIGS. 2 to 7, 8A, 9A, 10A, 11A, 12A, 13A, and 14A are cross-sectional views taken along line A-A' of FIG. 1, and FIGS. 8B, 9B, 10B, 11B, 12B, 13B, and 14B are cross-sectional views taken along line B-B' of FIG. 1.

Figure 2:
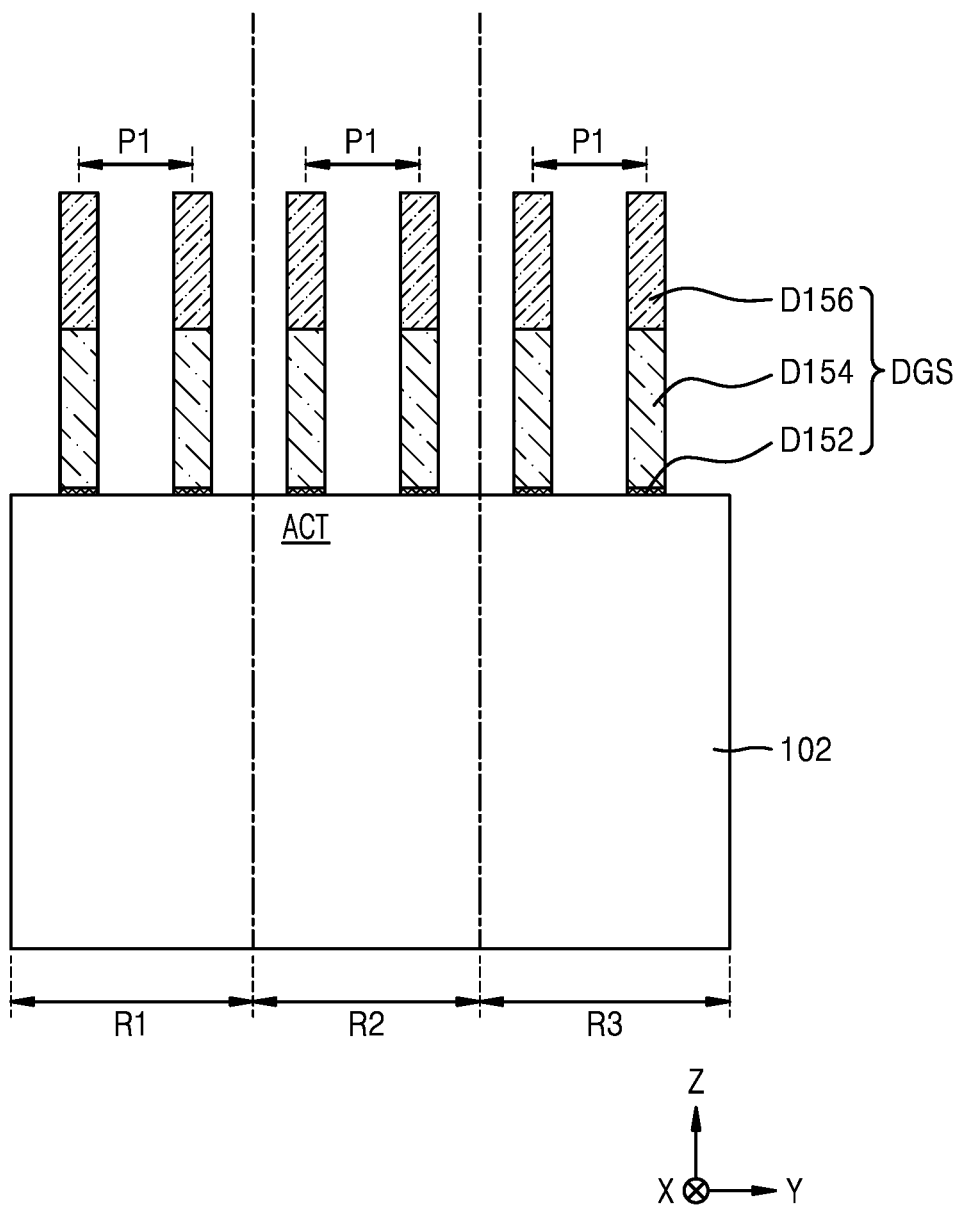
FIGS. 2 to 14B are cross-sectional views for describing a method of manufacturing a semiconductor device and a semiconductor device manufactured by the method, according to one or more example embodiments, in a processing order.

Referring to FIG. 2, a plurality of dummy gate structures DGS extending in the first direction (X direction) are formed on the substrate 102 having an active area ACT. The plurality of dummy gate structures DGS may be arranged to have the same width and the same first pitch P1 as one another along the second direction (Y direction).

The substrate 102 may include a semiconductor material such as Si and/or Ge, or a semiconductor compound material such as SiGe, SiC, GaAs, InAs, and/or InP.

Each of the plurality of dummy gate structures DGS may have a structure, in which an oxide layer D152, a dummy gate layer D154, and a capping layer D156 are stacked, e.g. sequentially stacked. According to an example for forming the plurality of dummy gate structures DGS, the oxide layer D152, the dummy gate layer D154, and the capping layer D156 are sequentially formed on the substrate 102, and then are patterned to remain the oxide layer D152, the dummy gate layer D154, and the capping layer D156 only on necessary regions. In some example embodiments, the oxide layer D152 may include a silicon oxide layer, the dummy gate layer D154 may include doped or undoped polysilicon, and the capping layer D156 may include a silicon nitride layer, but one or more example embodiments are not limited to the above example.

The plurality of dummy gate structures DGS may be formed by, for example, a photolithography process such as a deep ultraviolet (DUV) process, an immersion photolithographic process, a double patterning technology (DPT) process, a quadruple patterning technology (QPT) process, and/or an extreme ultraviolet (EUV) process, etc. A wavelength of light used in the photolithographic process may be, e.g., 248 nm, 193 nm or 13.5 nm; however, inventive concepts are not limited thereto. Furthermore, the photolithographic process may be or include an immersion photolithographic process; however, inventive concepts are not limited thereto. Still further, the plurality of dummy gate structures DGS may be formed with an etching process, for example an anisotropic reactive ion etching process. Still further, the photolithographic process used in forming the plurality of dummy gate structures may use one first photomask 350 containing patterns DGS1, DGS2, DGS3, corresponding to dummy gate structures in the first region, the second region, and the third region, respectively (see FIG. 33A).

Figure 3:
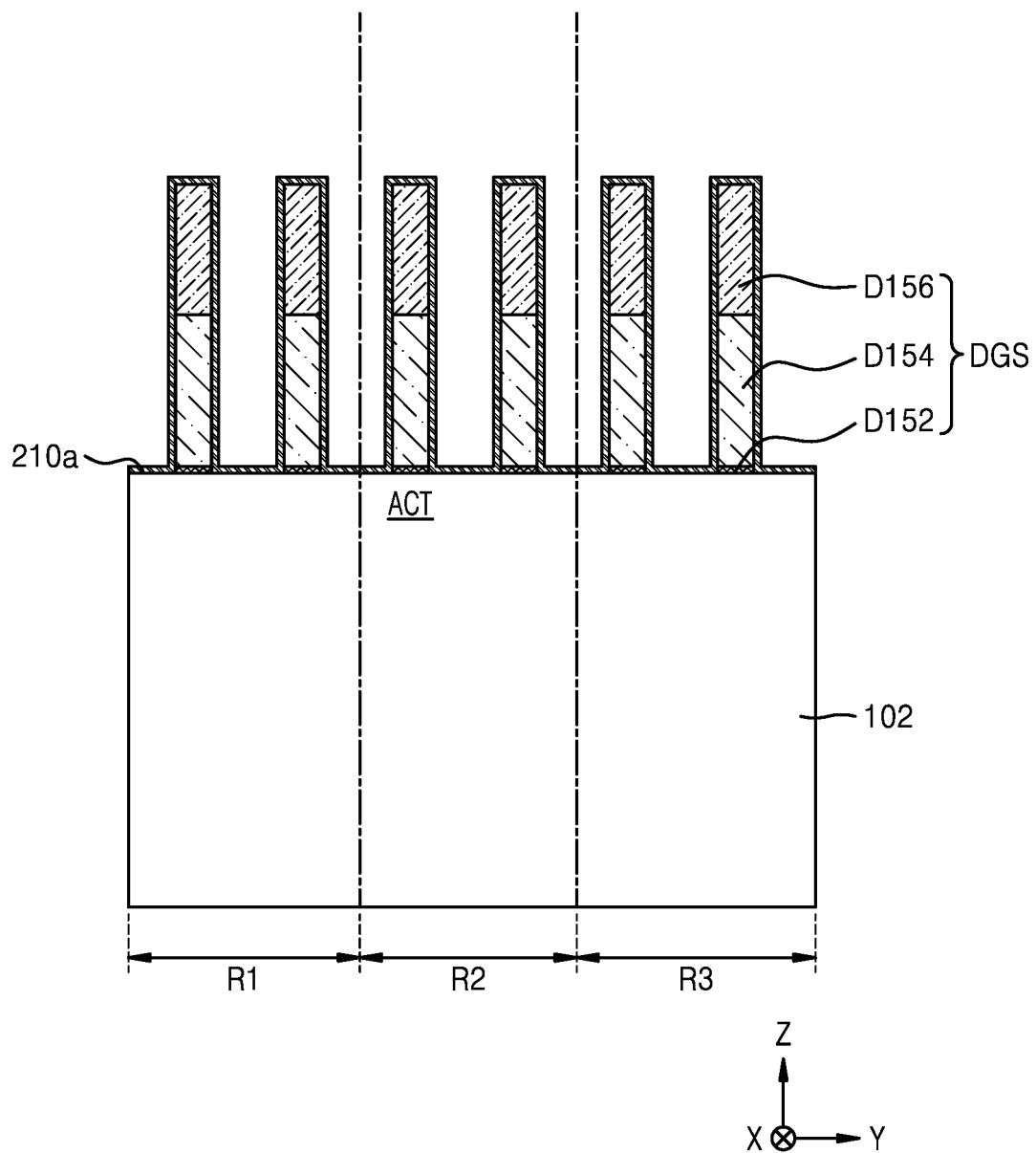

Referring to FIG. 3, a first cover layer 210a is formed on the substrate 102, on which the plurality of dummy gate structures DGS are formed. The first cover layer 210a has a uniform thickness throughout the first region R1, the second region R2, and the third region R3, and may cover, e.g. conformally cover, an upper surface of the substrate 102, and an upper surface and a side wall of each of the plurality of dummy gate structures DGS. The first cover layer 210a may include polysilicon or a silicon nitride layer, but inventive concepts are not limited thereto. In some example embodiments, the first cover layer 210a may include undoped polysilicon. In some example embodiments, the first cover layer 210a may include a silicon nitride layer having a nitrogen content that is different from that of a spacer layer 120 (see, e.g., FIG. 7). The first cover layer 210a may be formed with a chemical vapor deposition (CVD) process. For example, the first cover layer 120a may be formed with a plasma enhanced chemical vapor deposition (PECVD) process and/or an atomic layer deposition (ALD) process; however, inventive concepts are not limited thereto.

A thickness of the first cover layer 210a may be defined taking into account a difference between widths of the first gate line GL1 and the second gate line GL2 shown in FIG. 1, that is, a difference between the first width W1 and the second width W2. In some example embodiments, the thickness of the first cover layer 210a may be about half the difference between the first width W1 and the second width W2.

Figure 4:
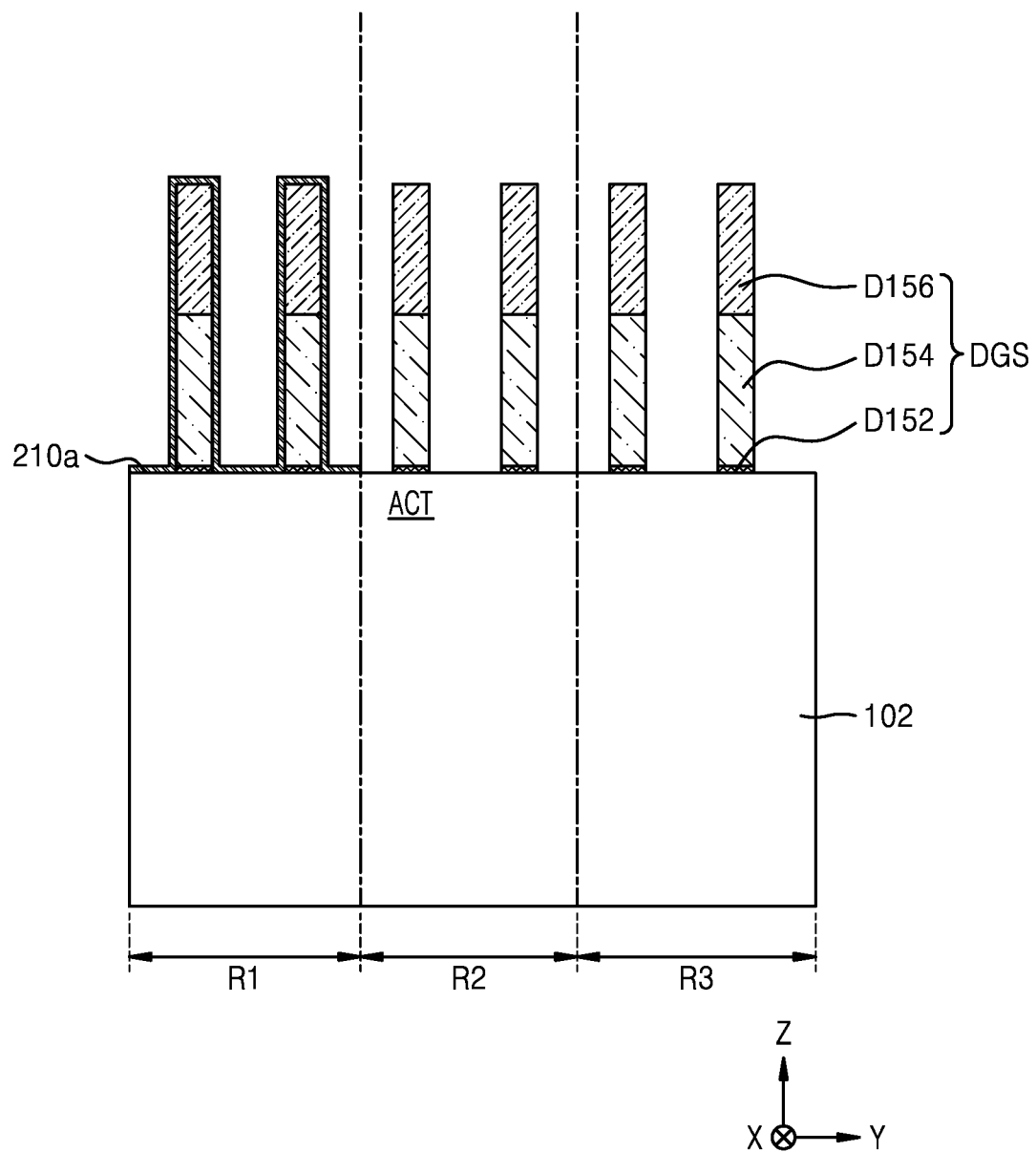

Referring to FIG. 4, a mask layer (not shown) that covers the first region R1 and exposes both the second region R2 and the third region R3 is formed, for example with a photolithographic process. The photolithographic process used in forming the mask layer may not be the same as the photolithographic process used in forming the plurality of dummy gate structures DGS1 and DGS2, and instead may use a wavelength of light different from (e.g. larger than) that used in forming the plurality of dummy gate structures DGS1 and DGS2. The photolithographic process used in forming the mask layer may not be or include one of a deep ultraviolet (DUV) process, a double patterning technology (DPT) process, a quadruple patterning technology (QPT) process, or an extreme ultraviolet (EUV) process. For example, the photolithographic process used in forming the mask layer may be or include at least one of a mid ultraviolet (MUV) or an i-line process, with a larger wavelength of light, e.g. 365 nm or larger. Furthermore, the photolithographic process used in forming the mask layer may use a second photomask 331 that has a pattern 350 corresponding to the first region R1 (see FIG. 33B). Portions of the first cover layer 210a on the second region R2 and the third region R3 are removed, e.g. removed with an etching process such as an anisotropic etching process and/or a wet chemical etching process, so that the first cover layer 210a only remains on the first region R1. The portion of the second cover layer 210b on the third region R3 may be removed with an anisotropic etch and/or an isotropic etch. For example, the portion of the second cover layer 210 on the third region R3 may be removed with a wet etch. After that, the mask layer may be removed. For example, if the mask layer includes photoresist then the mask layer may be removed with an oxide ash removal process.

Figure 5:
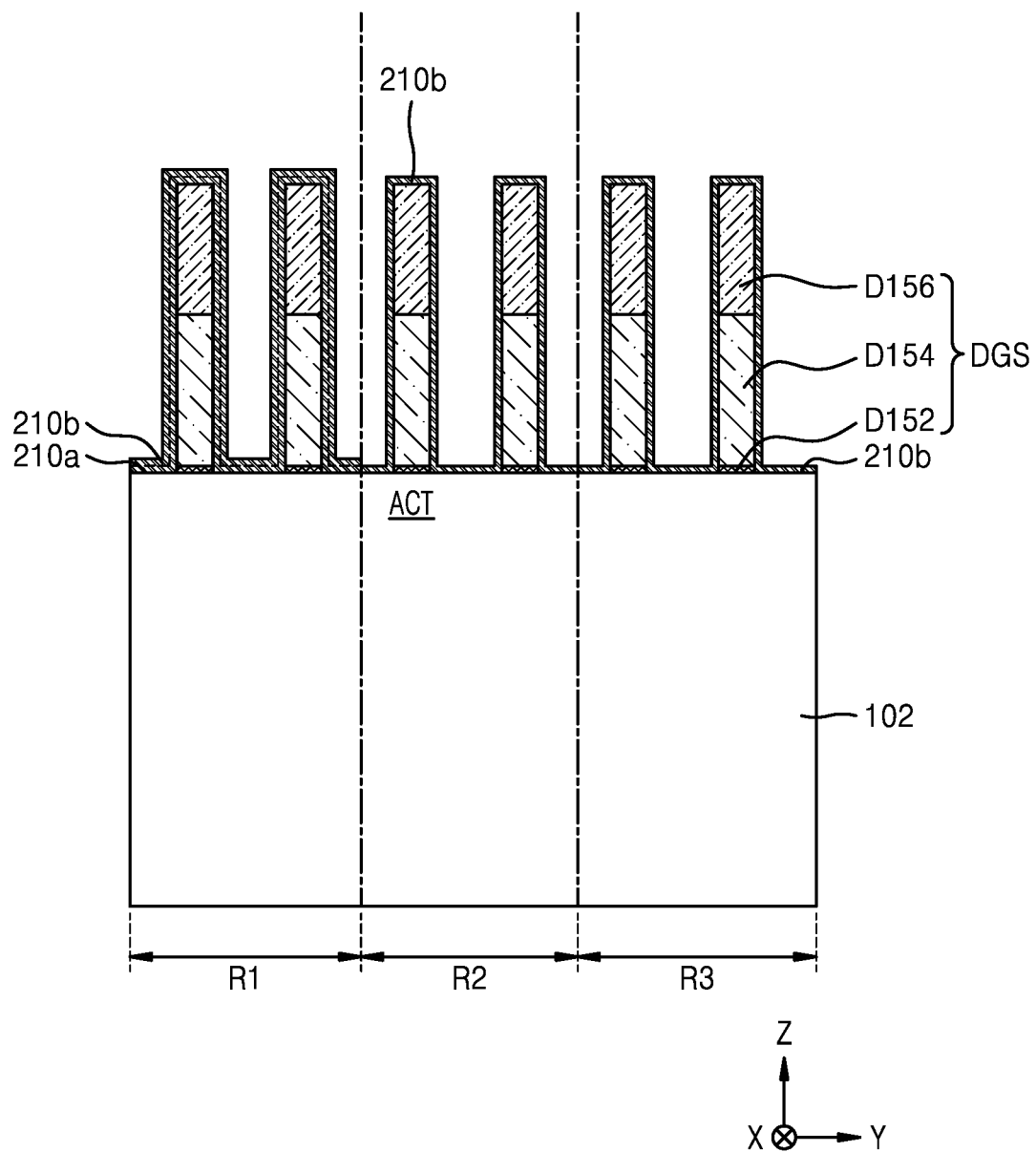

Referring to FIG. 5, a second cover layer 210b is formed on a resultant object of FIG. 4. The second cover layer 210b may have a uniform thickness throughout the first region R1, the second region R2, and the third region R3, and may conformally cover a surface of the first cover layer 210a in the first region R1, and the upper surface of the substrate 102 and the upper surface and the side wall of each of the plurality of dummy gate structures DGS in the second and third regions R2 and R3. In some example embodiments, the second cover layer 210b may include the same material as that of the first cover layer 210a, and may be formed with a process similar to that used in forming the first cover layer 210a, but inventive not limited thereto.

The second cover layer 210b may have the thickness that is the same as or similar to that of the first cover layer 210a, but inventive concepts are not limited thereto. The thickness of the second cover layer 210b may be defined taking into account a difference between widths of the second gate line GL2 and the third gate line GL3 shown in FIG. 1, for example, a difference between the second width W2 and the third width W3. In some example embodiments, the thickness of the second cover layer 210b may be about half the difference between the second width W2 and the third width W3. In some example embodiments, when the difference between the first width W1 and the second width W2 and the difference between the second width W2 and the third width W3 are equal to each other, the second cover layer 210b may have the same thickness as that of the first cover layer 210a.

Figure 6:
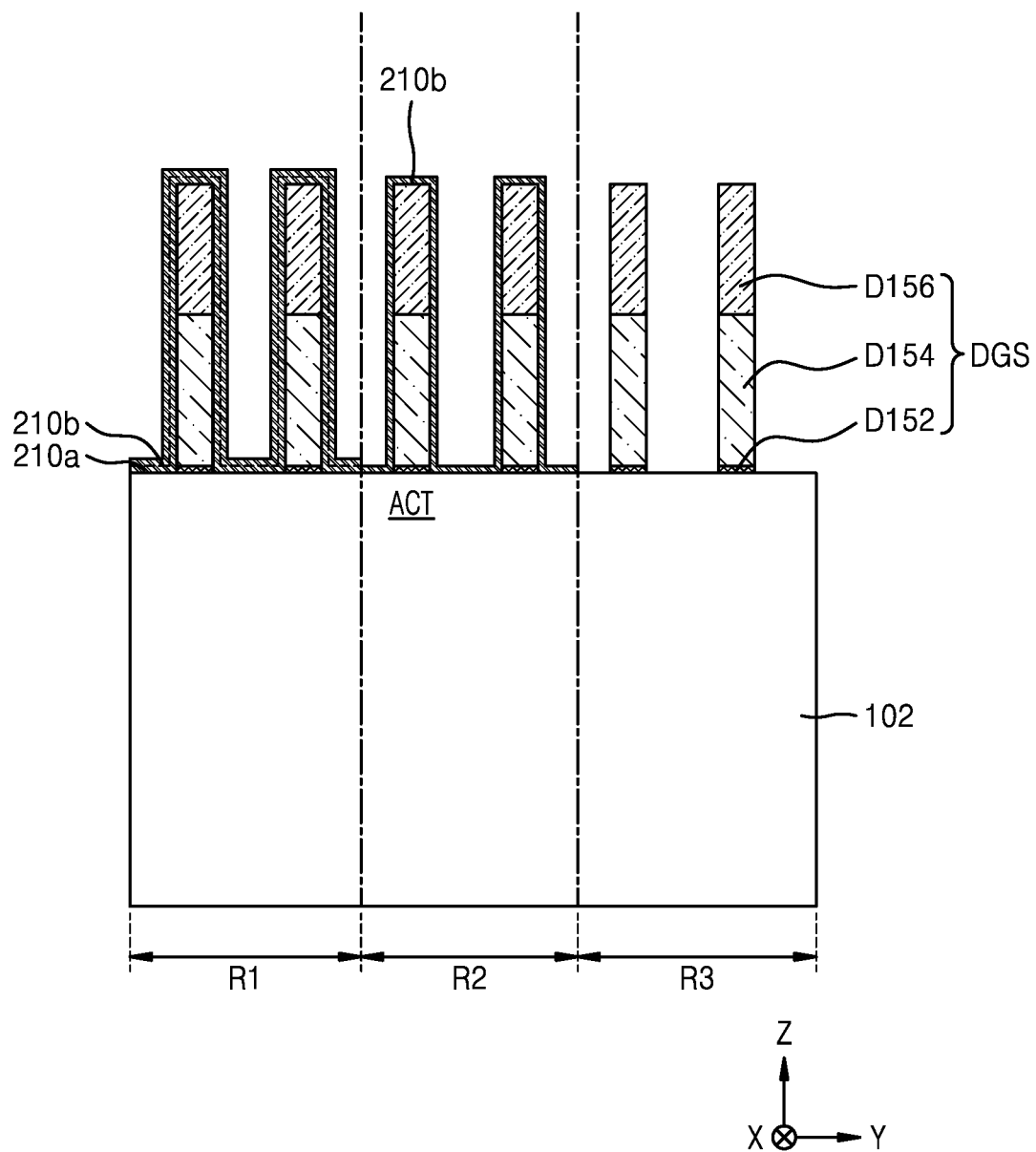

Referring to FIG. 6, a mask layer (not shown) covering the first region R1 and the second region R2 and exposing the third region R3 is formed, e.g. formed with a photolithographic process similar to that described above with reference to FIG. 4, and a portion of the second cover layer 210b on the third region R3 is removed so that the second cover layer 210b only remains on the first region R1 and the second region R2. The portion of the second cover layer 210b on the third region R3 may be removed with an anisotropic etch and/or an isotropic etch. For example, the portion of the second cover layer 210 on the third region R3 may be removed with a wet etch. After that, the mask layer may be removed, e.g. may be removed in a process similar to that discussed above with reference to FIG. 4. The photolithographic process used in exposing the third region may use a third photomask 332 that includes patterns 351 and 352 corresponding to the first region R1 and the second region R2 (see FIG. 33C).

Figure 7:
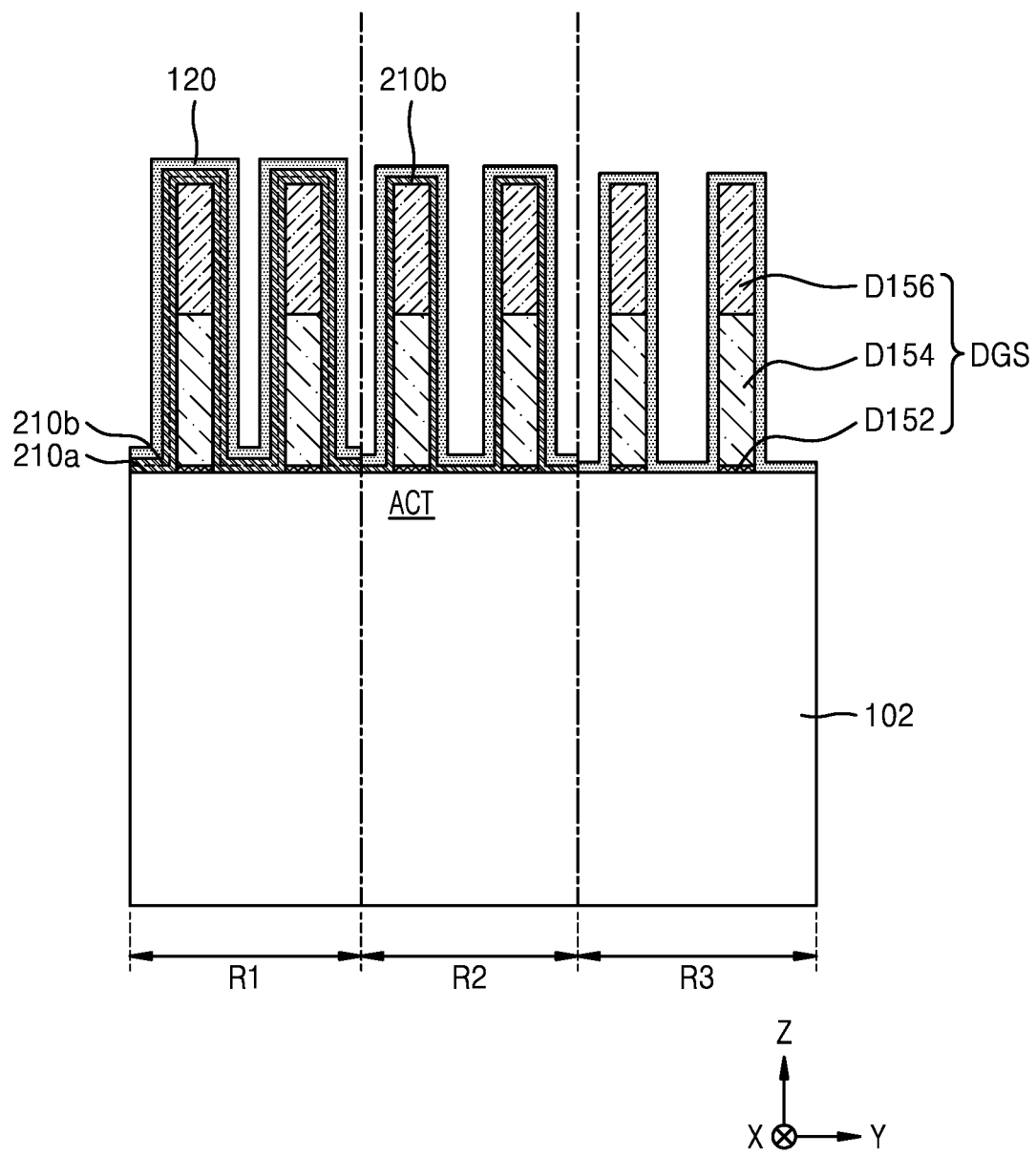

Referring to FIG. 7, a spacer layer 120 is formed on the resultant object of FIG. 6. The spacer layer 120 has a uniform thickness throughout the first region R1, the second region R2, and the third region R3, and may cover, e.g. conformally cover, a surface of the second cover layer 210b in the first region R1, a surface of the first cover layer 210a in the second region R2, and the upper surface of the substrate 102 and the upper surface and the side wall of each of the plurality of dummy gate structures DGS in the third region R3. The spacer layer 120 may include a silicon nitride layer, but inventive concepts are not limited thereto. In some example embodiments, the spacer layer 120 may include a silicon nitride layer having a nitrogen content that is different from that of the first cover layer 210a. An etch selectivity of the spacer layer 120 may be different from that of the first cover layer 210a.

Figure 8A:
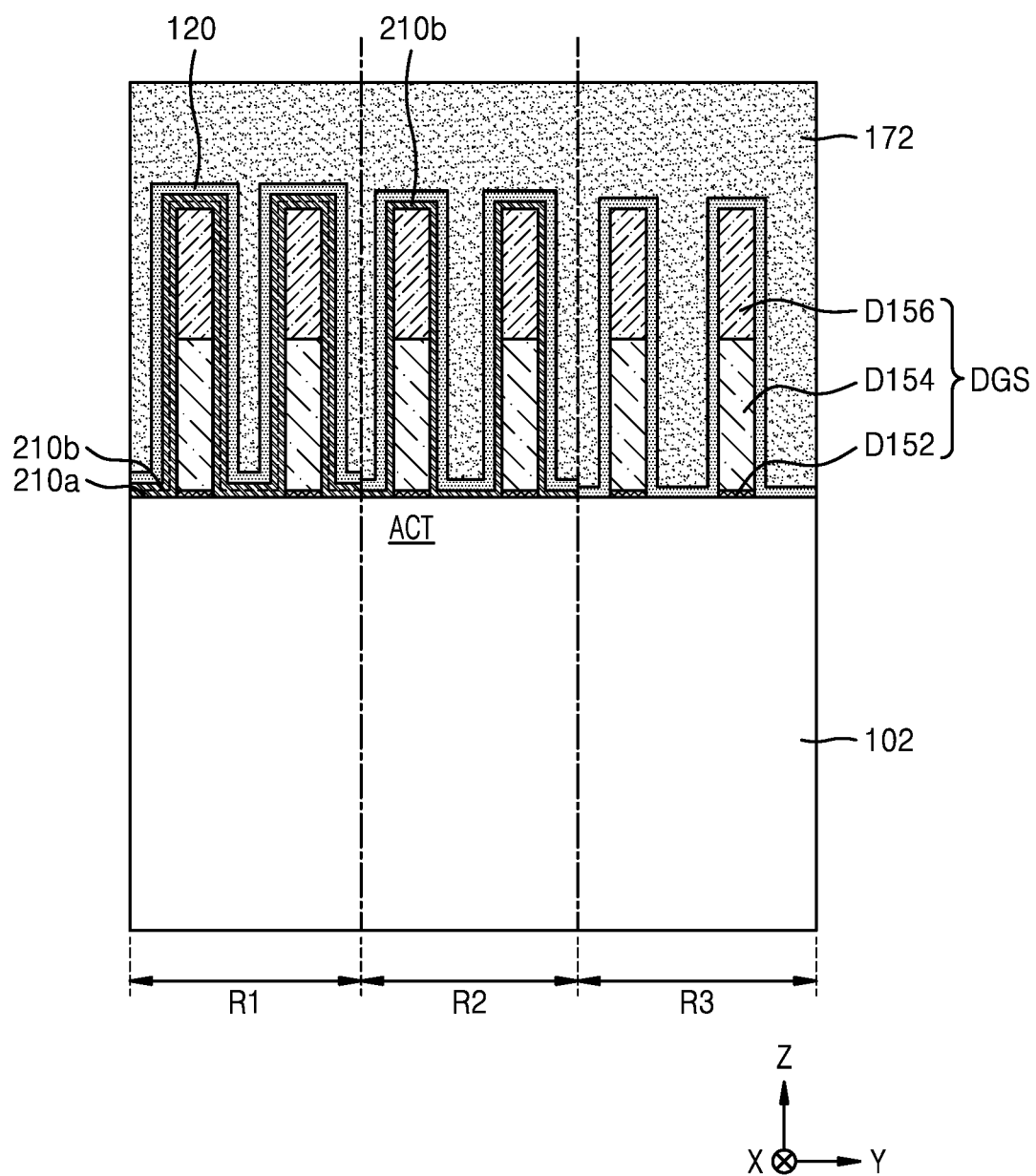
Figure 8B:
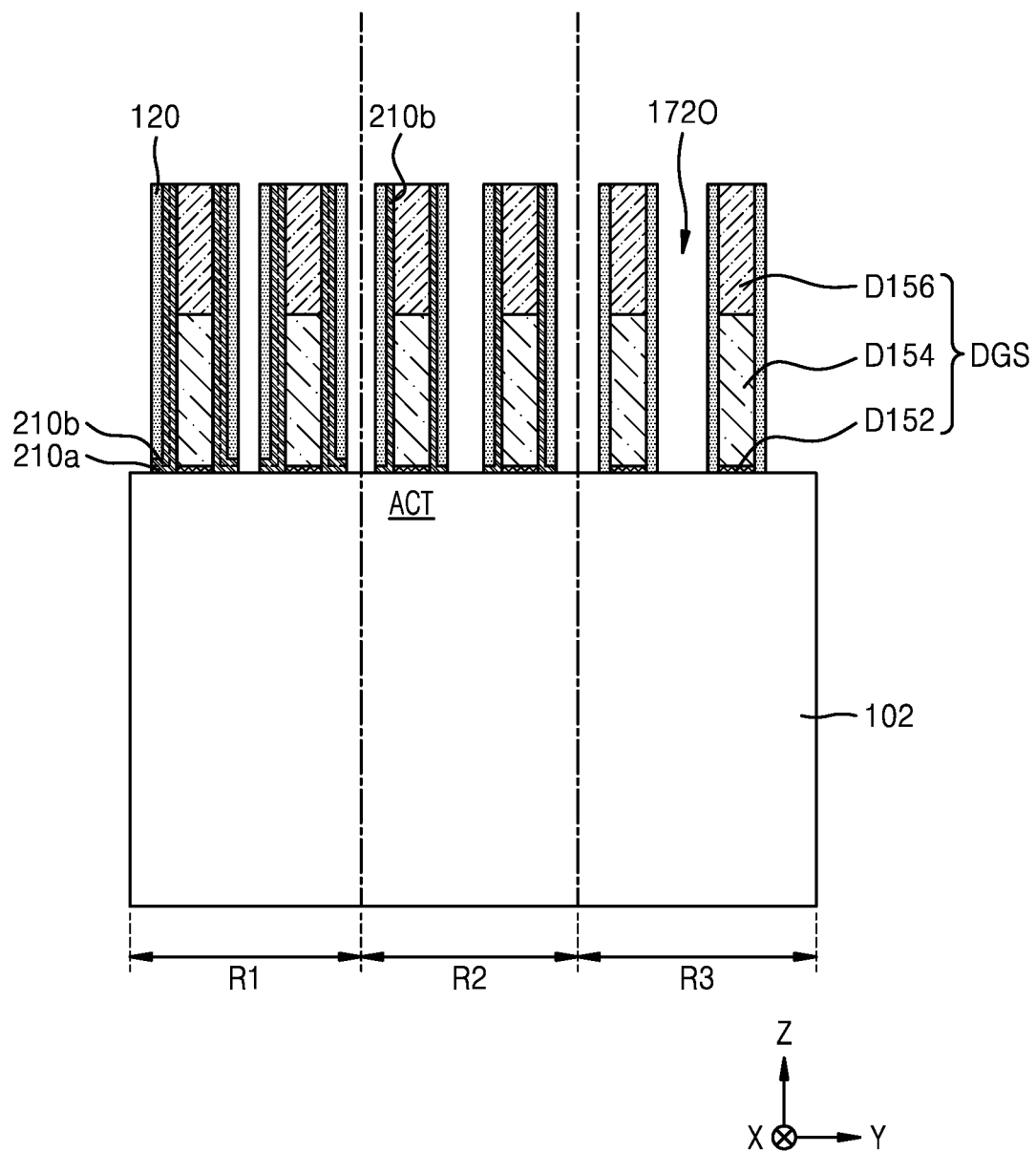

Referring to FIGS. 8A and 8B, a first inter-gate insulating layer 172 having an opening 172O extending in the second direction (Y direction) is formed on the resultant object of FIG. 7. In some example embodiments, the first inter-gate insulating layer 172 may include a silicon oxide layer. The first inter-gate insulating layer 172 may include, for example, tetra-ethyl ortho silicate (TEOS); however, inventive concepts are not limited thereto. In FIG. 8B, in order to clearly show the opening 172O, other portions than a cut surface (e.g., a rear portion of the cut surface in the X direction) are not shown.

The first inter-gate insulating layer 172 may be obtained by forming a first preliminary lower insulating layer covering the plurality of dummy gate structures DGS, the first cover layer 210a, and the second cover layer 210b, and partially removing the first preliminary lower insulating layer to form the opening 172O. During the forming of the opening 172O, a portion of the first cover layer 210a and a portion of the second cover layer 210b covering the upper surface of the substrate 102 are removed, so that the active area ACT among the plurality of dummy gate structures DGS are partially exposed on a bottom surface of the opening 172O. Also, during the forming of the opening 172O, portions of the first cover layer 210a and the second cover layer 210b covering the upper surfaces of the plurality of dummy gate structures DGS exposed in the opening 172O, for example, the upper surface of the capping layer D156, may be also removed so that the upper surface of the capping layer D156 may be partially exposed in the opening 172O.

Figure 9A:
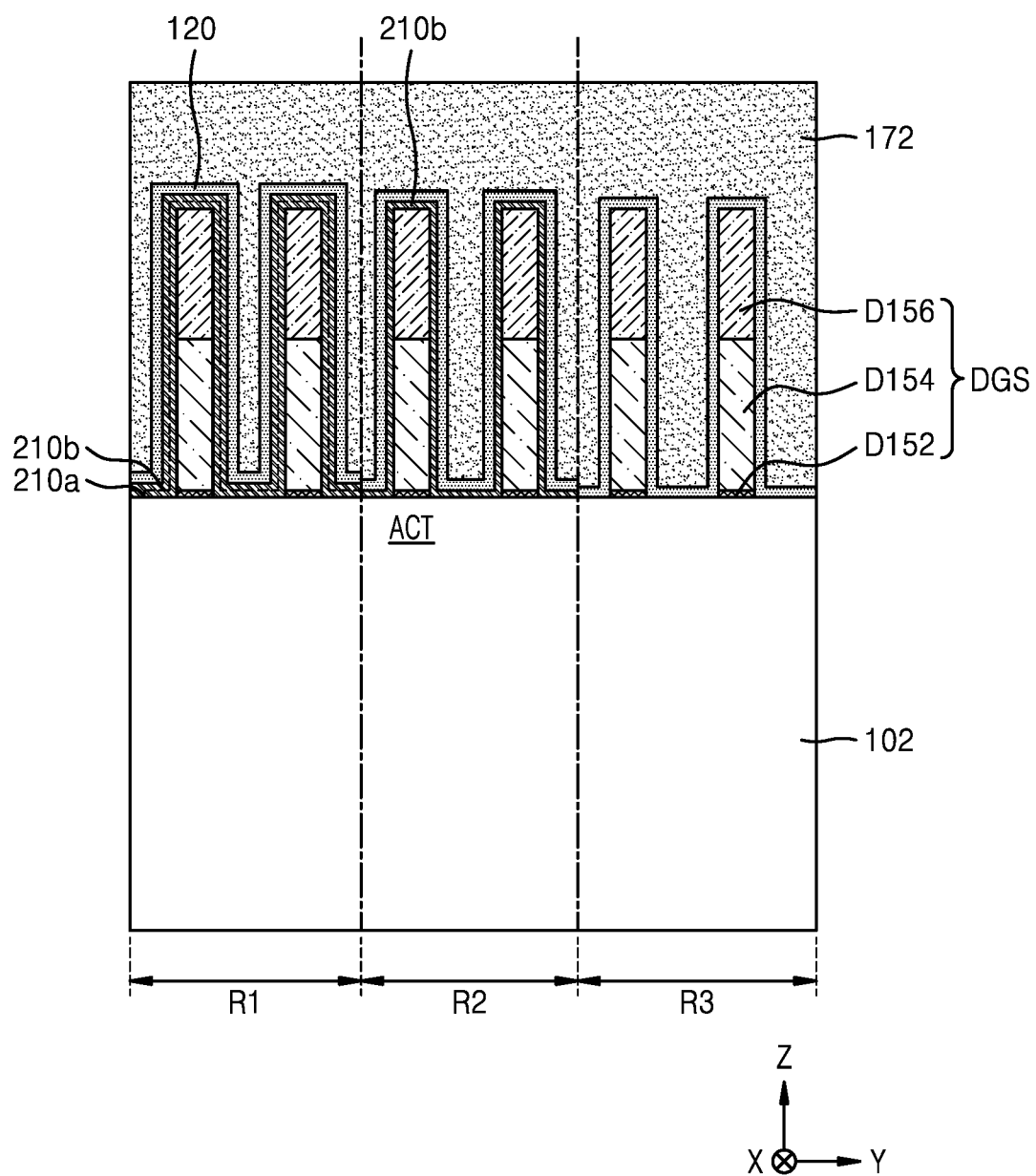
Figure 9B:
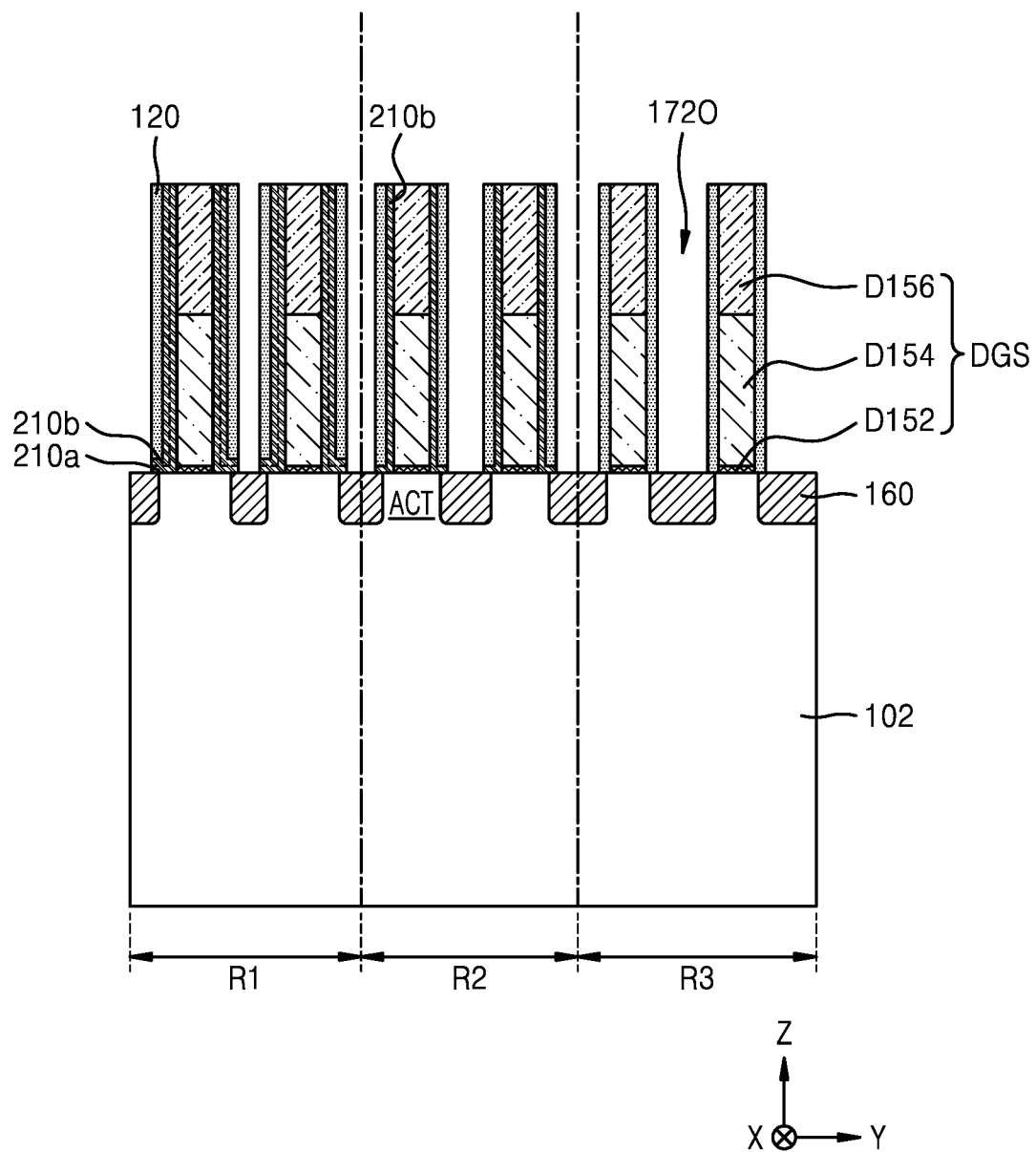

Referring to FIGS. 9A and 9B, a plurality of source/drain regions 160 are formed on the active area ACT exposed on the bottom surface of the opening 172O. In some example embodiments, the plurality of source/drain regions 160 may be obtained by partially injecting, e.g. implanting, impurities in the active area ACT exposed on the bottom surface of the opening 172O. For example, the impurities injected to form the plurality of source/drain regions 160 may be boron (B) ions, phosphorous (P) ions, and/or arsenic (As) ions. The impurities may be injected with a plasma assisted doping (PLAD) doping process and/or a beamline implantation process; however, inventive concepts are not limited thereto.

Figure 10A:
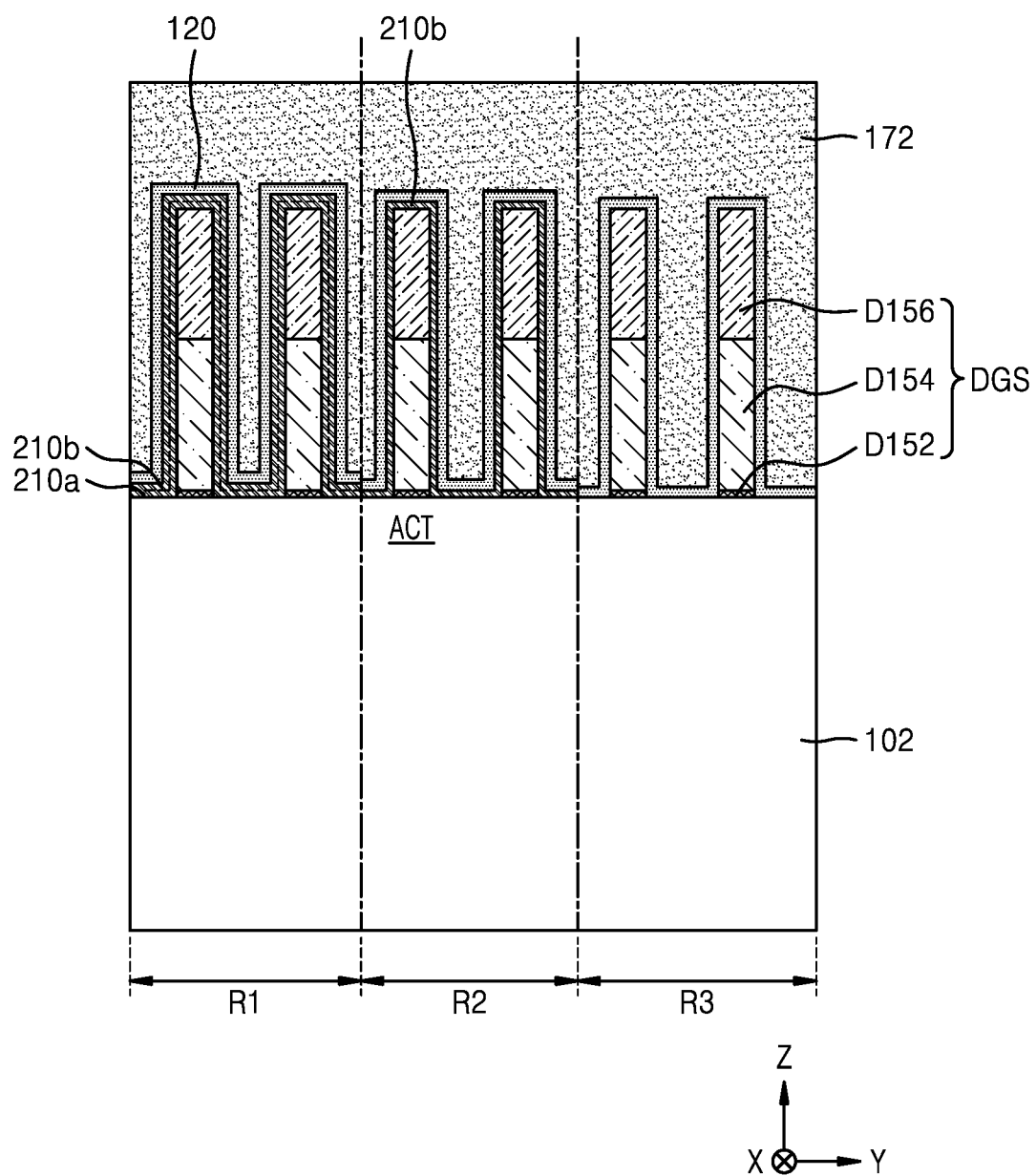
Figure 10B:
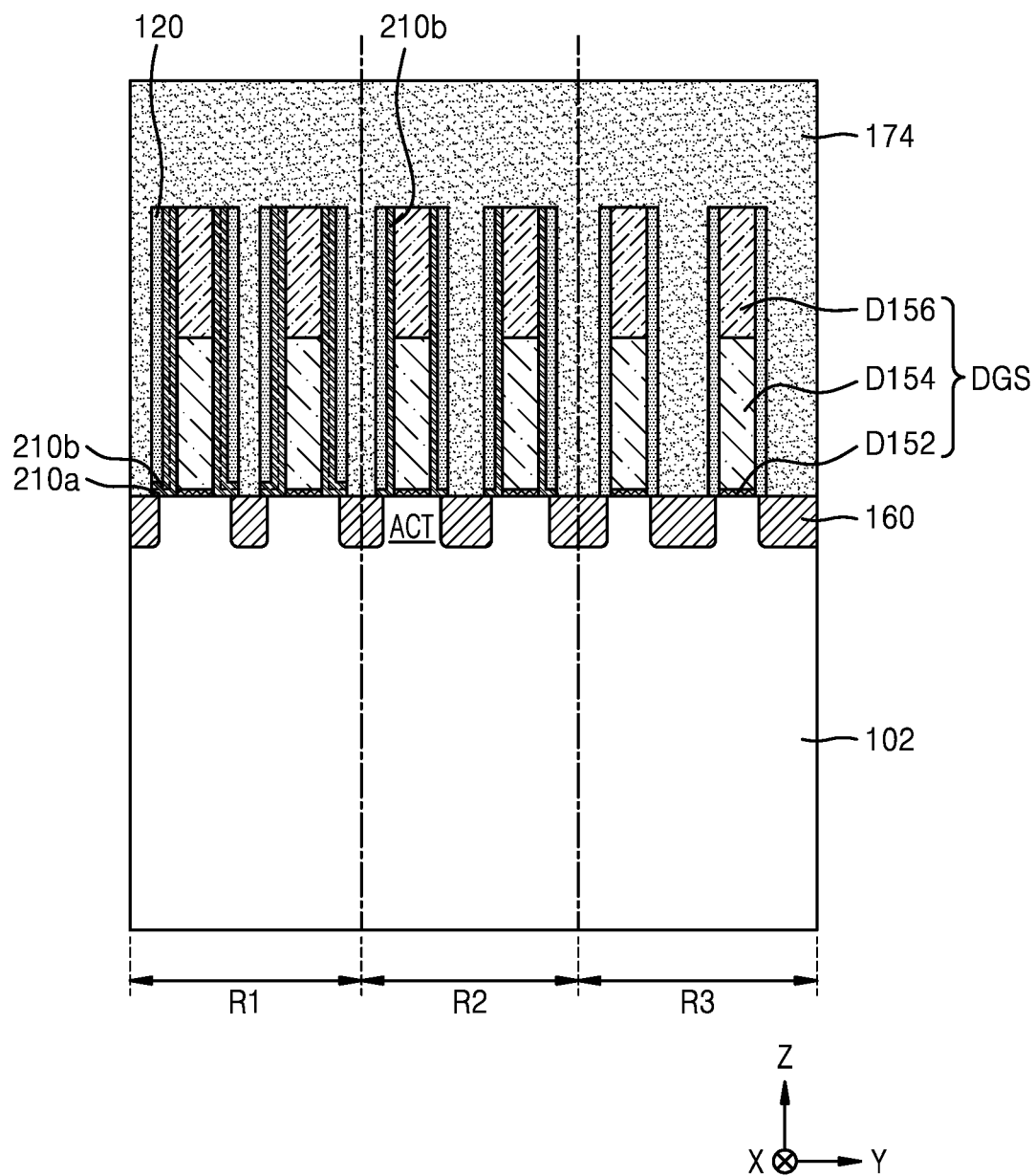

Referring to FIGS. 10A and 10B, a second inter-gate insulating layer 174 filling the opening 172O (see FIG. 9B) is formed. The second inter-gate insulating layer 174 may include a material having characteristics that are the same as or similar to those of a material included in the first inter-gate insulating layer 172. In some example embodiments, the second inter-gate insulating layer 174 may include a silicon oxide layer. The second inter-gate insulating layer 174 may include, for example, tetra-ethyl ortho silicate (TEOS); however, inventive concepts are not limited thereto.

The second inter-gate insulating layer 174 may be obtained by forming a second preliminary lower insulating layer filling the opening 172O and covering the first inter-gate insulating layer 172, and partially removing an upper portion of the second preliminary lower insulating layer so as to expose the upper surface of the first inter-gate insulating layer 172.

Figure 11A:
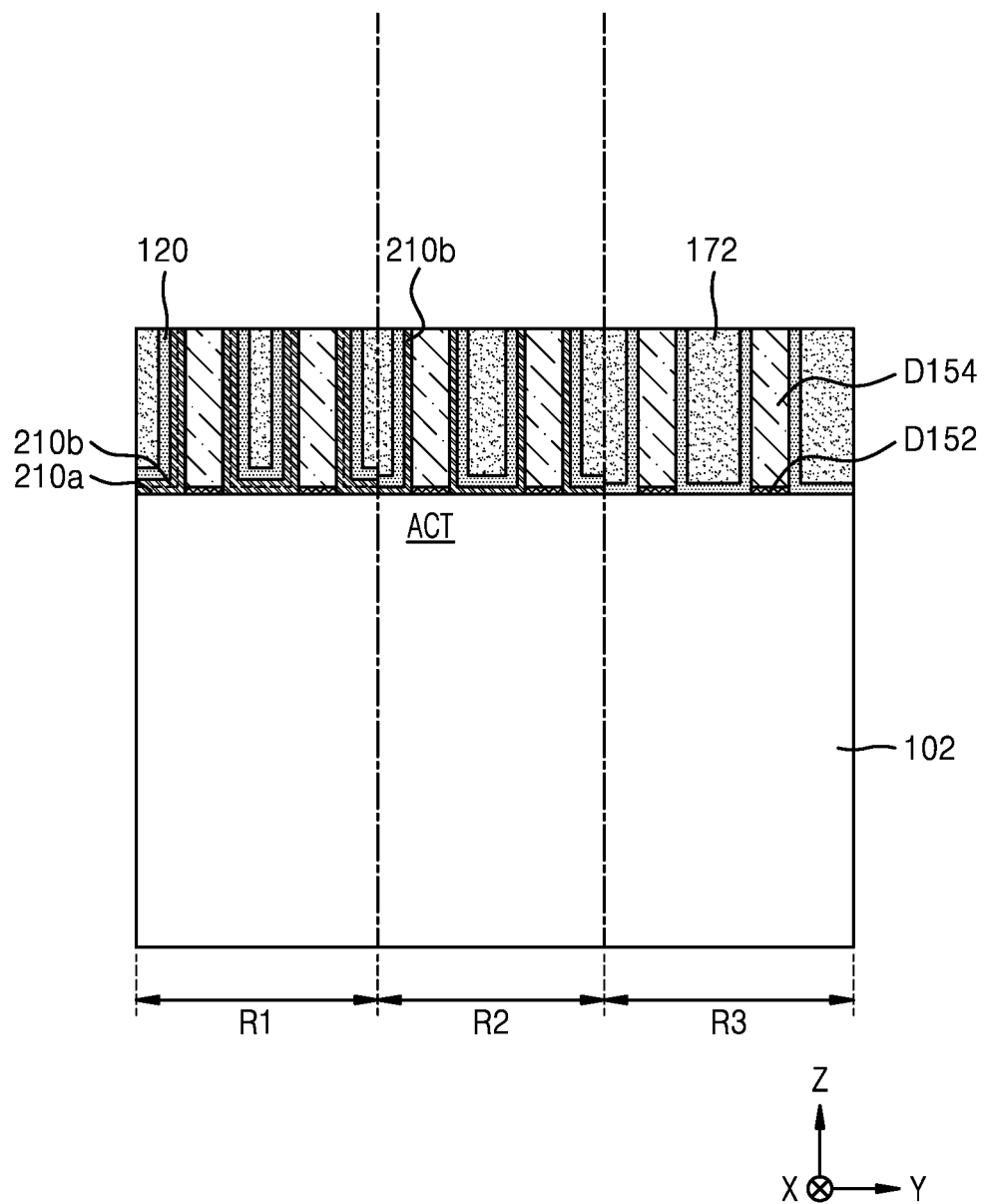
Figure 11B:
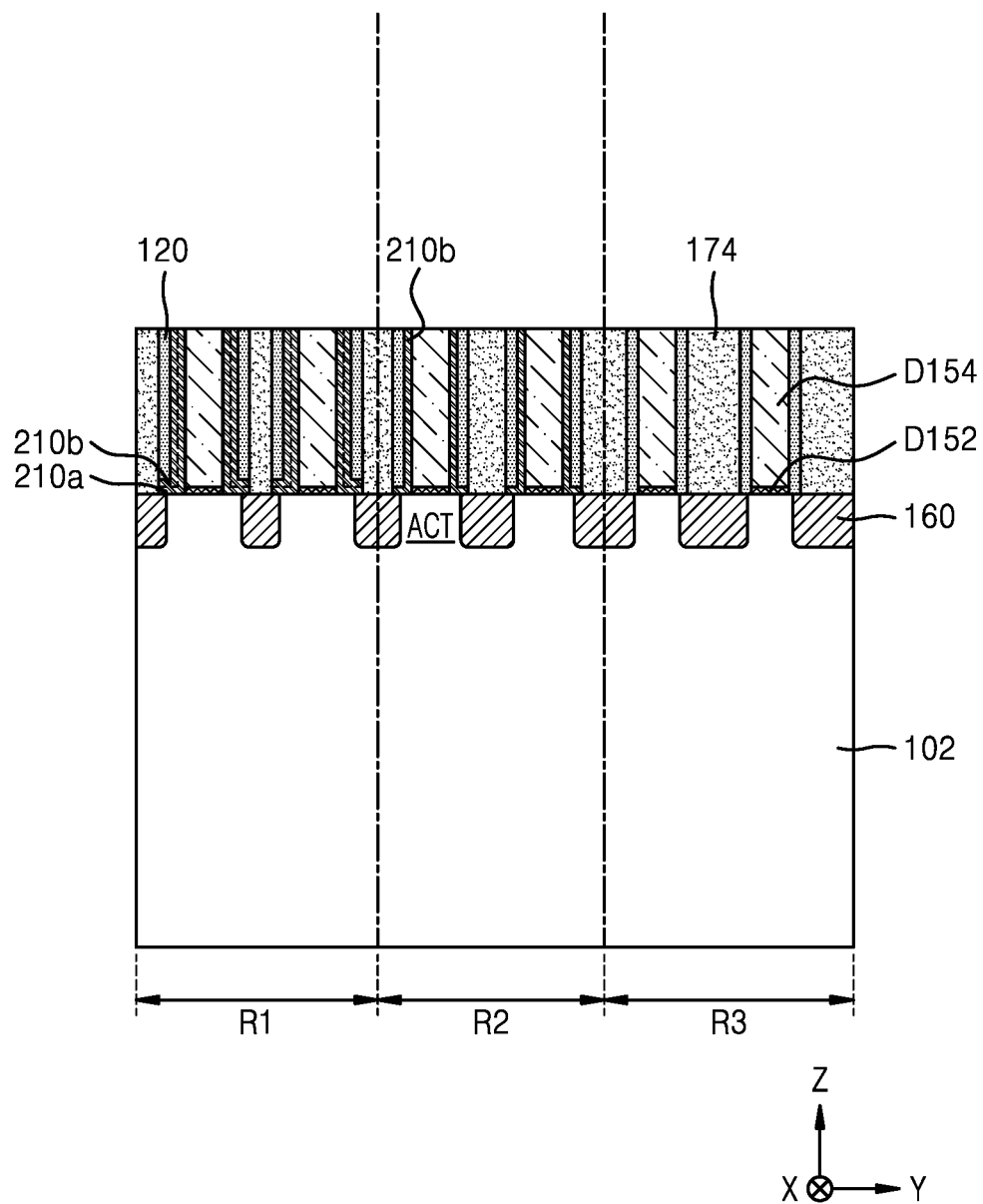

Referring to FIGS. 11A and 11B, the upper portion of the first inter-gate insulating layer 172 and an upper portion of the second inter-gate insulating layer 174 are partially removed to expose the dummy gate layer D154. The upper portion of the first inter-gate insulating layer 172 and the upper portion of the second inter-gate insulating layer 174 may be removed with an isotropic etching process and/or a chemical mechanical planarization (CMP) process; however, inventive concepts are not limited thereto. During the partial removal of the upper portions of the first inter-gate insulating layer 172 and the second inter-gate insulating layer 174, the capping layer D156 (see FIGS. 10A and 10B) and each of the first cover layer 210a, the second cover layer 210b, and the spacer layer 120 formed on the side wall of the capping layer D156 may be partially removed, either.

Figure 12A:
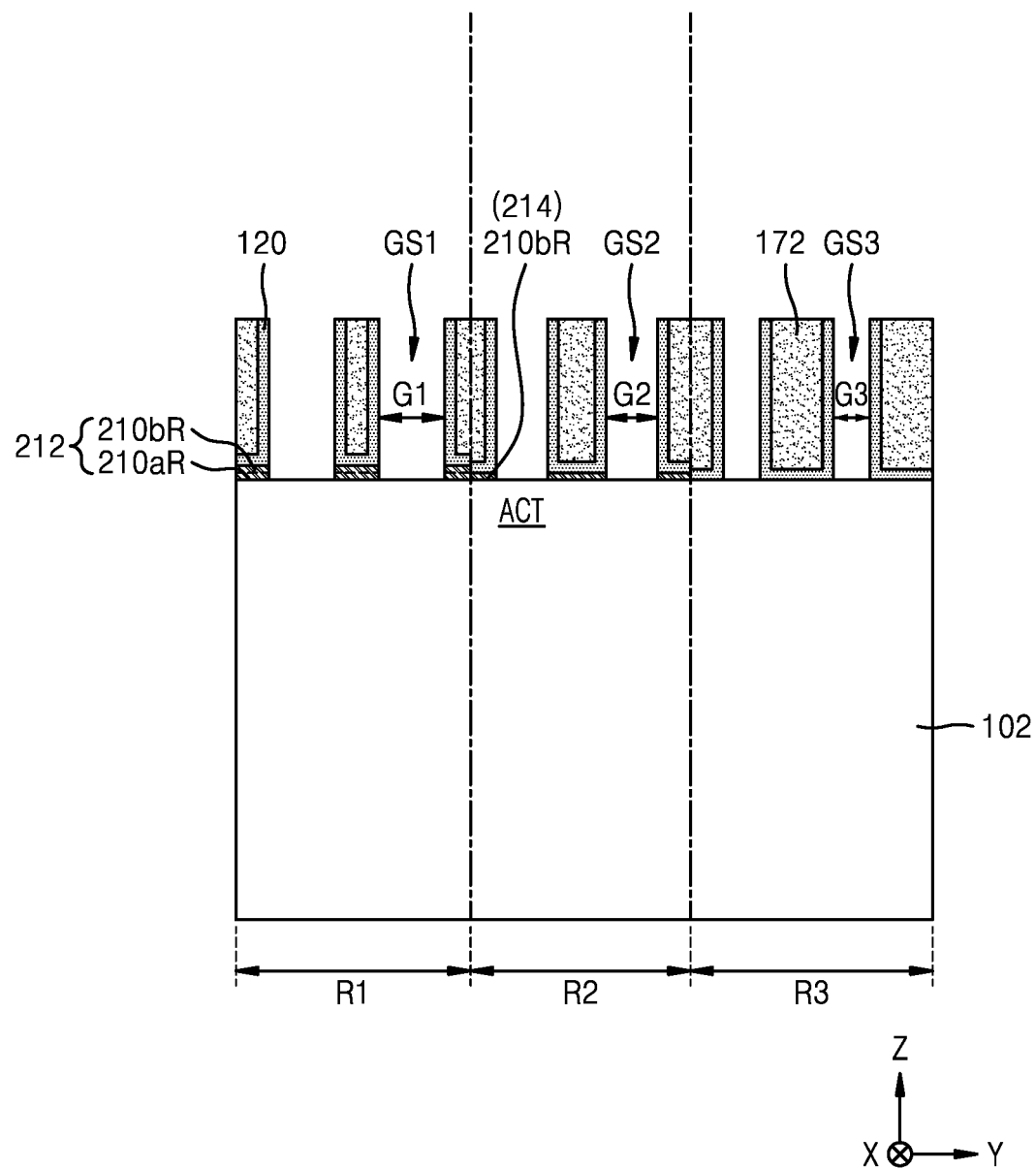
Figure 12B:
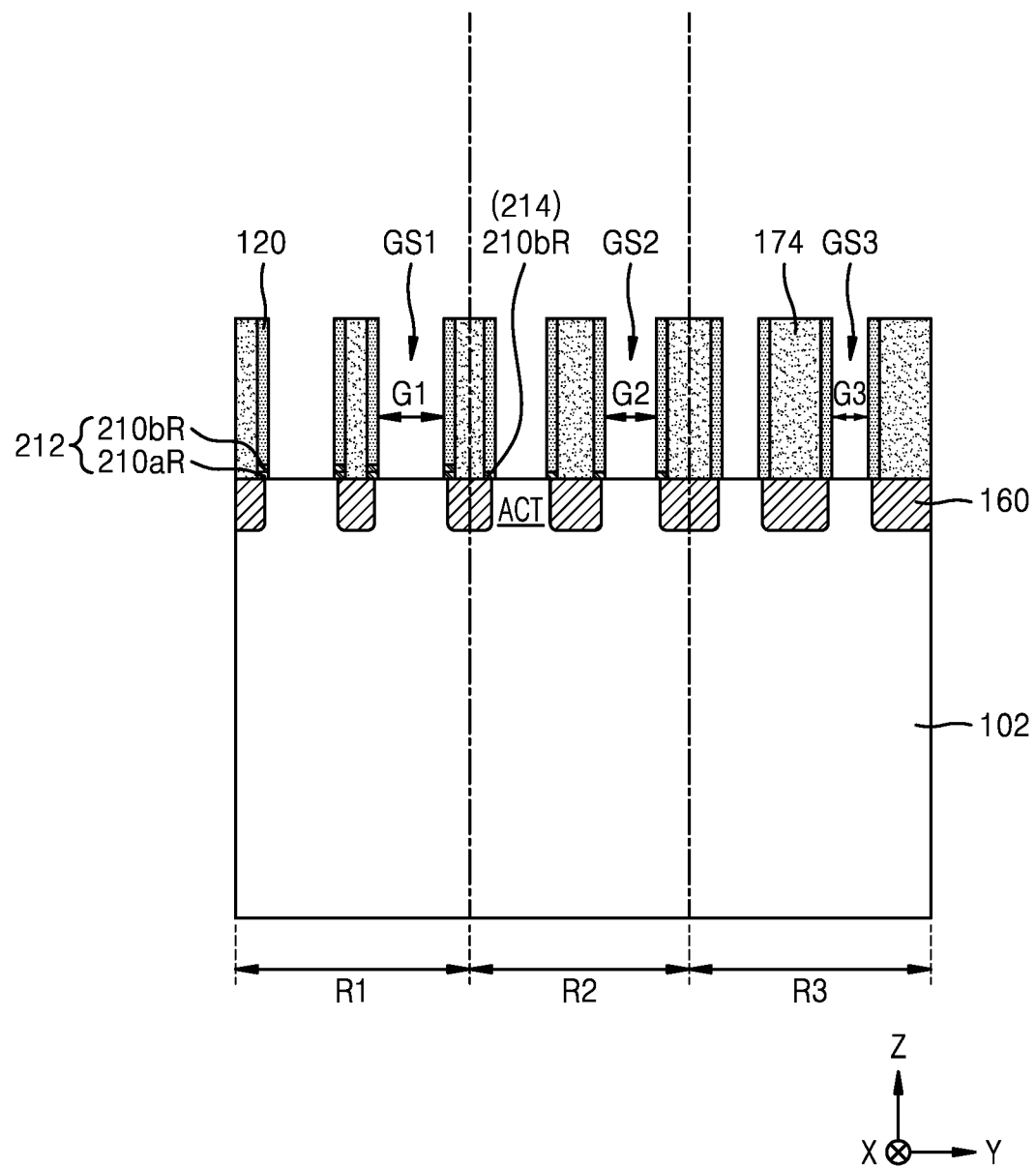

Referring to FIGS. 12A and 12B, in the first, second, and third regions R1, R2, and R3, the dummy gate layer D154 (see FIGS. 11A and 11B) and the oxide layer D152 (see FIGS. 11A and 11B), portions of the first cover layer 210a (see FIGS. 11A and 11B) and the second cover layer 210b (see FIGS. 11A and 11B) covering the side walls of the dummy gate layer D154 and the oxide layer D152 are simultaneously removed to form first gate spaces GS1, second gate spaces GS2, and third gate spaces GS3 respectively on the first, second, and third regions R1, R2, and R3. The active area ACT may be exposed on bottom surfaces of the first gate space GS1, the second gate space GS2, and the third gate space GS3.

Portions of the first cover layer 210a and the second cover layer 210b remaining under the spacer layer 120 may remain respectively as a first remaining cover layer 210aR and a second remaining cover layer 210bR. In the first region R1, the first remaining cover layer 210aR and the second remaining cover layer 210bR arranged under the spacer layer 120 may be referred to together as a first base layer 212, and in the second region R2, the second remaining cover layer 210bR arranged under the spacer layer 120 may be referred to as a second base layer 214. The first base layer 212 may include the second remaining cover layer 210bR stacked on the first remaining cover layer 210aR.

The first, second, and third gate spaces GS1, GS2, and GS3 may respectively have a first gap G1, a second gap G2, and a third gap G3 therebetween in the second direction (Y direction). The first, second, and third gap G1, G2, and G3 may be different from one another.

Since the first gate space GS1 is formed by removing the dummy gate layer D154, the oxide layer D152, and the first cover layer 210a and the second cover layer 210b covering the side walls of the dummy gate layer D154 and the oxide layer D152, the first gap G1 may be equal to sum of the width of the dummy gate layer D154, twice the thickness of the first cover layer 210a, and twice the thickness of the second cover layer 210b. Since the second gate space GS2 is formed by removing the dummy gate layer D154, the oxide layer D152, and the second cover layer 210b covering the side walls of the dummy gate layer D154 and the oxide layer D152, the second gap G2 may be equal to sum of the width of the dummy gate layer D154 and twice the thickness of the second cover layer 210b. Since the third gate space GS3 is formed by removing the dummy gate layer D154 and the oxide layer D152, the third gap G3 may be equal to the width of the dummy gate layer D154.

For example, the first gap G1 may be greater than the second gap G2, and the second gap G2 may be greater than the third gap G3. For example, the first gap G1 may be greater than the second gap G2 by twice the thickness of the first cover layer 210a, and the second gap G2 may be greater than the third gap G3 by twice the thickness of the second cover layer 210b. Likewise, the first gap G1 may be greater than the third gap G3 by twice the thickness of the first cover layer 210a and twice the thickness of the second cover layer 210b.

During the removal of the dummy gate layer D154, the oxide layer D152, and the portions of the first cover layer 210a and the second cover layer 210b covering the side walls of the dummy gate layer D154 and the oxide layer D152, the spacer layer 120 may have an etching resistance, e.g. an etch selectivity. The first gate space GS1, the second gate space GS2, and the third gate space GS3 having different gaps from one another may be simultaneously formed with one another.

Figure 13A:
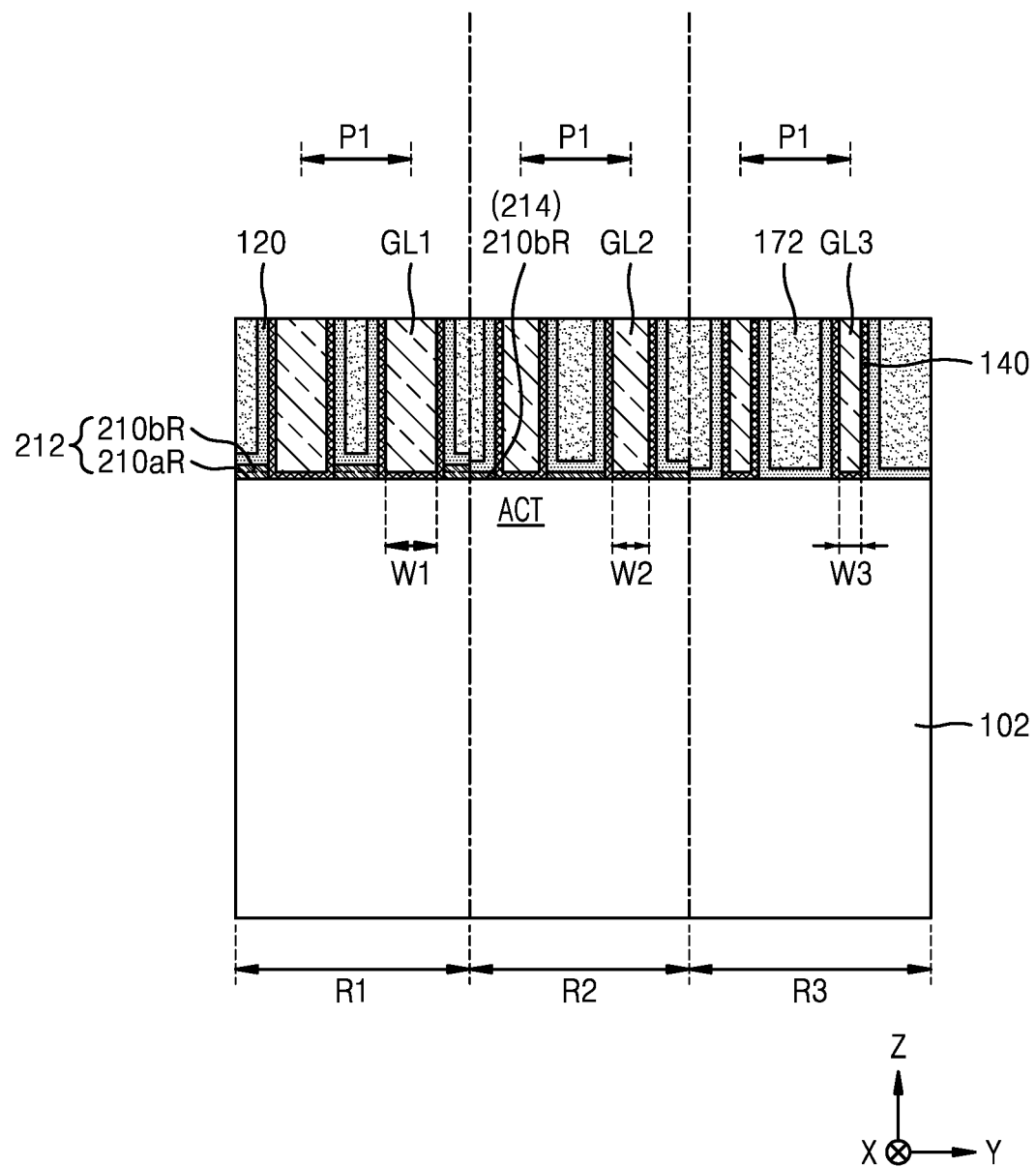
Figure 13B:
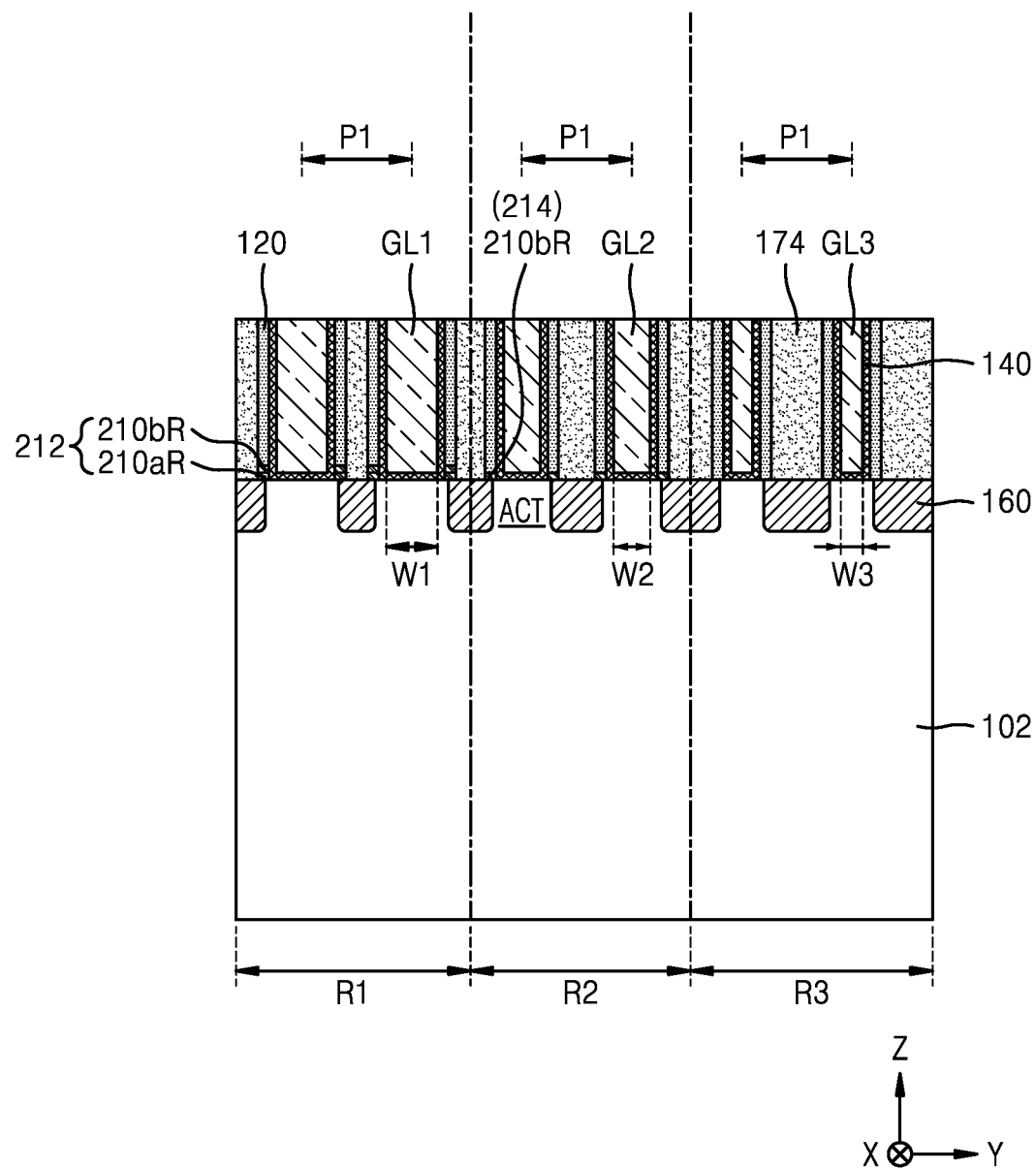

Referring to FIGS. 13A and 13B, a natural oxide layer is removed from the exposed surface of the active area ACT, e.g. may be removed with a wet chemical process including buffered hydrogen fluoride (BHF). A gate dielectric layer 140 is formed on the exposed surfaces in the first gate space GS1, the second gate space GS2, and the third gate space GS3, and then, first gate lines GL1, second gate lines GL2, and third gate lines GL3 respectively filled in the first, second, and third gate spaces GS1, GS2, and GS3 on the gate dielectric layer 140 are formed. The first, second, and third gate lines GL1, GL2, and GL3 may not be separately formed, but may be simultaneously formed in the first, second, and third regions R1, R2, and R3.

The gate dielectric layer 140 may include a stack structure including an interfacial layer and a dielectric layer, e.g. a high-k dielectric layer. The interfacial layer may help to heal interfacial defects between the upper surface of the active area ACT and the high-k dielectric layer. In some example embodiments, the interfacial layer may include a low-k dielectric material layer having a dielectric constant of 9 or less, for example, a silicon oxide layer, silicon oxynitride layer, or a combination thereof. In some example embodiments, the interfacial layer may be omitted. The high-k dielectric layer may include a material having a dielectric constant greater than that of the silicon oxide layer. For example, the high-k dielectric layer may have a dielectric constant of about 10 to about 25. The high-k dielectric layer may have a thickness of about 10 to about 40 Å, but is not limited thereto.

Each of the first, second, and third gate lines GL1, GL2, and GL3 may include a metal-containing layer for adjusting a work function, and a metal-containing layer for gap-filling, which fills an upper space of the metal-containing layer for adjusting work function. In some example embodiments, each of the first, second, and third gate lines GL1, GL2, and GL3 may have a structure, in which a metal nitride layer, a metal layer, a conductive capping layer, and a gap-fill metal layer are sequentially stacked. In some example embodiments, each of the first, second, and third gate lines GL1, GL2, and GL3 may have a stack structure including TiAlC/TiN/W, a stack structure including TiN/TaN/TiAlC/TiN/W, or a stack structure including TiN/TaN/TiN/TiAlC/TiN/W. In the above stack structures, a TiAlC layer or a TiN layer may function as the metal-containing layer for adjusting work function.

The first, second, and third gate lines GL1, GL2, and GL3 have the first pitch P1 in the second direction (Y direction), but may have different widths, that is, the first width W1, the second width W2, and the third width W3. Each of the first, second, and third widths W1, W2, and W3 may have a value obtained by subtracting twice the thickness of the gate dielectric layer 140 from each of the first gap G1, the second gap G2, and the third gap G3 (see FIGS. 12A and 12B).

That is, the first width W1 may be greater than the second width W2, and the second width W2 may be greater than the third width W3. For example, the first width W1 may be greater than the second width W2 by twice the thickness of the first cover layer 210a (see FIGS. 11A and 11B), and the second width W2 may be greater than the third width W3 by twice the thickness of the second cover layer 210b (see FIGS. 11A and 11B). Likewise, the first width W1 may be greater than the third width W3 by twice the thickness of the first cover layer 210a and twice the thickness of the second cover layer 210b.

Figure 14A:
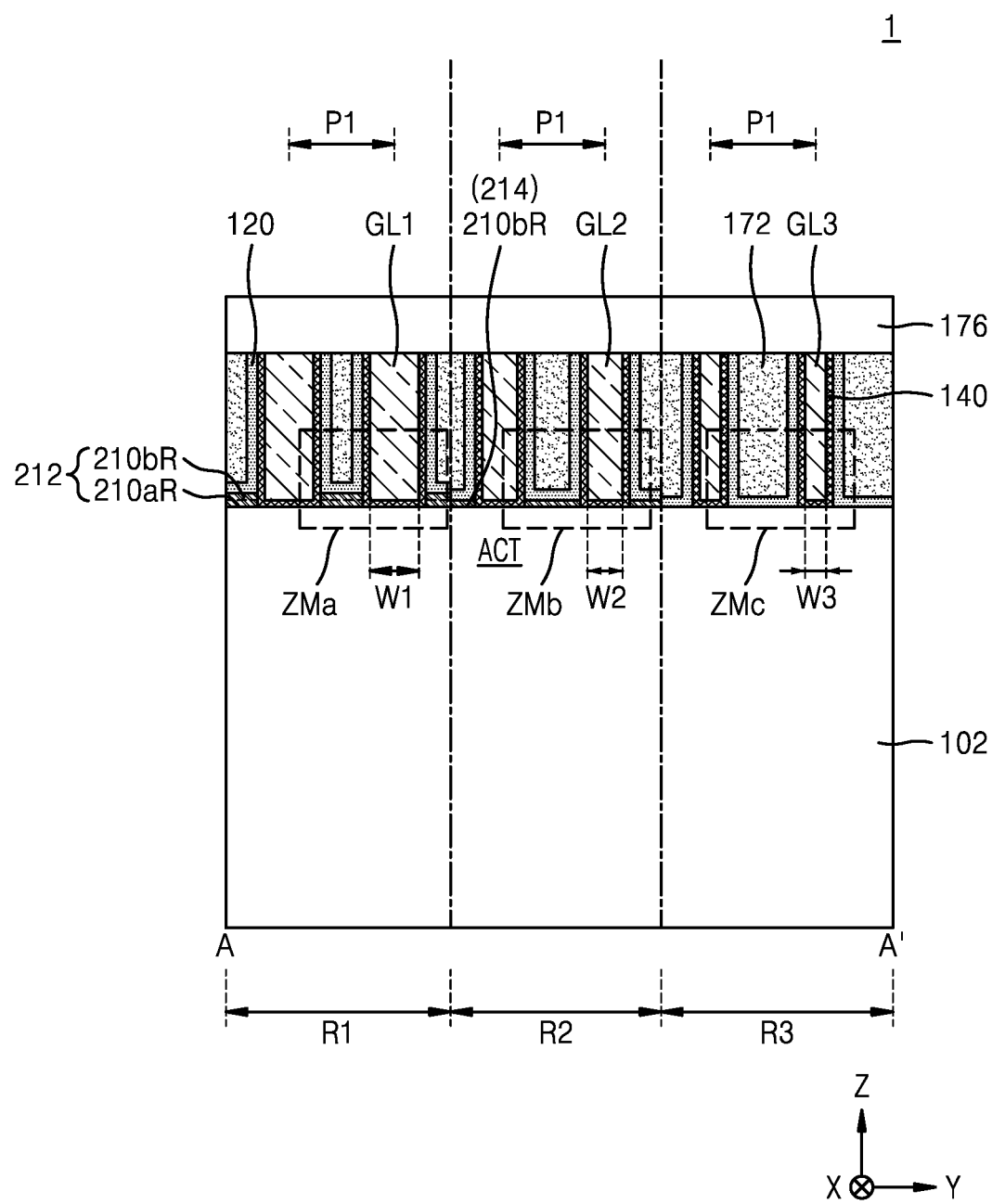
Figure 14B:
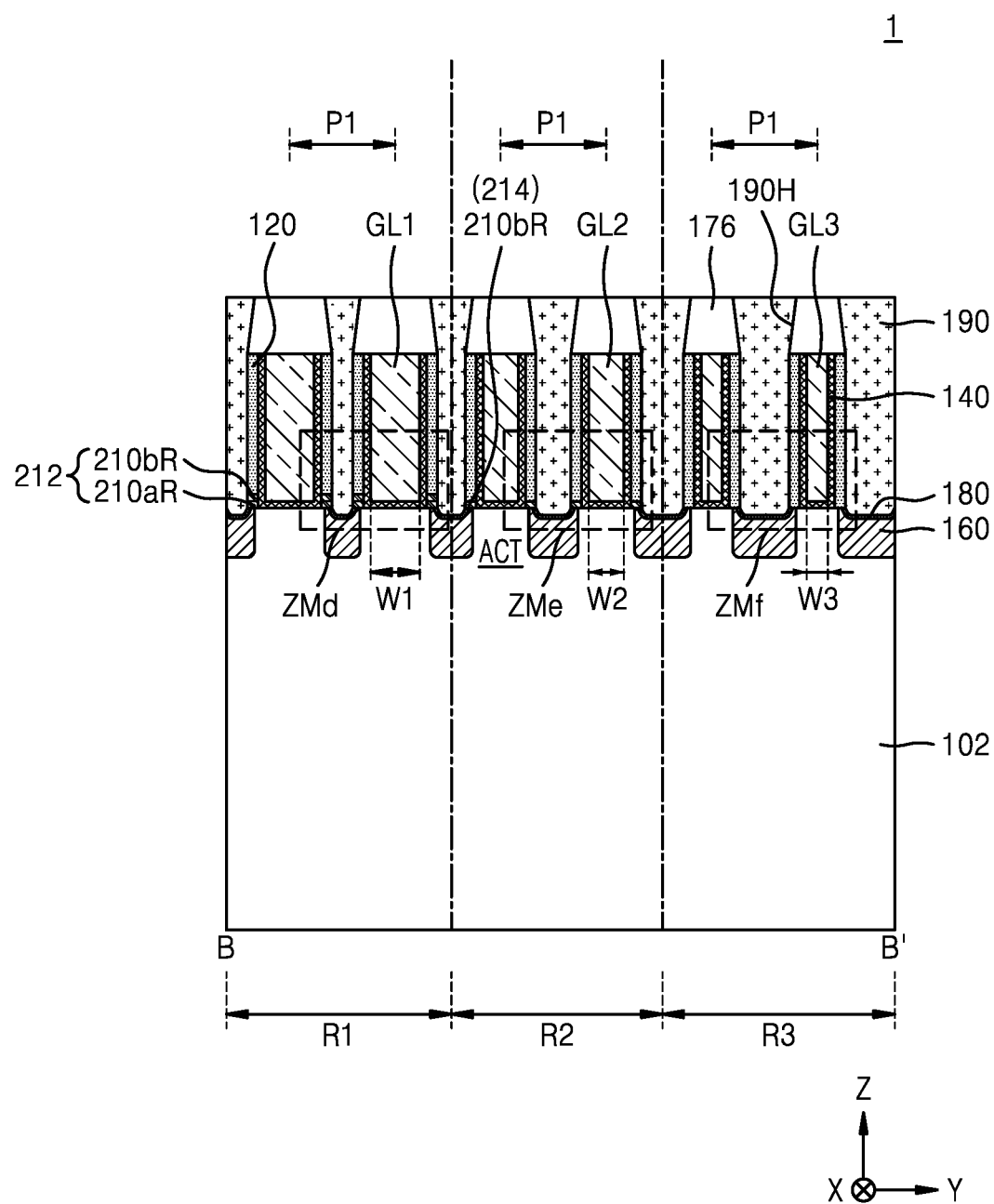

Referring to FIGS. 14A and 14B, an interlayer insulating layer 176 covering the plurality of gate lines GL1, GL2, and GL3, the first inter-gate insulating layer 172, and the second inter-gate insulating layer 174 (see FIG. 13B) is formed, and then the interlayer insulating layer 176 and the second inter-gate insulating layer 174 are partially etched to form a plurality of contact holes 190H exposing the plurality of source/drain regions 160 respectively in the first, second, and third regions R1, R2, and R3. Afterward, a plurality of silicide layers 180 are formed on upper surfaces of the plurality of source/drain regions 160, wherein the upper surfaces are exposed through the plurality of contact holes 190H. In some example embodiments, the silicide layer 180 may include titanium silicide, but inventive concepts are not limited thereto.

A plurality of contact plugs 190 filled in the plurality of contact holes 190H are formed to form a semiconductor device 1. The contact plug 190 may include metal, conductive metal nitride, or a combination thereof. For example, the contact plug 190 may include W, Cu, Al, Ti, Ta, TiN, TaN, an alloy thereof, or a combination thereof, but inventive concepts are not limited to the above materials.

The semiconductor device 1 includes the substrate 102 having the first region R1, the second region R2, and the third region R3, and a plurality of gate lines GL1, GL2, and GL3 arranged on the active area ACT of the substrate 102 and extending in the first direction (X direction). The plurality of gate lines GL1, GL2, and GL3 may be arranged on the substrate 102 to have a first pitch P1 in a second direction (Y direction). The plurality of gate lines GL1, GL2, and GL3 may include first gate lines GL1 arranged in the first region R1, second gate lines GL2 arranged in the second region R2, and third gate lines GL3 arranged in the third region R3.

The first gate lines GL1 each have a first width W1 and a first pitch P1 in the second direction (Y direction), and the first gate lines GL1 may be arranged in parallel with each other and may extend in the first direction (X direction) in the first region R1. The second gate lines GL2 each have a second width W2 and the first pitch P1 in the second direction (Y direction), and the second gate lines GL2 may be arranged in parallel with each other and may extend in the first direction (X direction) in the second region R2. The third gate lines GL3 each has a third width W3 and the first pitch P1 in the second direction (Y direction), and the third gate lines GL3 may be arranged in parallel with each other and may extend in the first direction (X direction) in the third region R3. The first width W1, the second width W2, and the third width W3 may be different from one another. In some example embodiments, the first width W1 may be greater than the second width W2, and the second width W2 may be greater than the third width W3.

The gate dielectric layer 140 is formed between the active area ACT and the bottom surfaces of the plurality of gate lines GL1, GL2, and GL3. In some example embodiments, the gate dielectric layer 140 may extend from between the active area ACT and the bottom surfaces of the plurality of gate lines GL1, GL2, and GL3 in a third direction (e.g. a Z direction) that is perpendicular to a main surface of the substrate 102, along a space between the spacer layer 120 and side walls of the plurality of gate lines GL1, GL2, and GL3.

Source/drain regions 160 may be partially formed in the substrate 102 at opposite sides of each of the plurality of gate lines GL1, GL2, and GL3. A pair of source/drain regions 160 and a portion in one of the plurality of gate lines GL1, GL2, GL3 provided between the pair may configure, e.g. may correspond to, one transistor.

The spacer layer 120 may be arranged on opposite side walls of each of the plurality of gate lines GL1, GL2, and GL3. The spacer layer 120 may further partially cover the upper surface of the substrate 102 between two adjacent gate lines from among the plurality of gate lines GL1, GL2, and GL3. The spacer layer 120 may cover portions where the source/drain regions 160 are not formed on the substrate 102 between two adjacent gate lines from among the plurality of gate lines GL1, GL2, and GL3.

The first inter-gate insulating layer 172 and the second inter-gate insulating layer 174 (see FIG. 13A) may fill the space between the spacer layers 120 facing each other, between the plurality of gate lines GL1, GL2, and GL3, and the interlayer insulating layer 176 may cover the plurality of gate lines GL1, GL2, and GL3, the first inter-gate insulating layer 172, and the second inter-gate insulating layer 174.

Although FIGS. 14A and 14B do not show the second inter-gate insulating layer 174, in the spaces among the plurality of gate lines GL1, GL2, and GL3, the second inter-gate insulating layer 174 may fill the other spaces than the spaces filled with the first inter-gate insulating layer 172 and the plurality of contact plugs 190. In some example embodiments, during the forming of the plurality of contact holes 190H in order to form the plurality of contact plugs 190, the second inter-gate insulating layer 174 may be removed.

When the first inter-gate insulating layer 172 and the second inter-gate insulating layer 174 include materials having similar or same characteristics, the first inter-gate insulating layer 172 and the second inter-gate insulating layer 174 are separately formed in the manufacturing processes, but the first and second inter-gate insulating layers 172 and 174 function as the inter-gate insulating layer together in the semiconductor device 1. Thus, when the semiconductor device 1 only includes the first inter-gate insulating layer 172, the first inter-gate insulating layer 172 may be referred to as the inter-gate insulating layer, and when the semiconductor device 1 includes the first and second inter-gate insulating layers 172 and 174, the first and second inter-gate insulating layers 172 and 174 may be referred to together as the inter-gate insulating layer.

The semiconductor device 1 further includes the plurality of contact plugs 190 that penetrate through the interlayer insulating layer 176 to fill the plurality of contact holes 190H that expose the plurality of source/drain regions 160 and are connected to the plurality of source/drain regions 160. A plurality of silicide layers 180 may be arranged between the plurality of source/drain regions 160 and the plurality of contact plugs 190.

The spacer layer 120 is arranged between the inter-gate insulating layer 172 or 172 and 174 and the contact plug 190, and the gate dielectric layer 140, and may extend from between the inter-gate insulating layer 172 or 172 and 174 and the contact plug 190, and the gate dielectric layer 140, to between the inter-gate insulating layer 172 or 172 and 174 and the substrate 102 on which the source/drain region 160 is not formed. In some example embodiments, when the gate dielectric layer 140 does not totally cover the side walls of the plurality of gate lines GL1, GL2, and GL3, the spacer layer 120 may be arranged between the inter-gate insulating layer 172 or 172 and 174 and the contact plug 190, and the plurality of gate lines GL1, GL2, and GL3.

In the first region R1, the first base layer 212 including the first remaining cover layer 210aR and the second remaining cover layer 210bR may be arranged under the spacer layer 120, and in the second region R2, the second base layer 214 including the second remaining cover layer 210bR may be arranged under the spacer layer 120. In the third region R3, a bottom surface of the spacer layer 120 may contact the substrate 102. When the spacer layer 120 is arranged between the inter-gate insulating layer 172 or 172 and 174 and the substrate 102, in the first region R1, the first base layer 212 may contact the bottom surface of the spacer layer 120 covering a bottom surface of the inter-gate insulating layer 172 or 172 and 174, and in the second region R2, the second base layer 214 may contact the bottom surface of the spacer layer 120 covering the bottom surface of the inter-gate insulating layer 172 or 172 and 174.

Figure 15A:
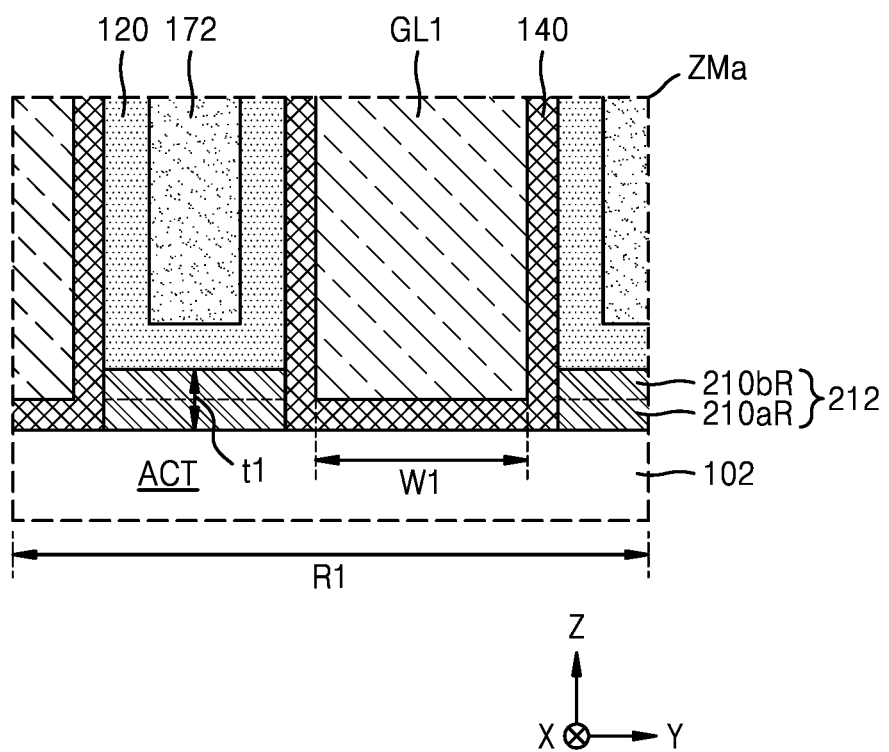
FIGS. 15A to 15F are cross-sectional views showing an enlarged view of a portion of a semiconductor device according to one or more example embodiments.
Figure 15B:
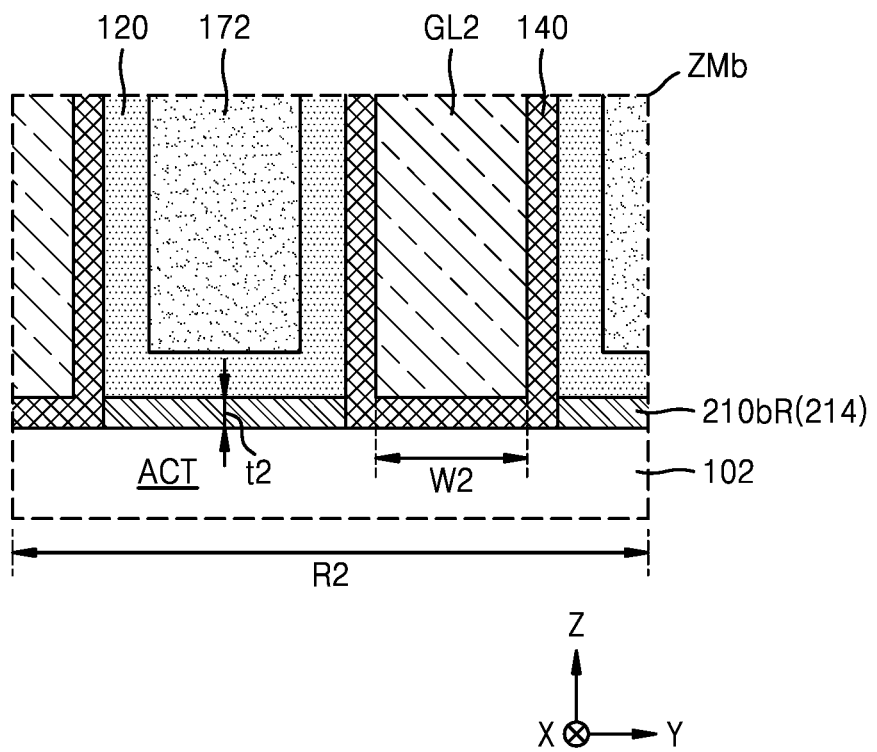
Figure 15C:
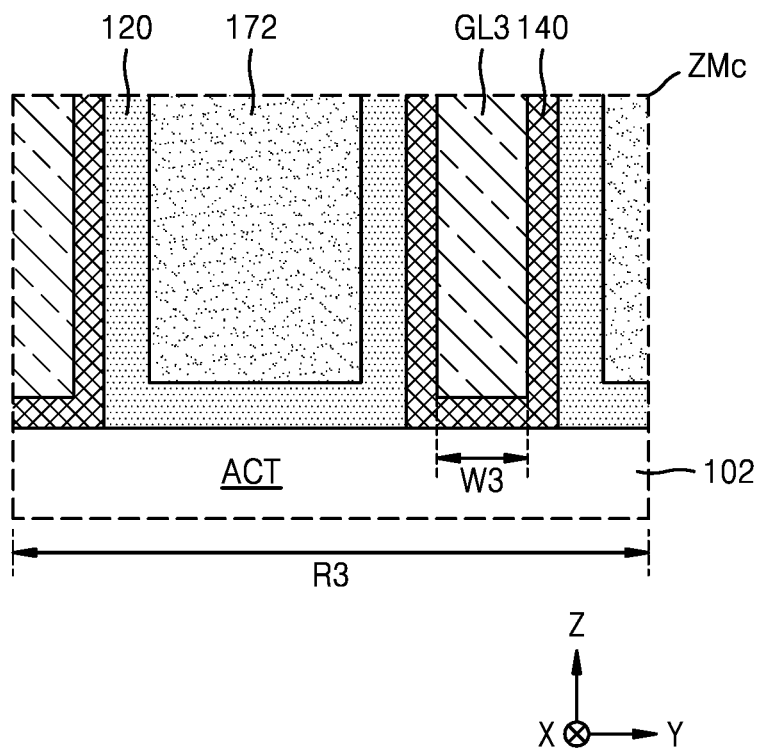
Figure 15D:
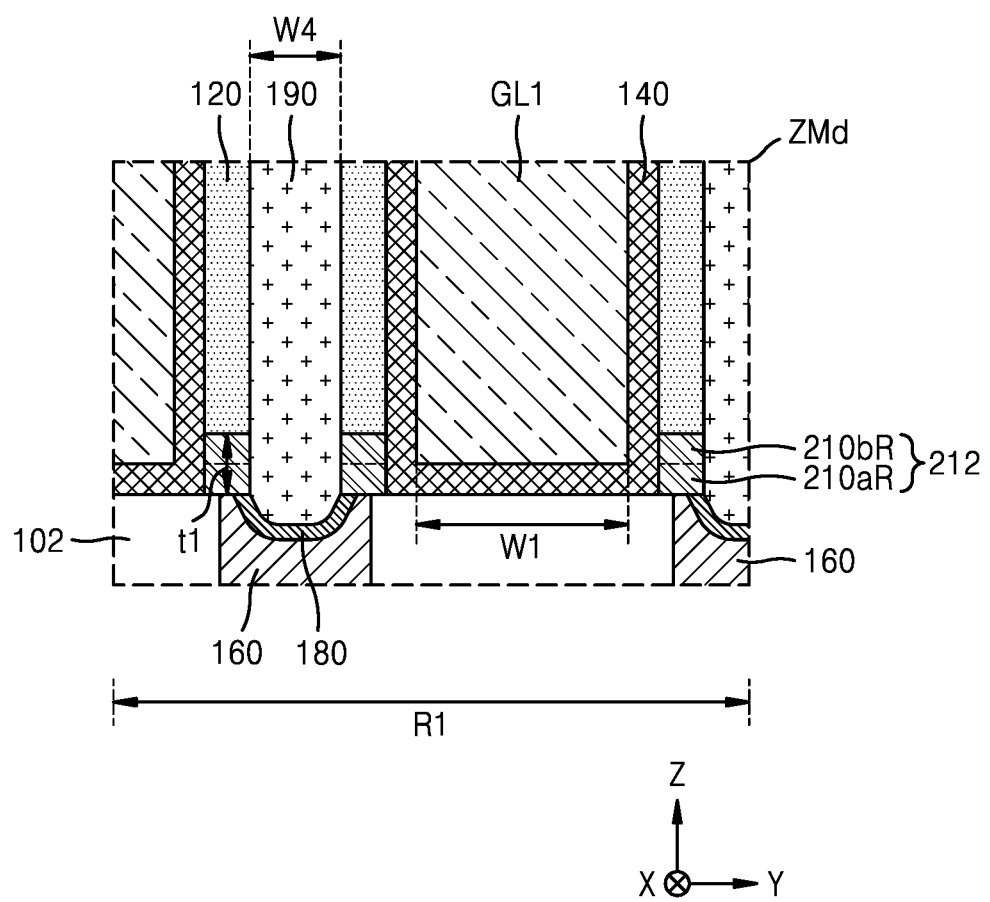
Figure 15E:
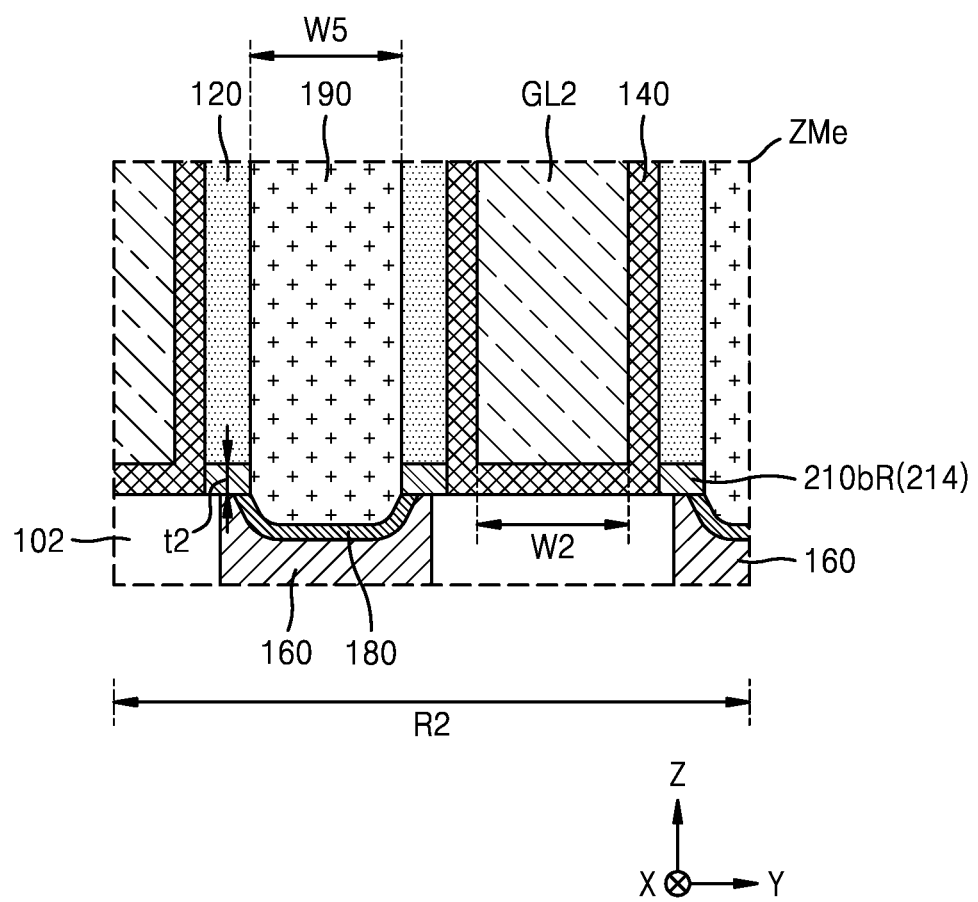
Figure 15F:
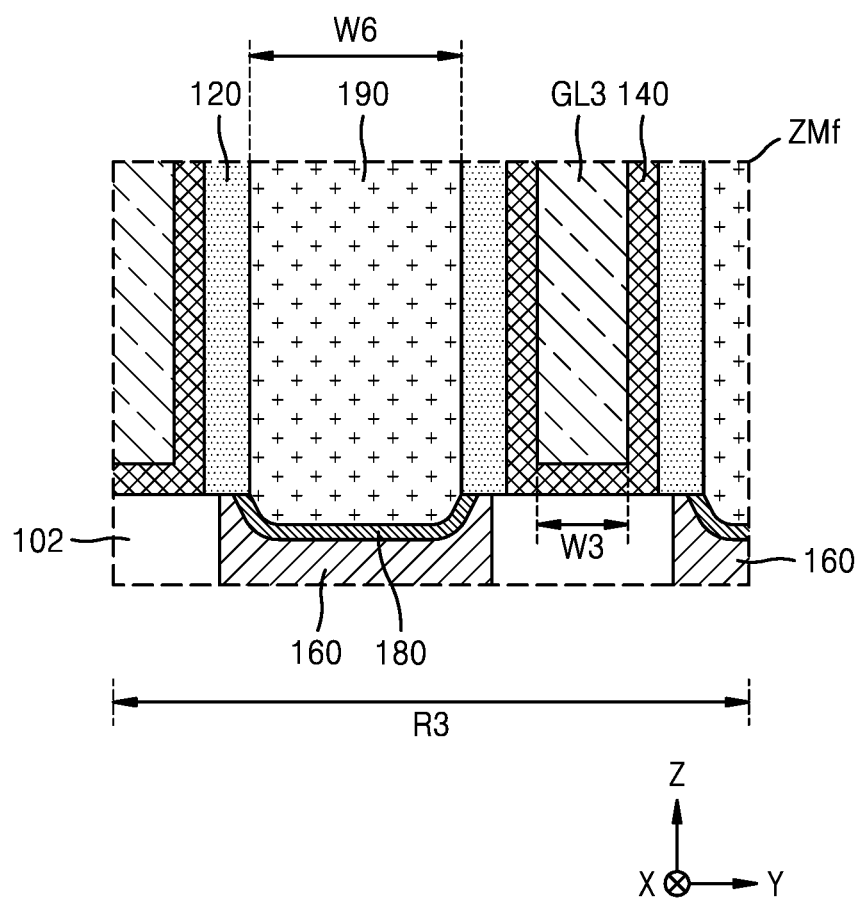

FIGS. 15A to 15F are cross-sectional views showing an enlarged view of a portion in the semiconductor device 1 according to one or more example embodiments. In detail, FIGS. 15A, 15B, and 15C are cross-sectional views respectively showing enlarged views of a portion ZMa, a portion ZMb, and a portion ZMc, and FIGS. 15D, 15E, and 15F are cross-sectional views respectively showing enlarged views of a portion ZMd, a portion ZMe, and a portion ZMf.

Referring to FIGS. 14A and 14B, and FIGS. 15A to 15F, the first gate lines GL1 arranged in the first region R1, the second gate lines GL2 arranged in the second region R2, and the third gate lines GL3 arranged in the third region R3 respectively have the same first pitch P1 in the second direction (Y direction) and may have different widths, for example, the first width W1, the second width W2, and the third width W3. The first width W1 may be greater than the second width W2, and the second width W2 may be greater than the third width W3.

The first base layer 212 may have a first thickness t1 and the second base layer 214 may have a second thickness t2. The first base layer 212 includes the first remaining cover layer 210aR and the second remaining cover layer 210bR and the second base layer 214 may include the second remaining cover layer 210bR. The first remaining cover layer 210aR and the second remaining cover layer 210bR may each be a portion of the first cover layer 210a (see FIGS. 11A and 11B) and the second cover layer 210b (see FIGS. 11A and 11B). The first thickness t1 and the second thickness t2 may be distances between the upper surface of the substrate 102 and the bottom surface of the spacer layer 120 respectively in the first region R1 and the second region R2. In the third region R3, since the upper surface of the substrate 102 and the bottom surface of the spacer layer 120 are in contact with each other, the separate distance may be 0.

Therefore, line widths of the plurality of gate lines GL1, GL2, and GL3 included in the semiconductor device 1 may be different from one another in proportion to the difference among the bottom surface of the spacer layer 120 and the upper surface of the substrate 102. In more detail, a line width, e.g., the first width W1, of the first gate line GL1 in the first region R1 may be greater than a line width, e.g., the second width W2, of the second gate line GL2 in the second region R2 by twice the difference between the first thickness t1 and the second thickness t2, the second width W2 of the second gate line GL2 in the second region R2 may be greater than a line width, e.g., the third width W3, of the third gate line GL3 in the third region R3 by twice the difference between the second thickness t2 and 0, for example, twice the second thickness t2, and the first width W1 of the first gate line GL1 in the first region R1 may be greater than the third width W3 of the third gate line GL3 in the third region R3 by twice the difference between the first thickness t1 and 0, that is, twice the first thickness t1.

In some example embodiments, when a thickness of the first cover layer 210a, that is, the first remaining cover layer 210aR, and a thickness of the second cover layer 210b (see FIGS. 11A and 11B), for example, the second remaining cover layer 210bR, are equal to each other, the first thickness t1 may be twice the second thickness t2. Also, since the first width W1 may be greater than the second width by the first thickness t1 or twice the second thickness t2 and the second width W2 may be greater than the third width W3 by the first thickness t1 or twice the second thickness t2, the first width W1 may be greater than the third width W3 by twice the first thickness t1 or four times of the second thickness t2.

The first gate line GL1, the second gate line GL2, and the third gate line GL3, may have the same first pitch P1, but may have the respective first width W1, second width W2, and third width W3 that are different from one another, and thus an interval between two adjacent first gate lines GL1, an interval between two adjacent second gate lines GL2, and an interval between two adjacent third gate lines GL3 may be in inverse-proportion to the respective first width W1, second width W2, and third width W3. For example, a fourth width that is a width of the contact plug 190 between two adjacent first gate lines GL1 in the first region R1, a fifth width W5 that is a width of the contact plug 190 between two adjacent second gate lines GL2 in the second region R2, and a sixth width W6 that is a width of the contact plug 190 between two adjacent third gate lines GL3 in the third region R3 may be in inverse-proportion to the first width W1, the second width W2, and the third width W3.

Therefore, when the thickness of the spacer layer 120 and the thickness of the gate dielectric layer 140 formed in each of the first region R1, the second region R2, and the third region R3 are constant, the fourth width W4 may be less than the fifth width W5 by a difference between the first width W1 and the second width W2, the fifth width W5 is less than the sixth width W6 by a difference between the second width W2 and the third width W3, and the fourth width W4 may be less than the sixth width W6 by a difference between the first width W1 and the third width W3.

In the semiconductor device 1 according to some example embodiments, the plurality of gate lines GL1, GL2, and GL3 having various line widths are not separately formed through a photolithographic process and an etching process for separate line patterns, but are formed through etching processes for regions (an etching process for removing portions of the first cover layer 210a in the second region R2 and the third region R3 as shown in FIG. 4, and an etching process for removing a portion of the second cover layer 210b formed in the third region R3 as shown in FIG. 6). Furthermore, the etching process for removing regions may use a photolithographic process that is simpler than the etching process for forming line patterns. Thus, various lines widths may be obtained with improved reliability, and manufacturing costs may be reduced through simplification of processes.

Figure 16A:
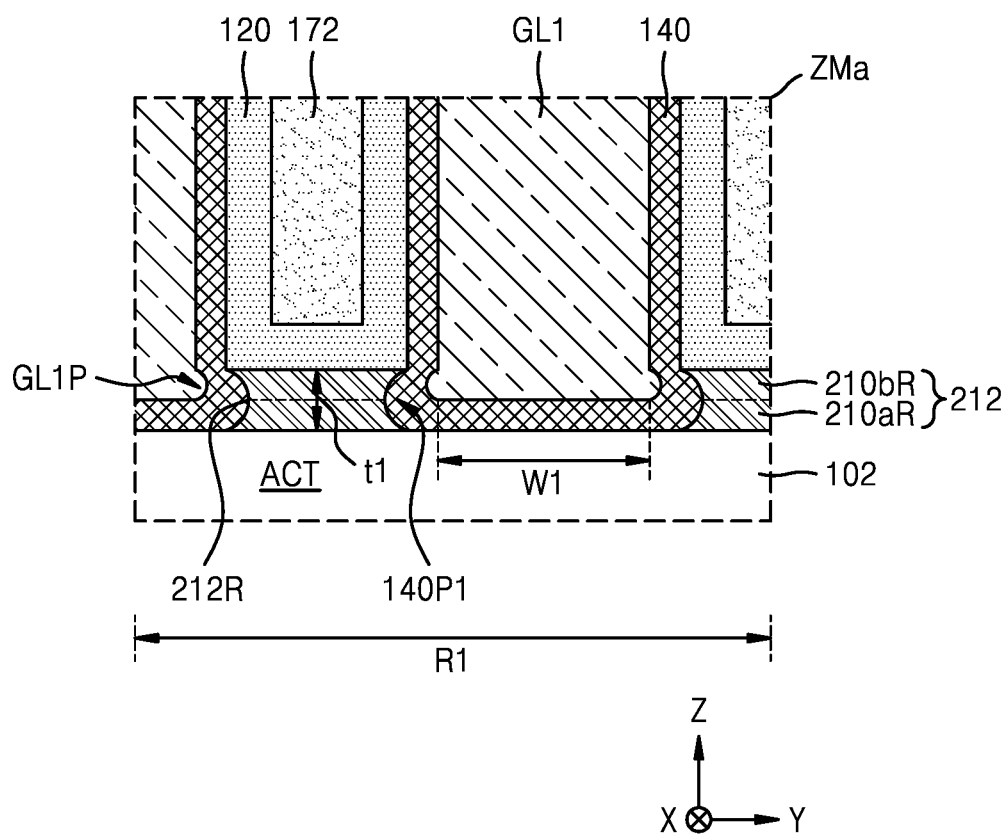
FIGS. 16A to 16D are cross-sectional views showing an enlarged view of a portion of a semiconductor device according to one or more example embodiments.
Figure 16B:
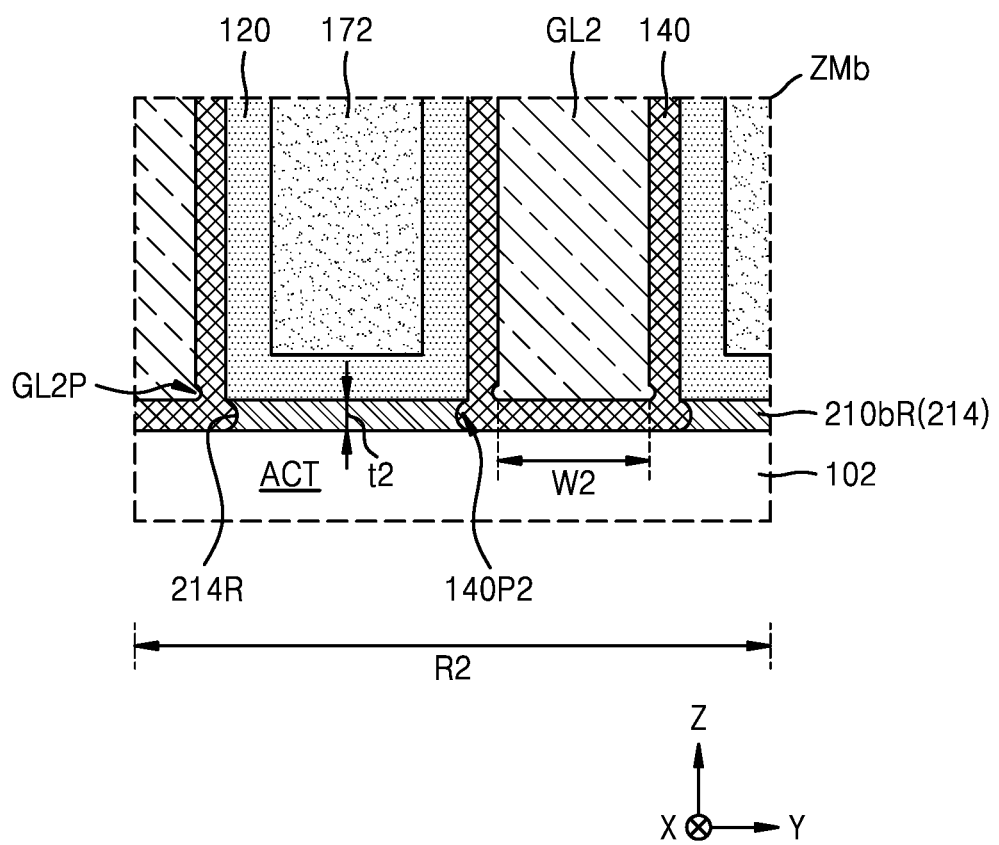
Figure 16C:
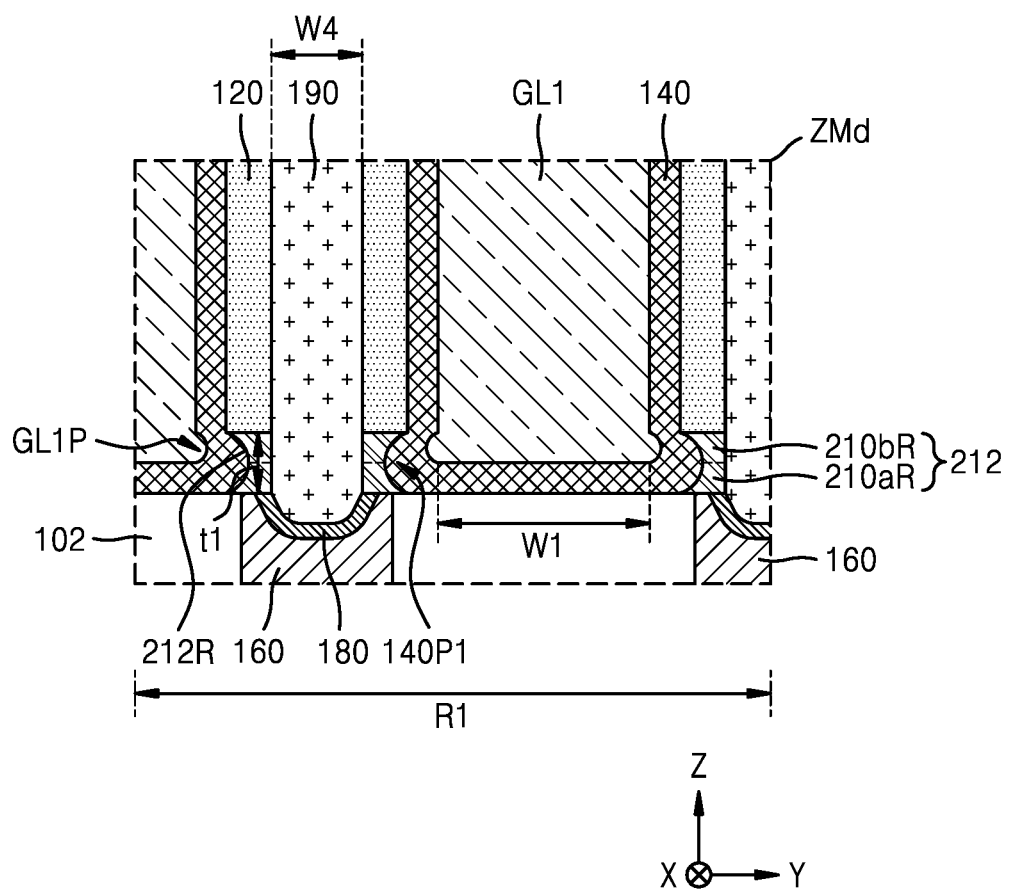
Figure 16D:
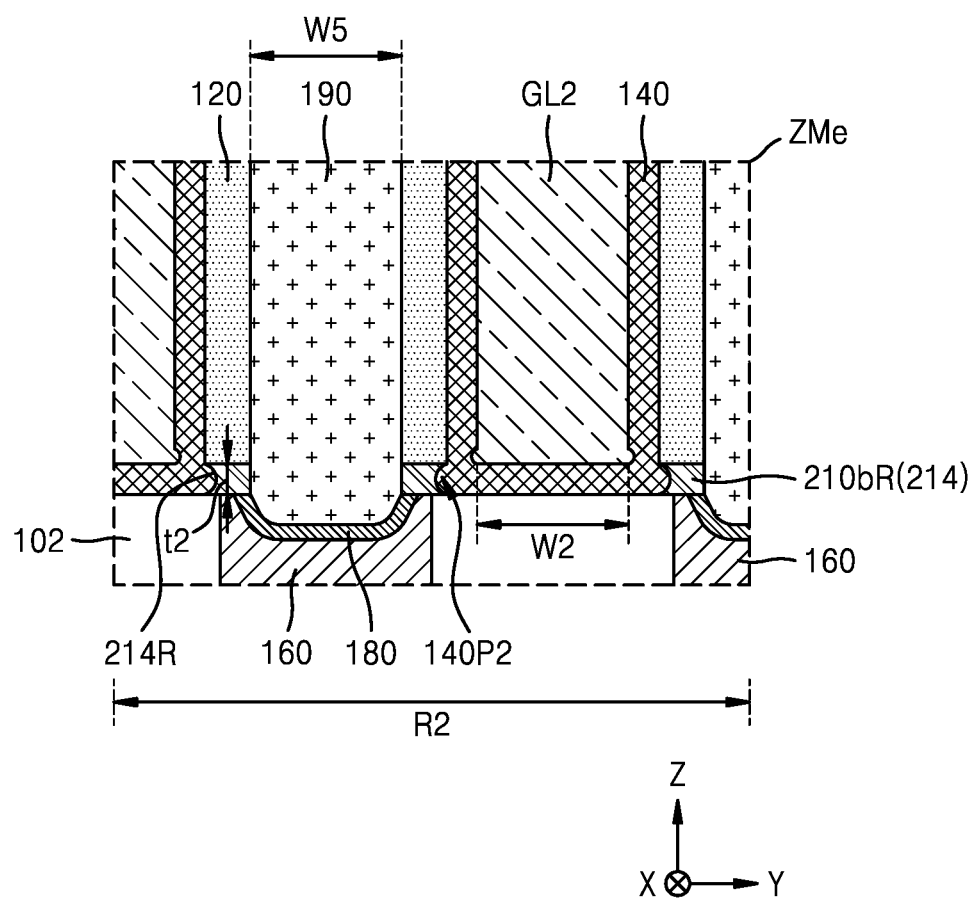

FIGS. 16A to 16D are cross-sectional views showing an enlarged view of a portion in the semiconductor device according to one or more example embodiments. In detail, FIGS. 16A and 16B are respectively cross-sectional views showing enlarged views of the portions ZMa and ZMb of FIG. 14A, and FIGS. 16C and 16D are respectively cross-sectional views showing enlarged views of the portions ZMd and ZMe of FIG. 14B.

Referring to FIGS. 16A to 16D, the first base layer 212 of the first region R1 and the second base layer 214 of the second region R2 may respectively have a first recess 212R and a second recess 214R recessed inward from the side wall of the spacer layer 120. The first recess 212R and the second recess 214R may be formed by partially removing the first cover layer 210a (see FIGS. 11A and 11B) and the second cover layer 210b (see FIGS. 11A and 11B) located under the spacer layer 120, during the forming of the first gate space GS1, the second gate space GS2, and the third gate space GS3 shown in FIGS. 12A and 12B.

In some example embodiments, the first base layer 212 having the first thickness t1 that is relatively greater has the first recess 212R, but the second base layer 214 having the second thickness t2 that is relatively smaller may not have the second recess 214R.

The gate dielectric layer 140 may include a first dielectric layer protrusion 140P1 and a second dielectric layer protrusion 140P2 protruding from the first region R1 and the second region R2 towards the first recess 212R and the second recess 214R. In some example embodiments, when the second base layer 214 does not include the second recess 214R, the gate dielectric layer 140 may not include the second dielectric layer protrusion 140P2 in the second region R2.

In the first region R1, the first gate line GL1 may have a first gate protrusion GL1P protruding toward the first recess 212R and in the second region R2, the second gate line GL2 may have a second gate protrusion GLP2 protruding toward the second recess 214R. In some example embodiments, when the second base layer 214 does not include the second recess 214R, the second gate line GL2 may not include the second gate protrusion GLP2 in the second region R2. However, inventive concepts are not limited thereto. For example, in some example embodiments, when at least one of the first recess 212R and the second recess 214R is offset by the gate dielectric layer 140, at least one of the first gate protrusion GL1P and the second gate protrusion GLP2 may not be formed.

Figure 17A:
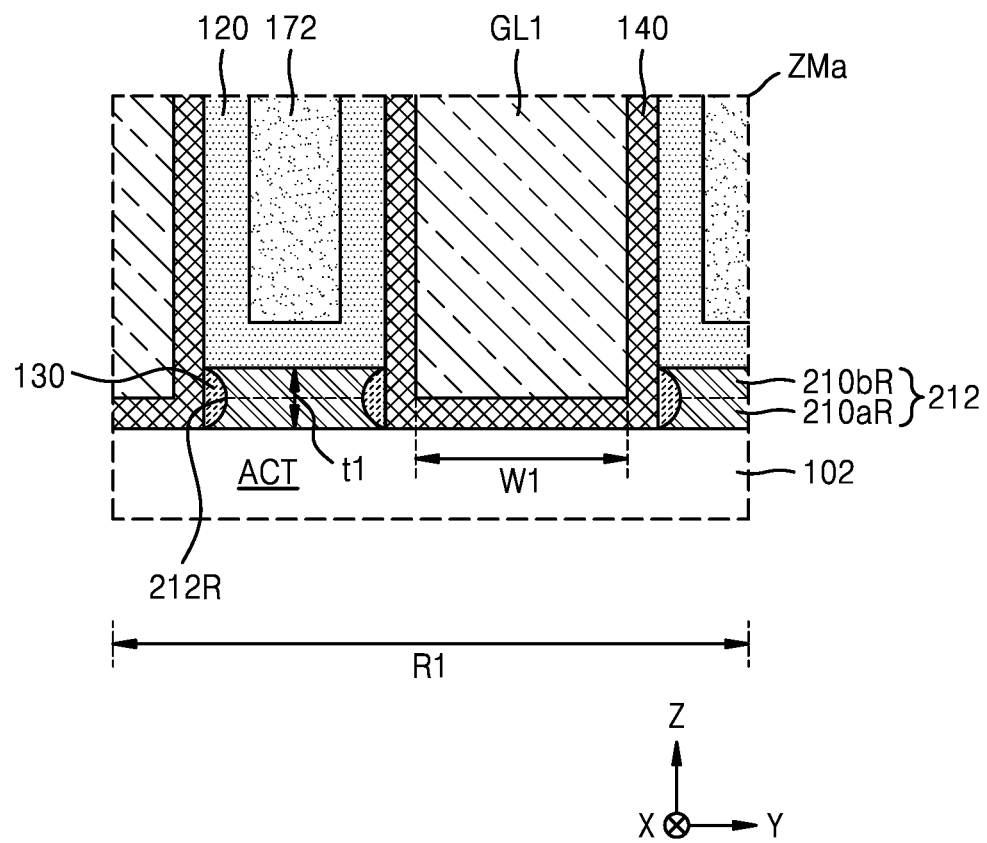
FIGS. 17A to 17D are cross-sectional views showing an enlarged view of a portion of a semiconductor device according to one or more example embodiments.
Figure 17B:
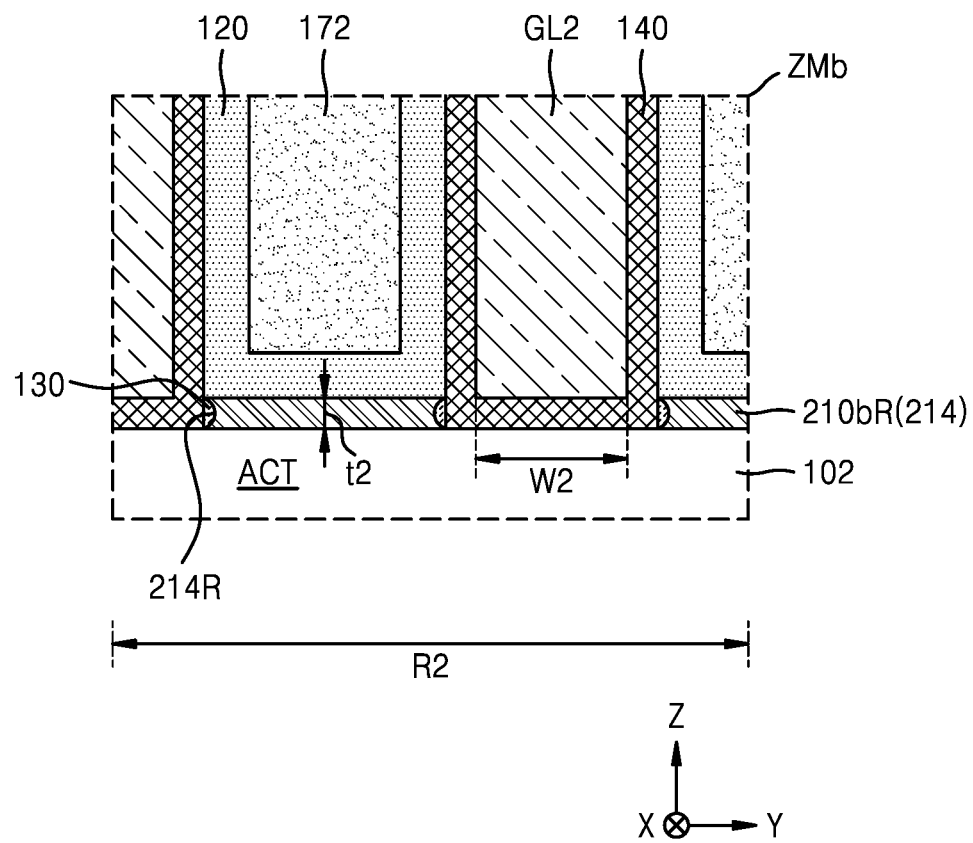
Figure 17C:
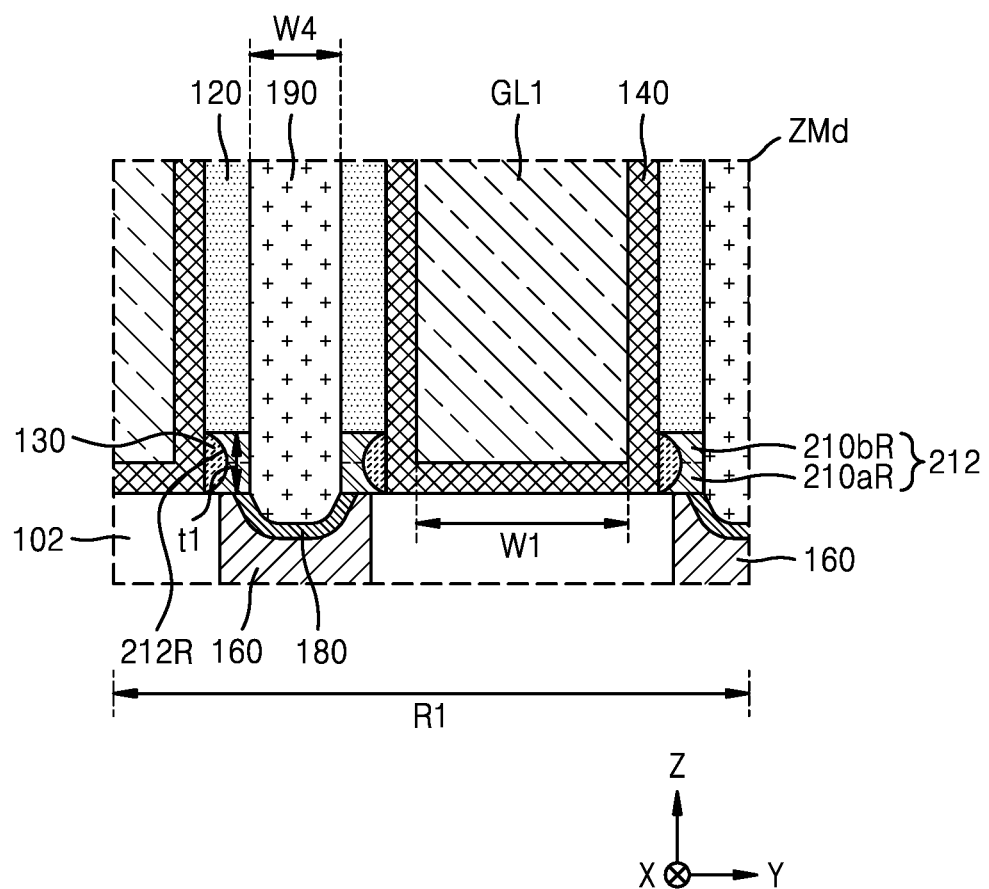
Figure 17D:
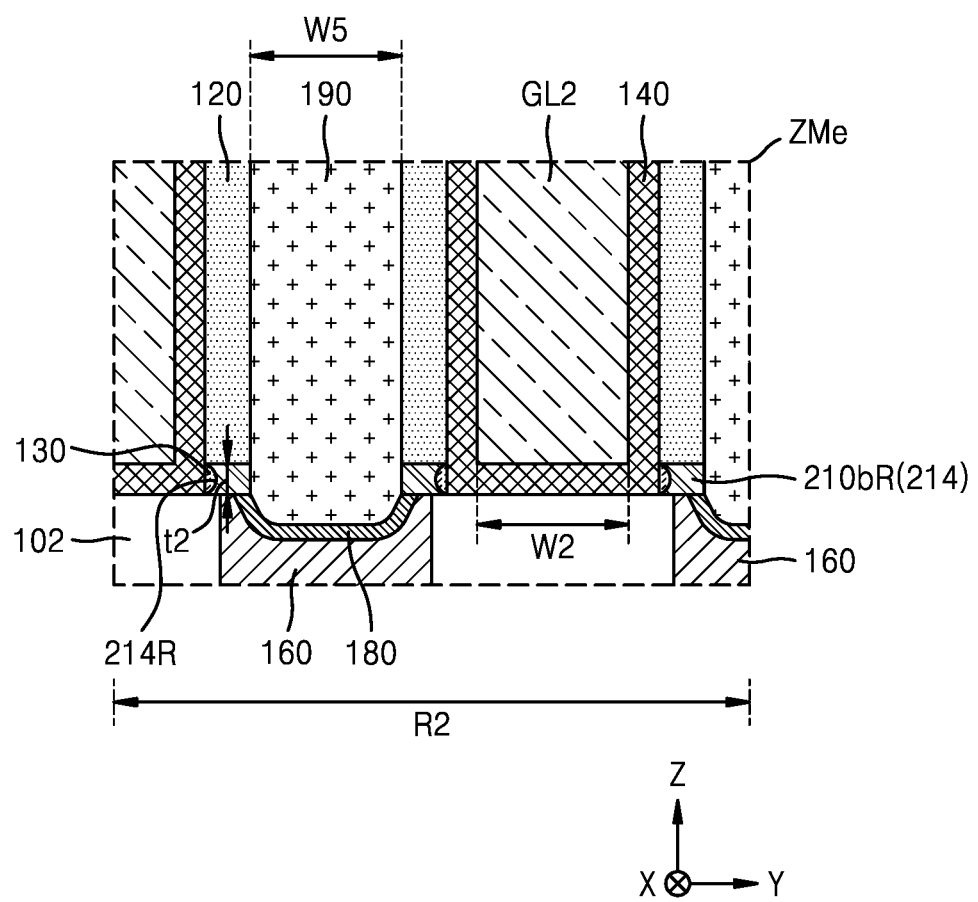

FIGS. 17A to 17D are cross-sectional views showing an enlarged view of a portion in a semiconductor device according to one or more example embodiments. In detail, FIGS. 17A and 17B are cross-sectional views showing enlarged views of the portions ZMa and ZMb, respectively, of FIG. 14A, and FIGS. 17C and 17D are cross-sectional views showing enlarged views of the portions ZMd and ZMe, respectively, of FIG. 14B.

Referring to FIGS. 17A to 17D, the first base layer 212 of the first region R1 and the second base layer 214 of the second region R2 may respectively have a first recess 212R and a second recess 214R recessed inward from the side wall of the spacer layer 120. In some example embodiments, the first base layer 212 having the first thickness t1 that is relatively greater has the first recess 212R, but the second base layer 214 having the second thickness t2 that is relatively smaller may not have the second recess 214R.

A buried layer 130 may be filled in the first recess 212R and the second recess 214R. A side wall of the buried layer 130 is connected to the side wall of the spacer layer 120, and the side wall of the spacer layer 120 and one side wall of the buried layer 130 may be coplanar. The buried layer 130 may be obtained by forming a buried material layer filled in the first gate space GS1, the second gate space GS2, and the third gate space GS3 shown in FIGS. 12A and 12B and performing an etching, e.g. an anisotropic etching, to allow a portion of the buried material layer to fill the first recess 212R and the second recess 214R.

Since the buried layer 130 is filled in the first recess 212R and the second recess 214R, the gate dielectric layer 140 may not include the first dielectric layer protrusion 140P1 and the second dielectric layer protrusion 140P2 shown in FIGS. 16A to 16D, and the first gate line GL1 and the second gate line GL2 may not include the first gate protrusion GL1P and the second gate protrusion GL2P shown in FIGS. 16A to 16D.

In FIGS. 1 to 17D, the semiconductor device 1 includes the line pattern having three different line widths, for example, the first gate line GL1 having the first width W1, the second gate line GL2 having the second width W2, and the third gate line GL3 having the third width W3, but the semiconductor device 1 inventive concepts are not limited thereto. For example, the semiconductor device 1 may include a line pattern having two different line widths or a line pattern having four different line widths.

FIGS. 18 to 32 are cross-sectional views for describing a method of manufacturing a semiconductor device and a semiconductor device manufactured by the method, according to one or more example embodiments, in a processing order. In detail, FIGS. 18 to 32 are cross-sectional views taken along a location corresponding to an extending direction (Y direction) of a fin type active area FA included in a semiconductor device 2 shown in FIG. 32. In FIGS. 18 to 32, descriptions already provided above with reference to FIGS. 1 to 17D may be omitted.

Figure 18:
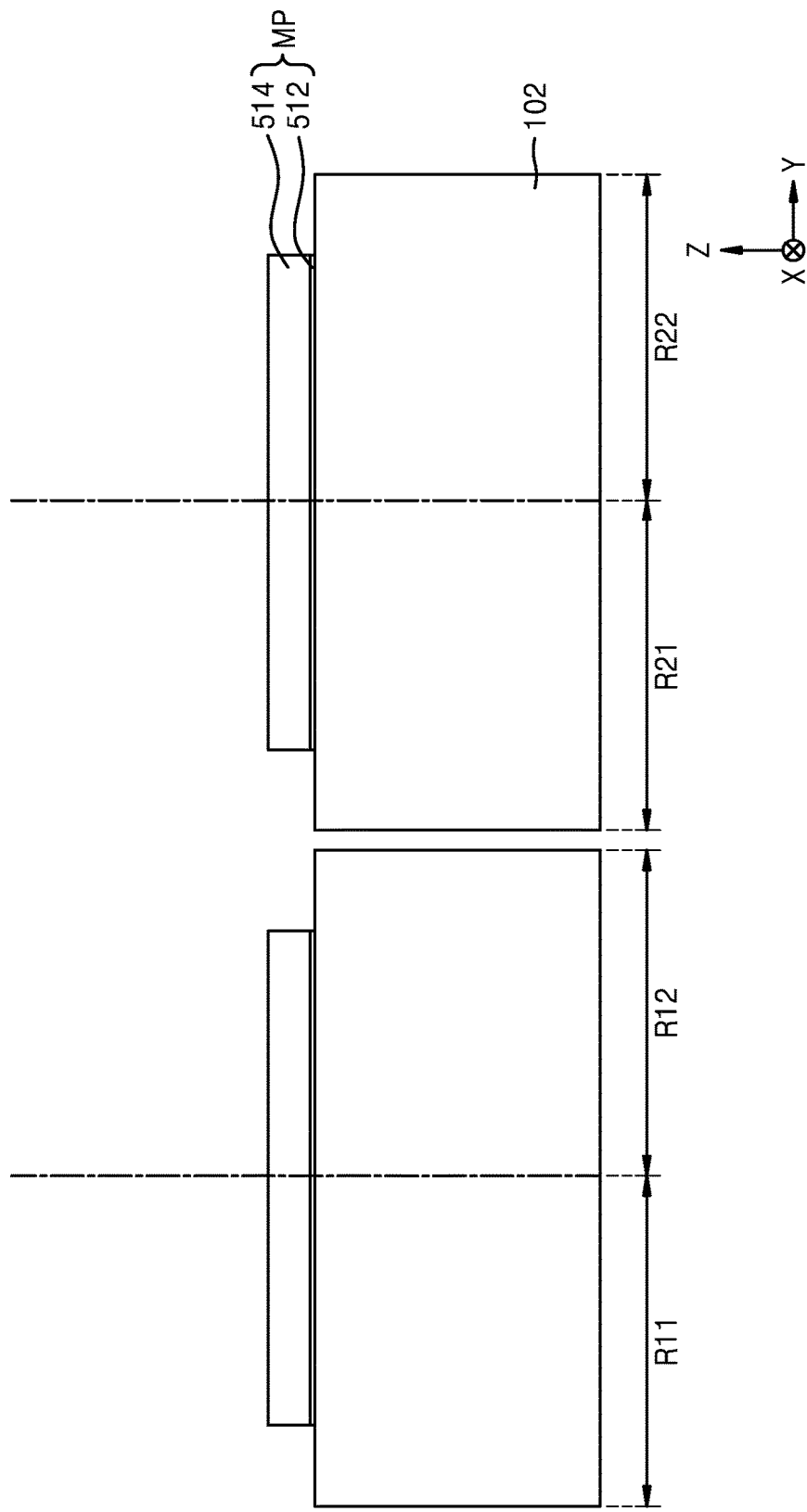
FIGS. 18 to 32 are cross-sectional views for describing a method of manufacturing a semiconductor device and a semiconductor device manufactured by the method, according to one or more example embodiments, in a processing order.

Referring to FIG. 18, a mask pattern MP is formed on the substrate 102 having a first region R11, a second region R12, a third region R21, and a fourth region R22. The mask pattern MP extends along the second direction (Y direction), and may include a plurality of line patterns arranged along the first direction (X direction) with specific (or, alternatively, predetermined) intervals. The mask pattern MP may include a pad oxide layer pattern 152 and a hard mask pattern 514. The hard mask pattern 514 may include silicon nitride, polysilicon, a spin-on-hardmark (SOH) material, or a combination thereof, but inventive concepts are not limited thereto.

Figure 19:
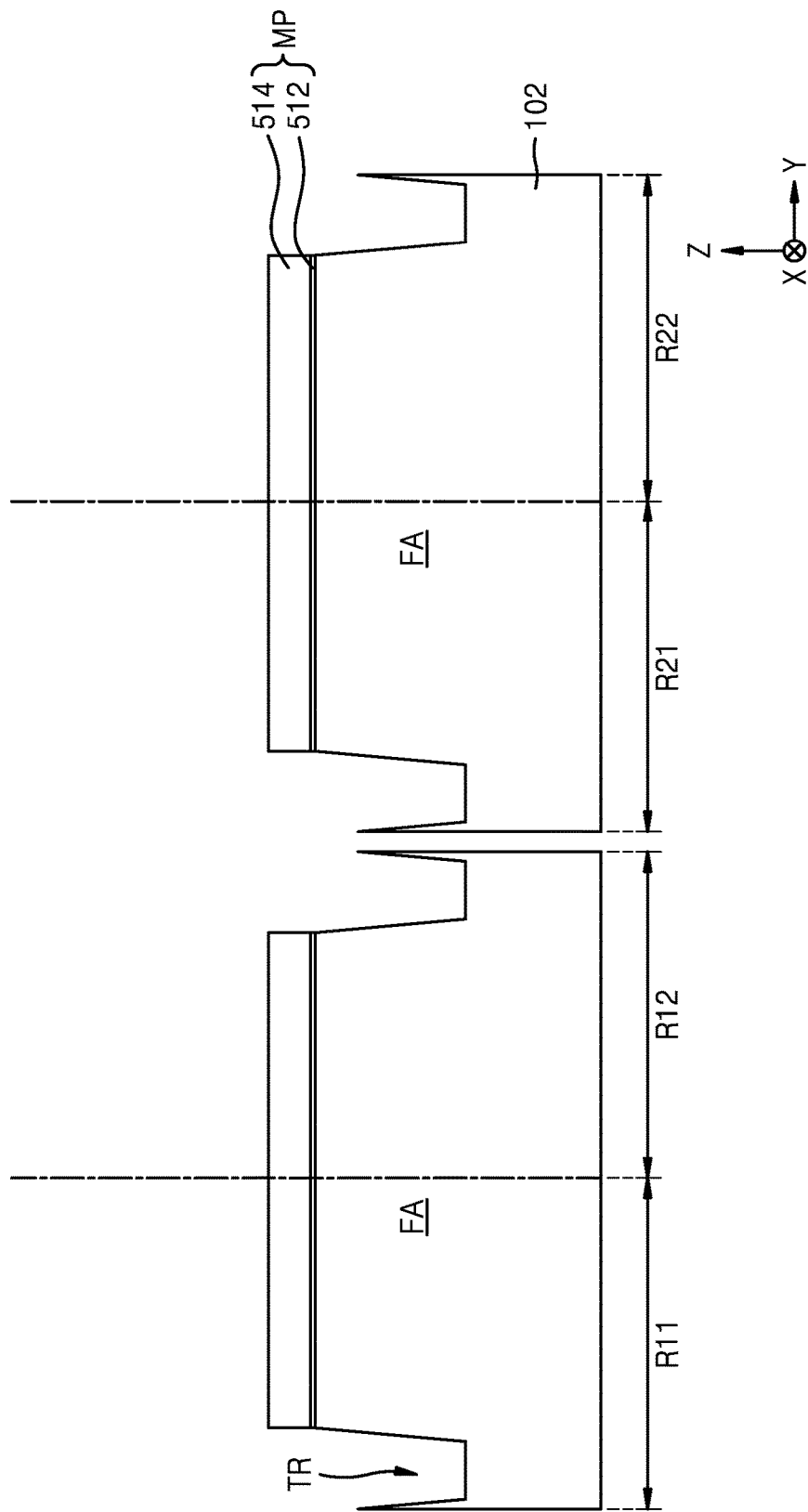

Referring to FIG. 19, the substrate 102 is partially etching by using the mask pattern MP as an etching mask to form a plurality of trenches TR. As a result, in each of the first, second, third, and fourth regions R11, R12, R21, and R22, a plurality of fin type active areas FA defined by the plurality of trenches TR may be formed. The plurality of fin type active areas FA extend in the second direction (Y direction), and may be arranged in the first direction (X direction) with specific (or, alternatively, predetermined) intervals.

Figure 20:
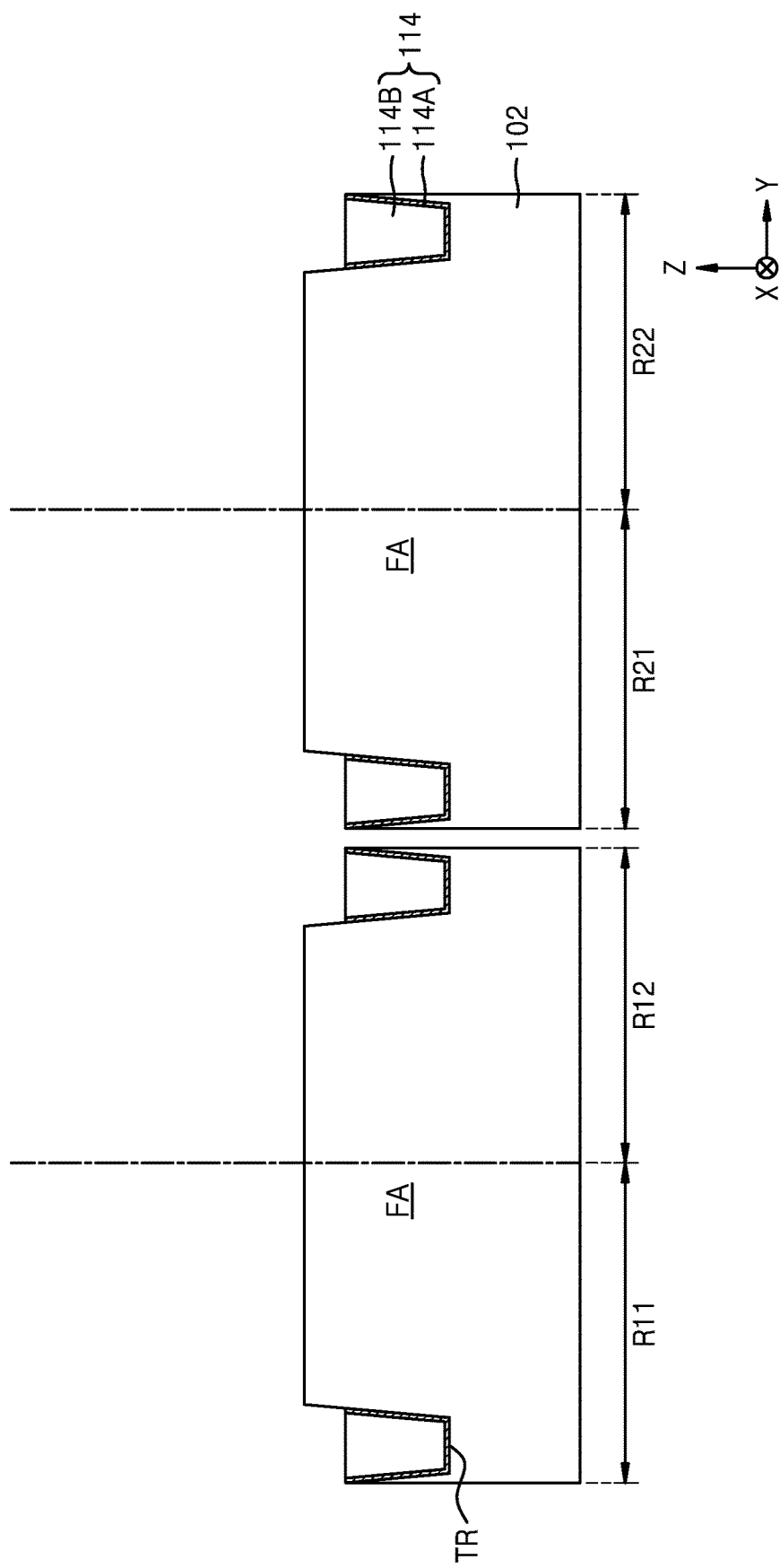

Referring to FIG. 20, an isolation layer 114 is formed in each of the plurality of trenches TR. The isolation layer 114 may include an insulating liner 114A conformally covering an inner wall of the trench TR, and a gap-fill insulating layer 114B filling the trench TR on the insulating liner 114A.

The insulating liner 114A may include silicon nitride (SiN), silicon oxynitride (SiON), silicon boronitride (SiBN), silicon carbide (SiC), SiC:H, SiCN, SiCN:H, SiOCN, SiOCN:H, silicon oxycarbide (SiOC), silicon dioxide (SiO2), polysilicon, or a combination thereof. In some example embodiments, the insulating liner 114A may have a thickness of about 10 Å to about 100 Å. In some example embodiments, the gap-fill insulating layer 114B may include an oxide layer. In some example embodiments, the gap-fill insulating layer 114B may include an oxide layer formed by a deposition process or a coating process.

After that, the mask pattern MP (see FIG. 19) remaining on the substrate 102 is removed, and a recessing process is performed to remove the isolation layer 114 to a specific (or, alternatively, predetermined) thickness from an upper surface thereof so that the upper surface of the isolation layer 114 may have a lower level than an upper surface of the fin type active area FA. In some example embodiments, the recessing process is performed so that the upper surface of the isolation layer 114 and the upper surface of the fin type active area FA may be at the same or similar level. To perform the above recessing process, a dry etching, a wet etching, or an etching combining the dry and wet etching may be used.

In some example embodiments, after removing the mask pattern MP and before performing the recessing process for removing the isolation layer 114 to a specific (or, alternatively, predetermined) thickness from the upper portion thereof, an ion implantation process for injecting impurity ions for adjusting a threshold voltage into the upper portion of the plurality of fin type active areas FA may be performed. In some example embodiments, in the ion implantation process for injecting the impurity ions adjusting the threshold voltage, P ions, As ions, and/or B ions may be injected as the impurity ions.

Figure 21:
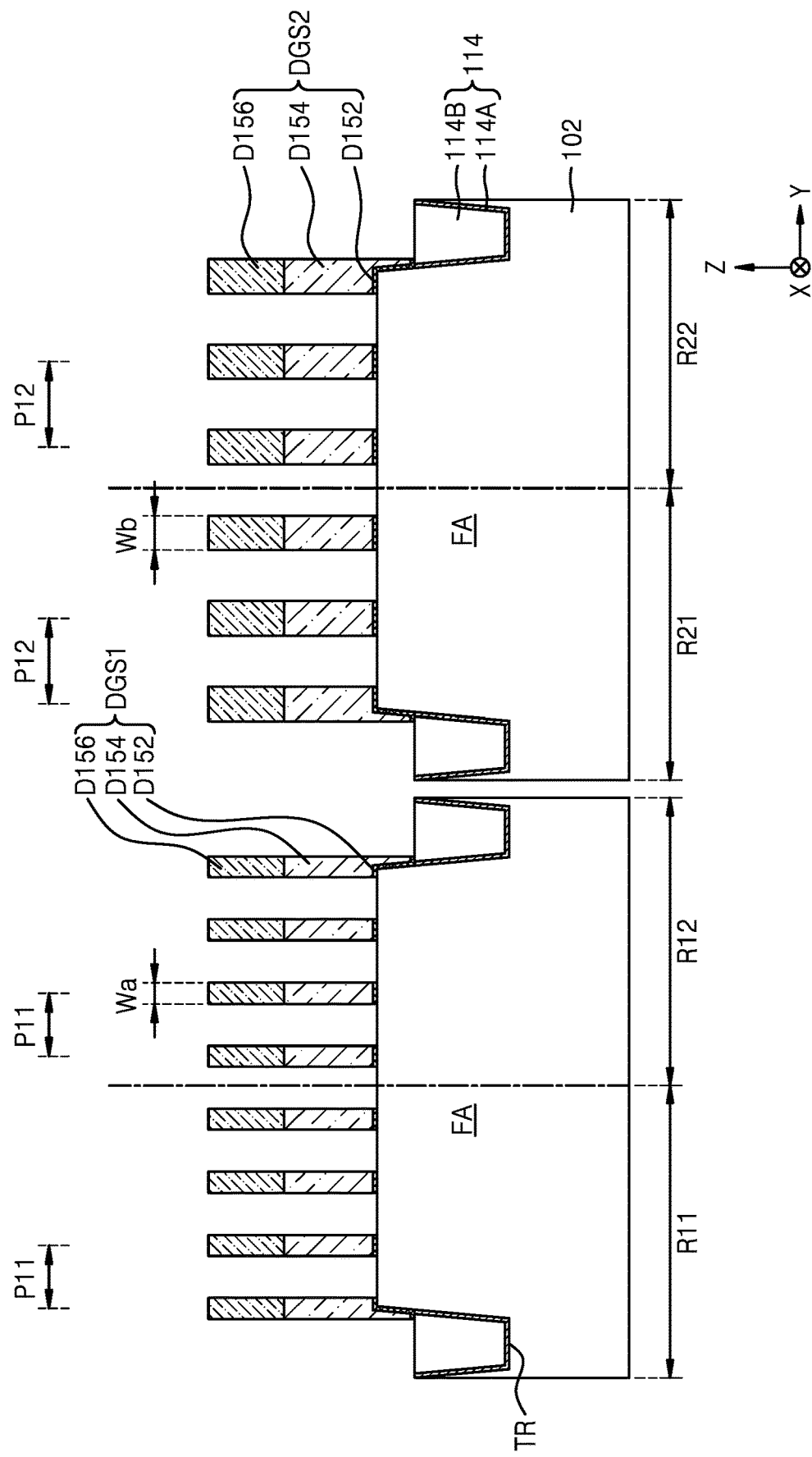

Referring to FIG. 21, a plurality of first dummy gate structures DGS1 and a plurality of second dummy gate structures DGS2 extending in the first direction (X direction) are formed on the substrate 102 having the fin type active areas FA. Each of the plurality of first dummy gate structures DGS1 and each of the plurality of second dummy gate structures DGS2 may each have a structure in which the oxide layer D152, the dummy gate layer D154, and the capping layer D156 are sequentially stacked.

The plurality of first dummy gate structures DGS1 may be arranged with the same widths Wa and the same first pitches P11 in the second direction (Y direction) in the first and second regions R11 and R12, and the plurality of second dummy gate structures DGS2 may be arranged with the same widths Wb and the same second pitches P12 in the third and fourth regions R21 and R22. The first pitch P11 is less than the second pitch P12.

The width Wa of each of the plurality of first dummy gate structures DGS1 in the second direction (Y direction) may be less than the width Wb of each of the plurality of second dummy gate structures DGS2, but inventive concepts are not limited thereto. In some example embodiments, the width Wa of each of the plurality of first dummy gate structures DGS1 in the second direction (Y direction) may be equal to the width Wb of each of the plurality of second dummy gate structures DGS2. In some other embodiments, the width Wa of each of the plurality of first dummy gate structures DGS1 in the second direction (Y direction) may be greater than the width Wb of each of the plurality of second dummy gate structures DGS2.

Figure 22:
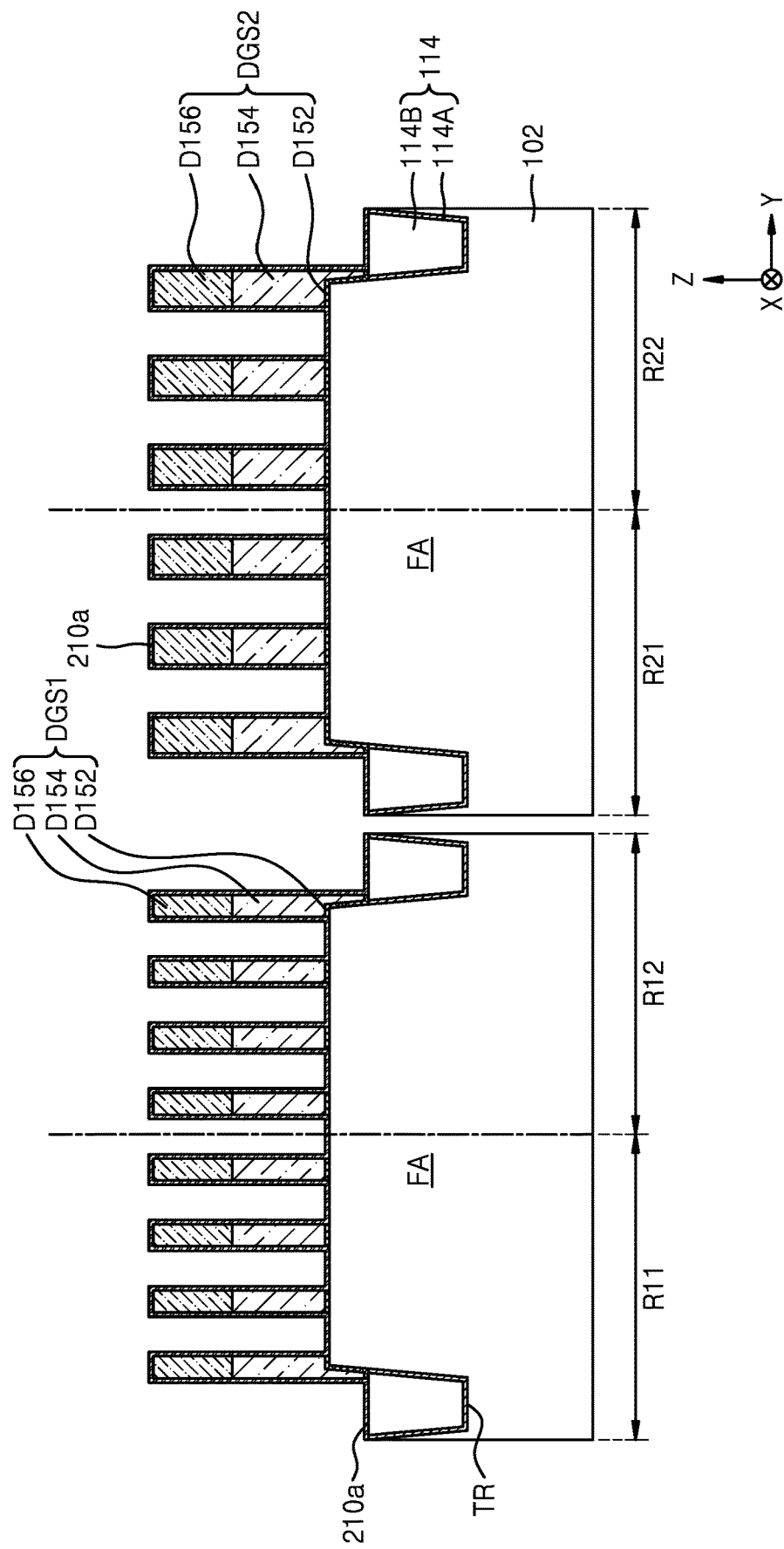

Referring to FIG. 22, the first cover layer 210a is formed on the substrate 102, on which the plurality of first dummy gate structures DGS1 and the plurality of second dummy gate structures DGS2 are formed. The first cover layer 210a has a constant thickness throughout the first region R11, the second region R12, the third region R21, and the fourth region R22, and may conformally cover upper surfaces and side walls of the plurality of first dummy gate structures DGS1 and the plurality of second dummy gate structures DGS2. The first cover layer 210a may be formed in a manner similar to that discussed above with reference to FIG. 3.

Figure 23:
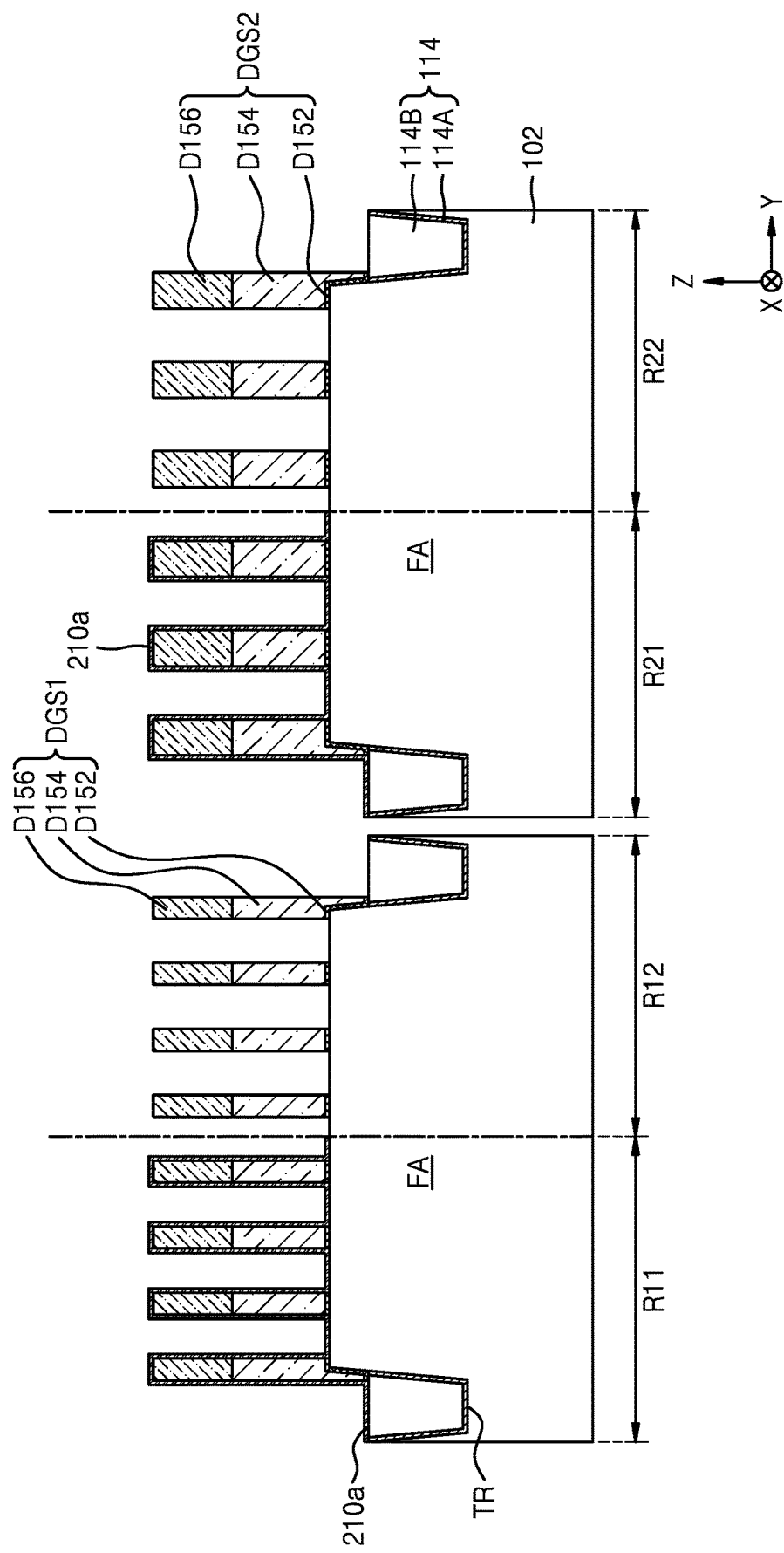

Referring to FIG. 23, a mask layer (not shown) covering the first and third regions R11 and R21 and exposing the second and fourth regions R12 and R22 is formed and the first cover layer 210a on the second and fourth regions R12 and R22 is removed, so that the first cover layer 210a may only remain on the first and third regions R11 and R21. After that, the mask layer may be removed. The process for forming the mask layer and removing the first cover layer 210a may be similar to those discussed above with reference to FIG. 4.

Figure 24:
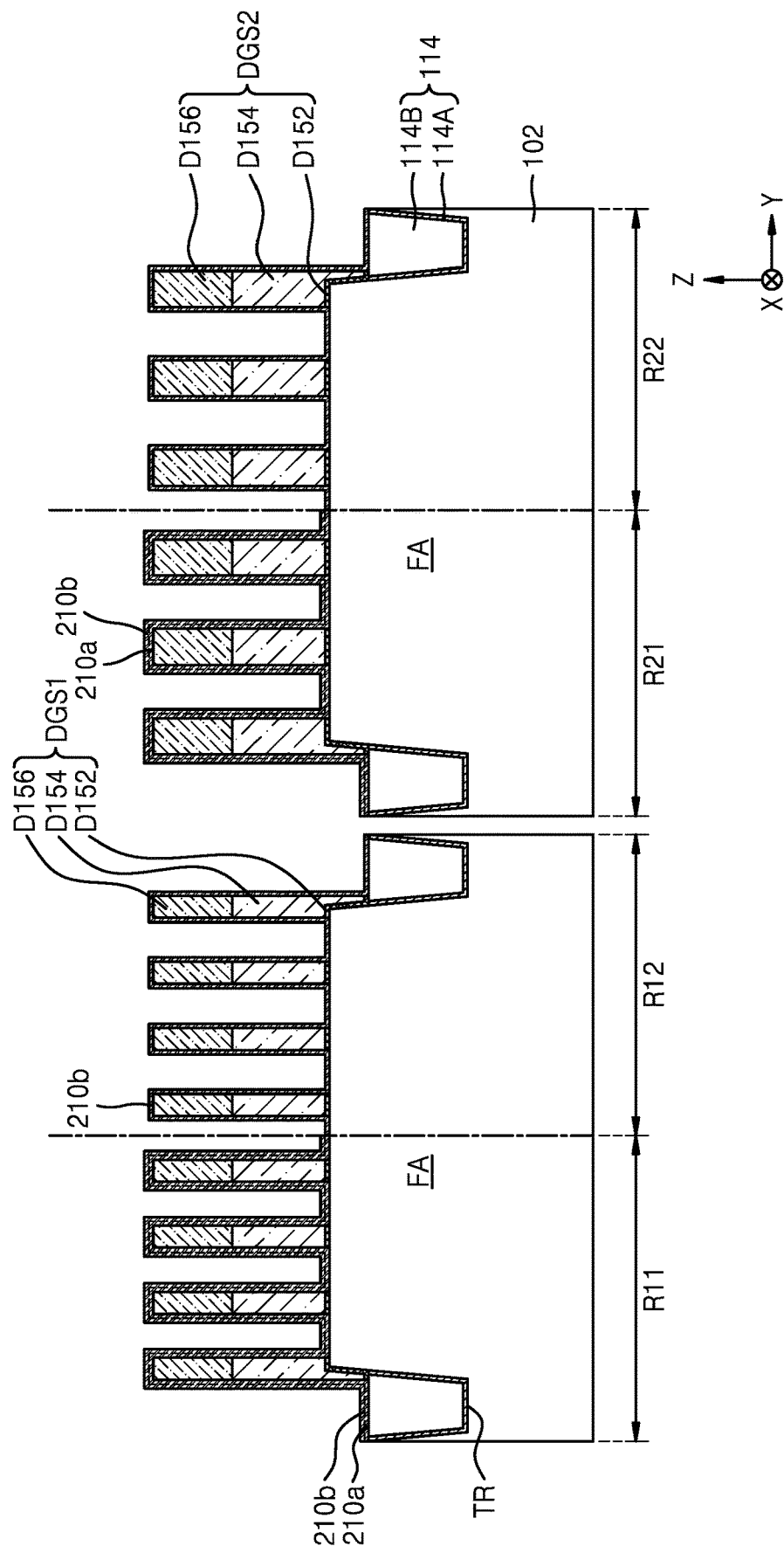

Referring to FIG. 24, the second cover layer 210b is formed on a resultant object of FIG. 23. The second cover layer 210b has a constant thickness on the first region R11, the second region R12, the third region R21, and the fourth region R22, and may conformally cover the surface of the first cover layer 210a in the first and third regions R11 and R21, the upper surface of the substrate 102 and the upper surfaces and the side walls of the plurality of first dummy gate structures DGS1 in the second region R12, and the upper surface of the substrate 102 and the upper surfaces and the side walls of the plurality of second dummy gate structures DGS2 in the fourth region R22. In some example embodiments, the second cover layer 210b may include the same material as that of the first cover layer 210a, but inventive concepts are not limited thereto. The process for forming the second cover layer 210b may be similar to that discussed above with reference to FIG. 5.

The first region R11 or the third region R21 is similar to the first region R1 shown in FIGS. 1 to 17D, and the second region R12 or the fourth region R22 may be similar to the second region R2 shown in FIGS. 1 to 17D.

In some example embodiments, the substrate 102 may further include at least one other region that is similar to the third region R3 shown in FIGS. 1 to 17D for forming the plurality of first dummy gate structures DGS1 or the plurality of second dummy gate structures DGS2, and in this case, a portion of the second cover layer 210b formed on the at least one another region may be removed in a similar way to that of FIG. 6.

In some example embodiments, when the first region R11 or the third region R21 is similar to the second region R2 shown in FIGS. 1 to 17D and the second region R12 or the fourth region R22 is similar to the third region R3 shown in FIGS. 1 to 17D, the second cover layer 210b may be omitted.

Figure 25:
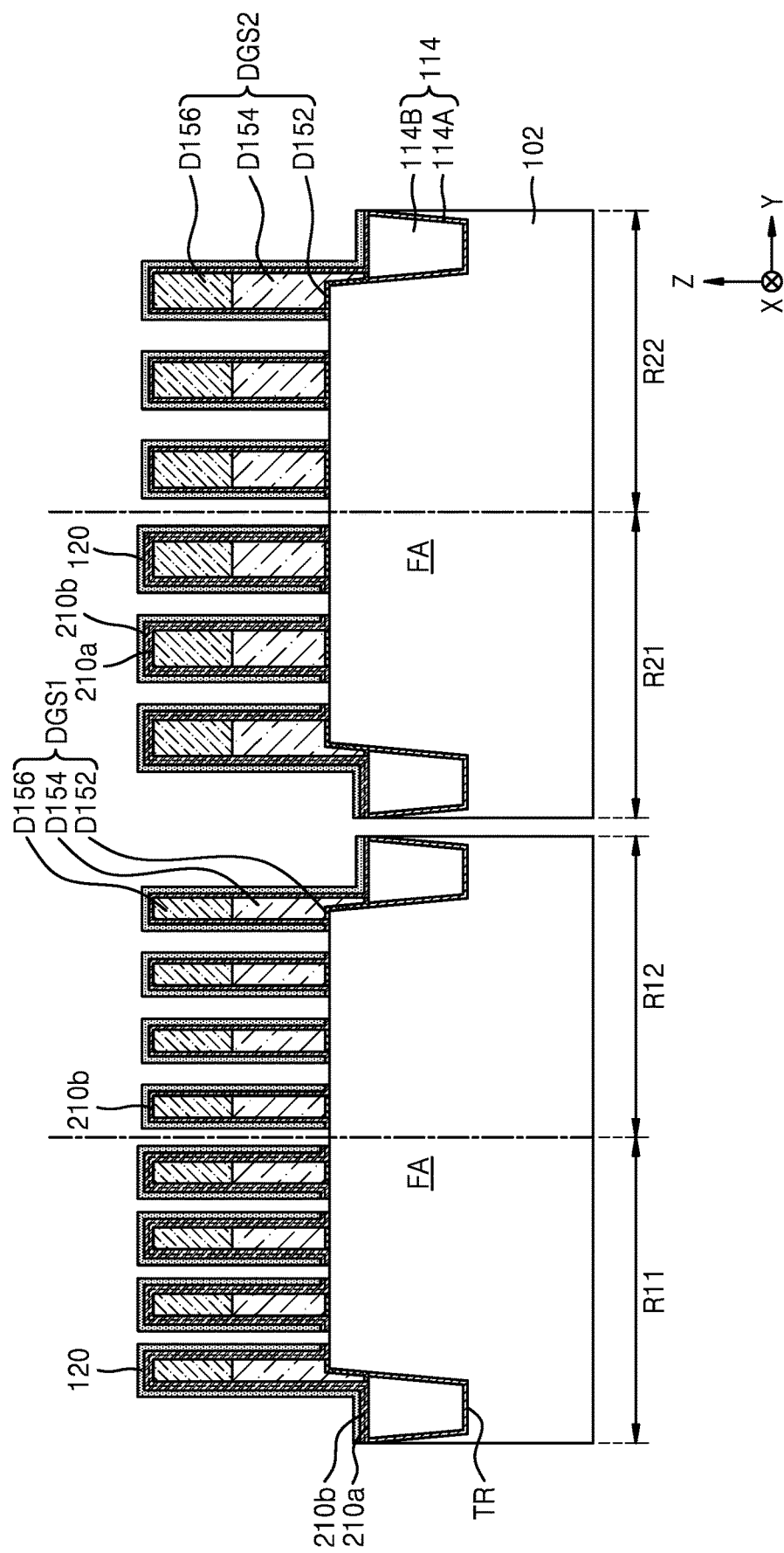

Referring to FIG. 25, the spacer layer 120 is formed on the resultant object of FIG. 24. The spacer layer 120 may have a constant thickness throughout the first, second, third, and fourth regions R11, R12, R21, and R22, and may conformally cover the surface of the second cover layer 210b in the first and third regions R11 and R21 and the surface of the first cover layer 210a in the second and fourth regions R12 and R22.

Figure 26:
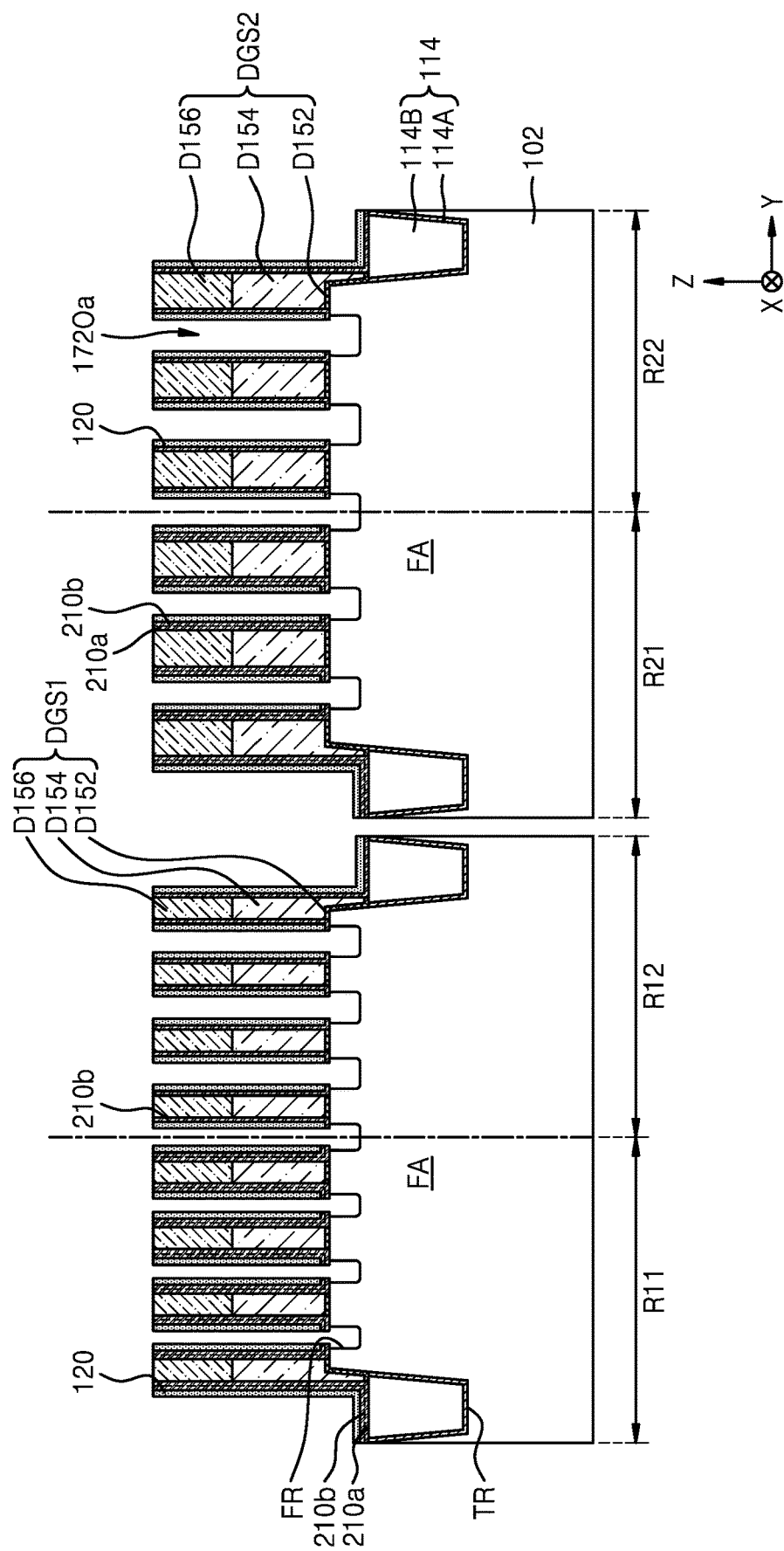

Referring to FIG. 26, a first inter-gate insulating layer including an opening 172Oa extending in the second direction (Y direction) is formed on a resultant object of FIG. 25, wherein the first inter-gate insulating layer is similar to the first inter-gate insulating layer 172 (see FIGS. 8A and 8B). In FIG. 26, in order to clearly show the opening 172Oa, other portions than a cut surface (e.g., a rear portion of the cut surface in the X direction) are not shown.

During the forming of the opening 172Oa, a portion of the first cover layer 210a and a portion of the second cover layer 210 each covering the upper surface of the substrate 102 are removed so that the fin type active areas FA among the plurality of first dummy gate structures DGS1 and the plurality of second dummy gate structures DGS2 may be partially exposed on a bottom surface of the opening 172Oa, and exposed portion of the fin type active area FA may be partially removed to form a plurality of fin recesses FR. Further, during the forming of the opening 172Oa, the first cover layer 210a and the second cover layer 210b each covering the upper surfaces of the plurality of dummy gate structures DGS1 and the upper surfaces of the plurality of second dummy gate structures DGS2 exposed in the opening 172OA, that is, the upper surface of the capping layer D156, are also removed so that the upper surface of the capping layer D156 may be partially exposed in the opening 172Oa.

Figure 27:
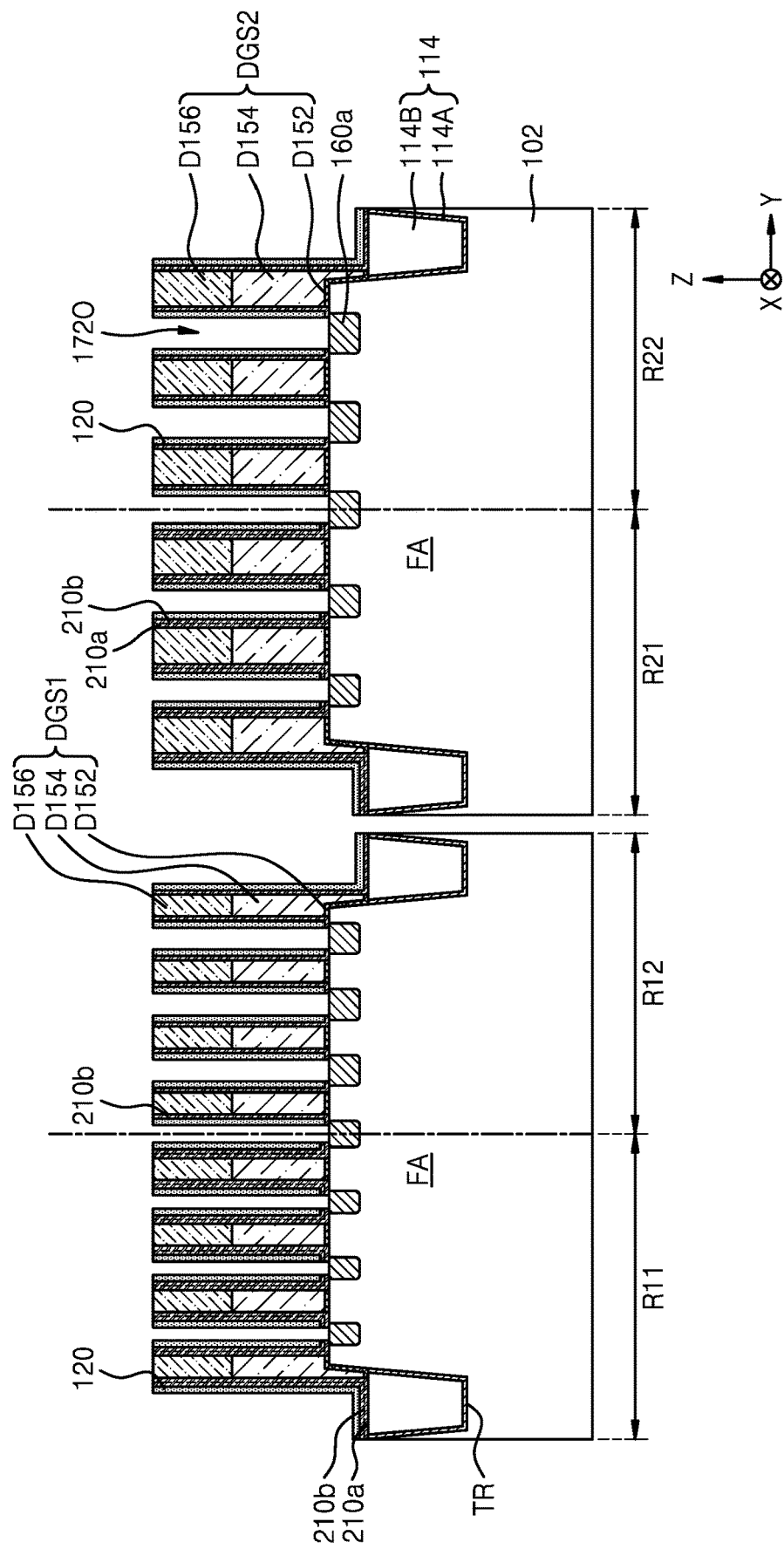

Referring to FIG. 27, a plurality of source/drain regions 160a respectively filling the plurality of fin recesses FR (see FIG. 26) are formed on the fin type active areas FA exposed through the bottom surface of the opening 172Oa. The plurality of source/drain regions 160a may be formed to protrude from the upper surface of the substrate 102 in the third direction (Z direction) perpendicular to the upper surface, for example by epitaxial growing a semiconductor material from the exposed surface of each of the plurality of fin recesses FR at the bottom surface of the opening 172Oa.

In FIG. 27, upper surfaces of the plurality of source/drain regions 160a are located at the same level as that of the upper surface of the substrate 102, but are not limited thereto. In some example embodiments, the upper surfaces of the plurality of source/drain regions 160a may be at a greater level than that of the upper surface of the substrate 102.

Figure 28:
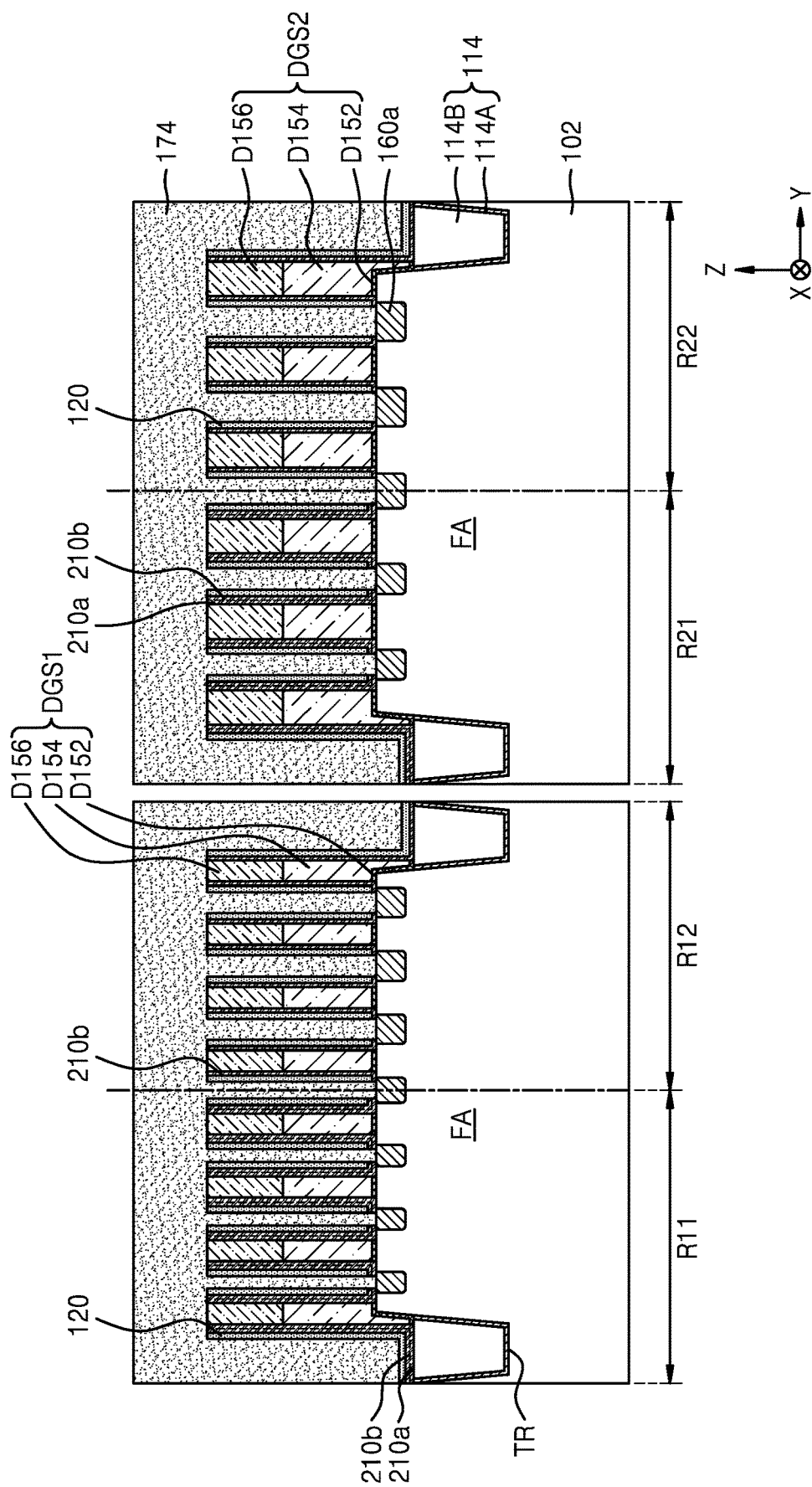

Referring to FIG. 28, the second inter-gate insulating layer 174 filling the opening 172Oa (see FIG. 27) is formed.

Figure 29:
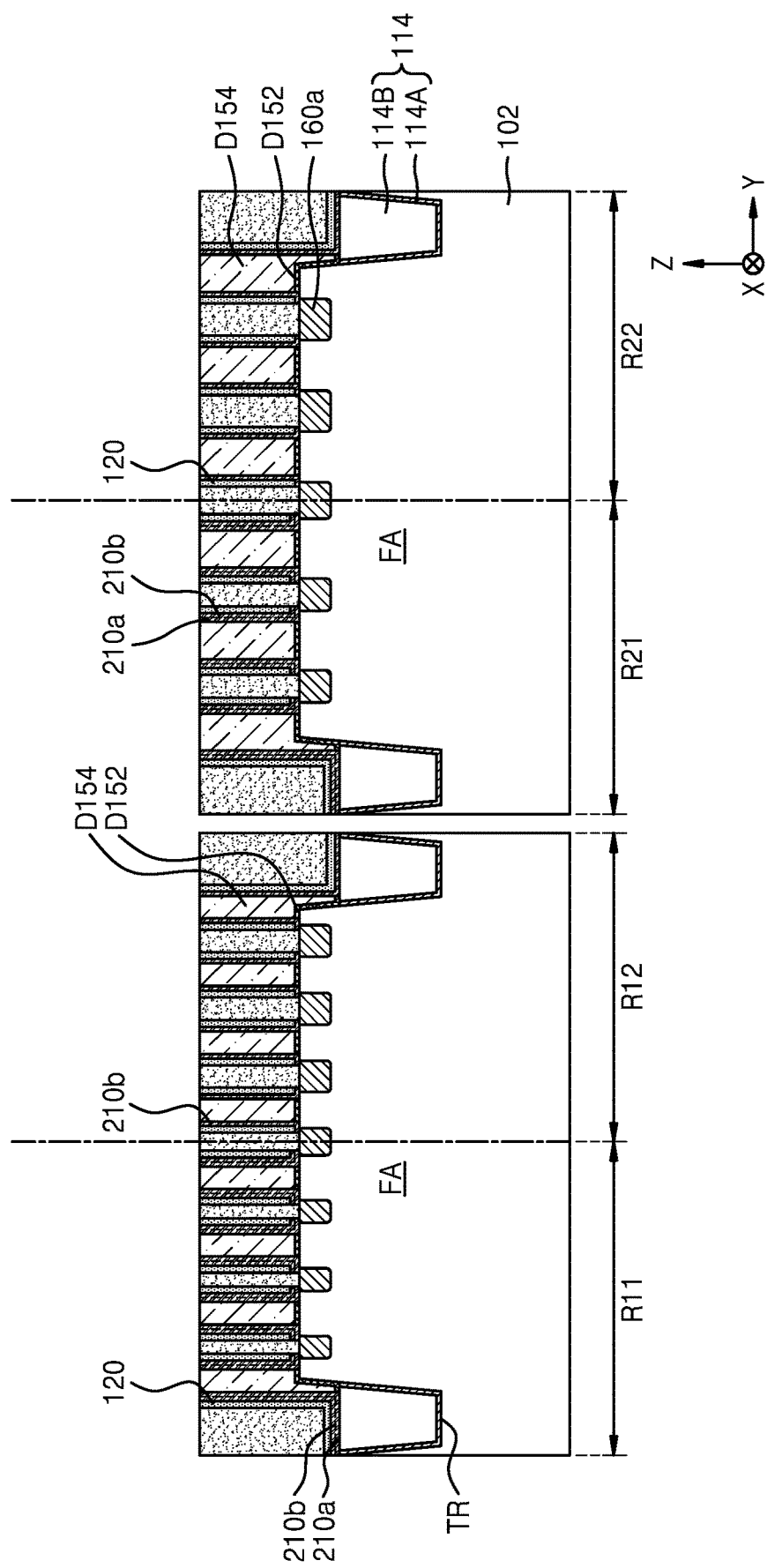

Referring to FIG. 29, an upper portion of the first inter-gate insulating layer that is similar to the first inter-gate insulating layer 172 (see FIGS. 8A and 8B) and an upper portion of the second inter-gate insulating layer 174 are partially removed to expose the dummy gate layer D154. During the partial removal of the upper portions of the first inter-gate insulating layer and the second inter-gate insulating layer 174, the capping layer D156 (see FIG. 28) and the first cover layer 210a, the second cover layer 210b, and the spacer layer 120 formed on the side wall of the capping layer D156 may be partially removed, either.

Figure 30:
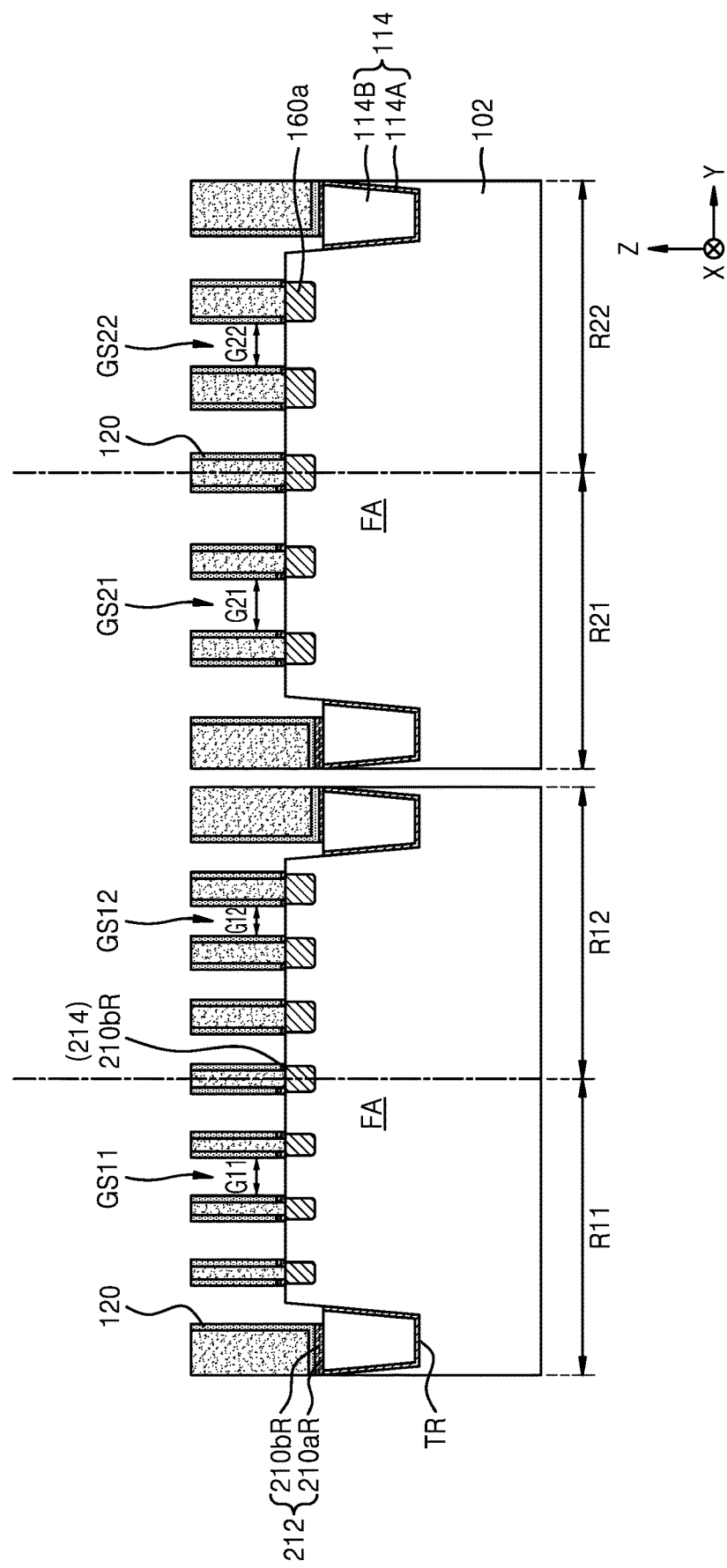

Referring to FIG. 30, in the first, second, third, and fourth regions R11, R12, R21, and R22, the dummy gate layer D154 (see FIG. 29), the oxide layer D152 (see FIG. 29), and portions of the first cover layer 210a (see FIG. 29) and the second cover layer 210b (see FIG. 29) each covering the side walls of each of the dummy gate layer D154 and the oxide layer D152 are simultaneously removed to form first gate spaces GS11, second gate spaces GS12, third gate spaces GS21, and fourth gate spaces GS22 respectively in the first, second, third, and fourth regions R11, R12, R21, and R22. The fin type active areas FA may be exposed through bottom surfaces of the first gate space GS11, the second gate space GS12, the third gate space GS21, and the fourth gate space GS22.

Portions of the first cover layer 210a and the second cover layer 210b remaining under the spacer layer 120 may remain respectively as a first remaining cover layer 210aR and a second remaining cover layer 210bR. The first remaining cover layer 210aR and the second remaining cover layer 210bR arranged under the spacer layer 120 in the first region R11 and the third region R21 may be referred to together as the first base layer 212, and the second remaining cover layer 210bR arranged under the spacer layer 120 in the second region R12 and the fourth region R22 may be referred to as the second base layer 214.

The first gate spaces GS11, the second gate spaces GS12, the third gate spaces GS21, and the fourth gate spaces GS22 may respectively have a first gap G11, a second gap G12, a third gap G21, and a fourth gap G22 in the second direction (Y direction) therebetween. The first gap G1l may be greater than the second gap G12, and the third gap G21 may be greater than the fourth gap G22. The third gap G21 may be greater than the first gap G11, and the fourth gap G22 may be greater than the second gap G12.

The first gate space GS11 and the third gate space GS21 are similar to the first gate space GS1 shown in FIGS. 12A and 12B, the second gate space GS21 and the fourth gate space GS22 are similar to the second gate space GS2 shown in FIGS. 12A and 12B, and a difference between the first gate space GS11 and the second gate space GS12 and a difference between the third gate space GS21 and the fourth gate space GS22 are similar to the difference between the first gate space GS1 and the second gate space GS2. Thus, detailed descriptions thereof are omitted.

During the removal of the dummy gate layer D154, the oxide layer D152, and the portions of the first cover layer 210a and the second cover layer 210b each covering the side walls of the dummy gate layer D154 and the oxide layer D152, the spacer layer 120 has an etching resistance, and thus various intervals may be obtained. In addition, a loading effect does not occur even in a case in which the first pitch P11 (see FIG. 21) between the first gate spaces GS11 and between the second gate spaces GS12 and the pitch P12 (see FIG. 21) of arranging the third gate spaces GS21 and the fourth gate spaces GS22 are different from each other, the first, second, third, and fourth gate spaces GS11, GS12, GS21, and GS22 may not be separately formed, but simultaneously formed with one another.

Figure 31:
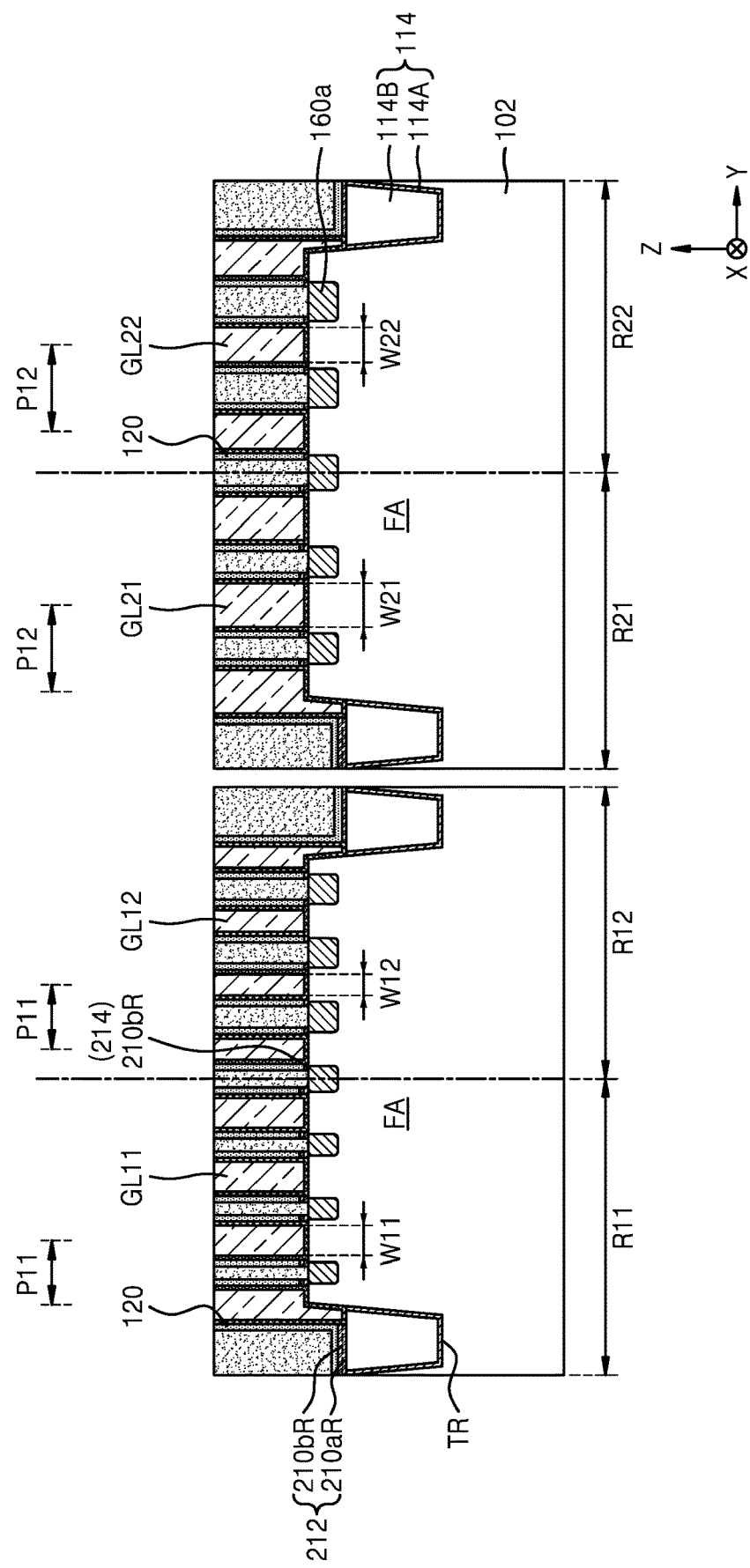

Referring to FIG. 31, after removing a natural oxide layer from the exposed surface of the fin type active area FA, the gate dielectric layer 140 is formed on exposed surfaces in each of the first, second, third, and fourth gate spaces GS11, GS12, GS21, and GS22, and first gate lines GL11, second gate lines GL12, third gate lines GL21, and fourth gate lines GL22 that respectively fill in the first, second, third, and fourth gate spaces GS11, GS12, GS21, and GS22 on the gate dielectric layer 140 are formed. The first, second, third, and fourth gate lines GL11, GL12, GL21, and GL22 may not be separately formed, but may be simultaneously formed in the first, second, third, and fourth regions R11, R12, R21, and R22.

In the first and second regions R11 and R12, the first and second gate lines GL11 and GL12 are arranged with the same first pitch P11 in the second direction (Y direction) and with different widths, that is, a first width W11 and a second width W12, and the third and fourth gate lines GL21 and GL22 may be arranged with the same second pitch P12 that is greater than the first pitch P11 in the second direction (Y direction) and with different widths, that is, a third width W21 and a fourth width W22. The first width W11 may be greater than the second width W12, and the third width W21 may be greater than the fourth width W22. Also, the third width W21 may be greater than the first width W11 and the fourth width W22 may be greater than the second width W12.

Since the first gate line GL11 and the third gate line GL21 are similar to the first gate line GL1 shown in FIGS. 13A and 13B, the second gate line G12 and the fourth gate line GL22 are similar to the second gate line GL2 shown in FIGS. 13A and 13B, and each of a difference between the first gate line GL11 and the second gate line GL12 and a difference between the third gate line GL21 and the fourth gate line GL22 is similar to a difference between the first gate line GL1 and the second gate line GL2, detailed descriptions thereof are omitted.

Figure 32:
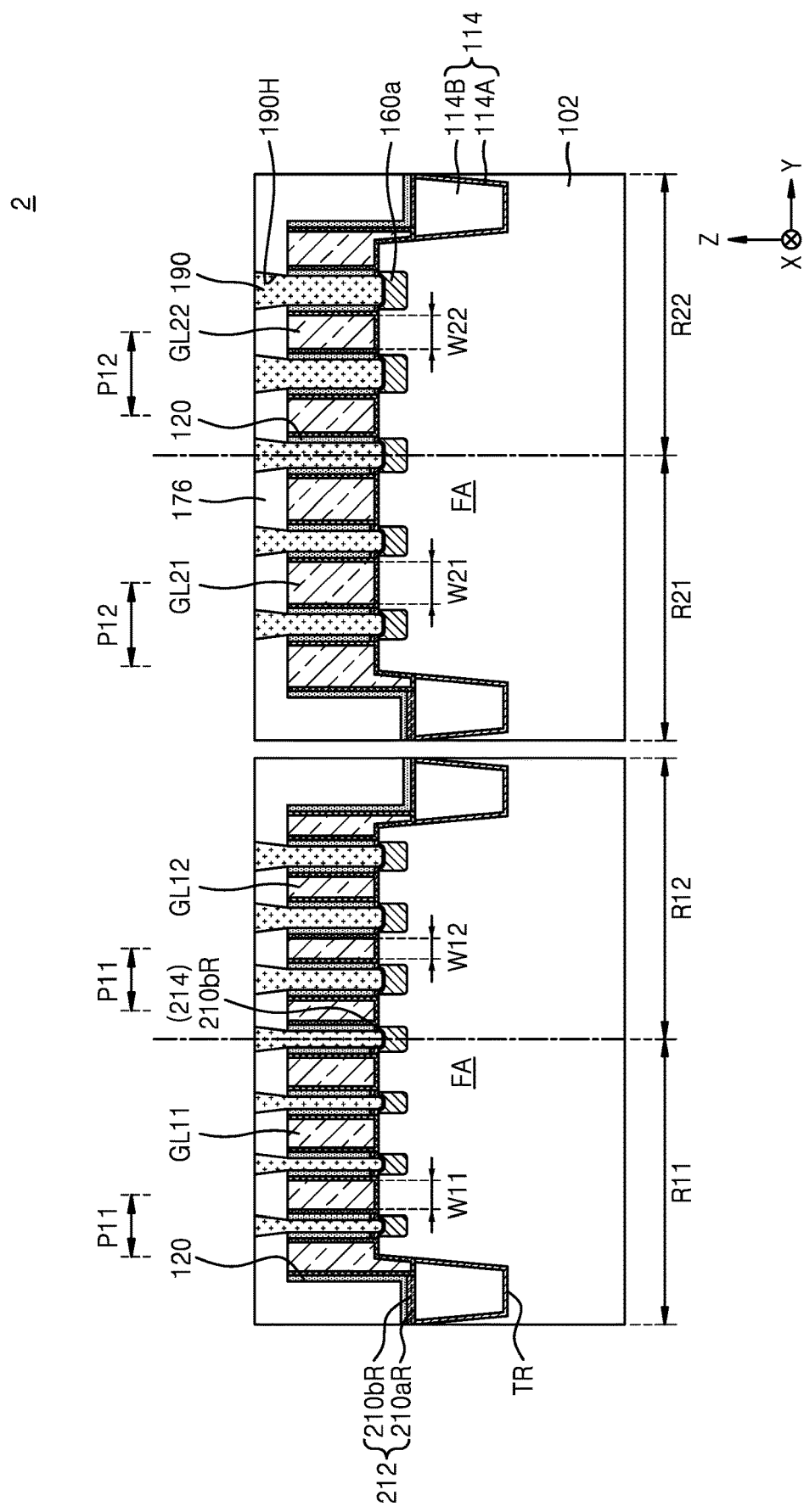

Referring to FIG. 32, an interlayer insulating layer 176 covering the plurality of gate lines GL11, GL12, GL21, and GL22 is formed, and then the plurality of contact holes 190H that penetrate through the interlayer insulating layer 176 to expose the plurality of source/drain regions 160a in the first, second, third, and fourth regions R11, R12, R21, and R22 are formed. After that, a plurality of silicide layers 180 are formed on upper surfaces of the plurality of source/drain regions 160a, wherein the upper surfaces are exposed through the plurality of contact holes 190H. Then a plurality of contact plugs 190 filled in the plurality of contact holes 190H are formed to form a semiconductor device 2.

The semiconductor device 2 includes the substrate 102 having the first, second, third, and fourth regions R11, R12, R21, and R22, and the plurality of gate lines GL11, GL12, GL21, and GL22 intersecting with the fin type active area FA of the substrate 102 and extending in the first direction (X direction). The plurality of gate lines GL11, GL12, GL21, and GL22 may include the first gate lines GL11 arranged in the first region R11, the second gate lines GL12 arranged in the second region R12, the third gate lines GL21 arranged in the third region R21, and the fourth gate lines GL22 arranged in the fourth region R22. The first and second gate lines GL11 and GL12 may extend in parallel with each other in the first direction (X direction) with the first pitch P11 in the second direction (Y direction), and the third and fourth gate lines GL21 and GL22 may extend in parallel with each other in the first direction (X direction) with the second pitch P12 in the second direction (Y direction).

The first, second, third, and fourth gate lines GL11, GL12, GL21, and GL22 may respectively have the first width W11, the second width W12, the third width W21, and the fourth width W22 in the second direction (Y direction). The first width W11 may be greater than the second width W12, and the third width W21 may be greater than the fourth width W22. Also, the third width W21 may be greater than the first width W11 and the fourth width W22 may be greater than the second width W12.

The gate dielectric layer 140 is arranged between the fin type active area FA and bottom surfaces of the plurality of gate lines GL11, GL12, GL21, and GL22. In some example embodiments, the gate dielectric layer 140 may extend from between the fin-type active area FA and the bottom surfaces of the plurality of gate lines GL11, GL12, GL21, and GL22 in the third direction (Z direction) that is perpendicular to a main surface of the substrate 102, along a space between the spacer layer 120 and side walls of the plurality of gate lines GL11, GL12, GL21, and GL22.

The source/drain regions 160a may be provided at opposite sides of each of the plurality of gate lines GL11, GL12, GL21, and GL22. A pair of source/drain regions 160 and a portion in one of the plurality of gate lines GL11, GL12, GL21, and GL22 provided between the pair may configure one transistor.

The spacer layer 120 may be arranged on opposite walls of each of the plurality of gate lines GL11, GL12, GL21, and GL22. The spacer layer 120 may further partially cover the upper surface of the fin-type active area FA between two adjacent gate lines from among the plurality of gate lines GL11, GL12, GL21 and GL22. The spacer layer 120 may further partially cover a portion, on which the source/drain region 160a is not formed, in the upper surface of the fin-type active area FA between two adjacent gate lines from among the plurality of gate lines GL11, GL12, GL21 and GL22.

The interlayer insulating layer 176 may cover the plurality of (first to fourth?) gate lines GL11, GL12, GL21, and GL22. The semiconductor device 2 further includes the plurality of contact plugs 190 that penetrate through the interlayer insulating layer 176 to fill the plurality of contact holes 190H that expose the plurality of source/drain regions 160a and are connected to the plurality of source/drain regions 160a. A plurality of silicide layers 180 may be arranged between the plurality of source/drain regions 160a and the plurality of contact plugs 190.

In the first and third regions R11 and R21, the first base layer 212 including the first remaining cover layer 210aR and the second remaining cover layer 210bR may be arranged under the spacer layer 120, and in the second and fourth regions R12 and R22, the second base layer 214 including the second remaining cover layer 210bR may be arranged under the spacer layer 120.

A relationship between the difference between the first width W11 of the first gate line GL11 and the second width W12 of the second gate line GL12 and a difference between the thickness of the first base layer 212 and the thickness of the second base layer 214 and a relationship between the difference between the third width W21 of the third gate line GL21 and the fourth width W22 of the fourth gate line GL22 and the difference between the thickness of the first base layer 212 and the thickness of the second base layer 214 are similar to the relationship between the difference between the first width W1 of the first gate line GL1 and the second width W2 of the second gate line GL2 and the difference between the thickness of the first base layer 212 and the thickness of the second base layer 214 described above with reference to FIGS. 15A to 15F, and thus, detailed descriptions thereof are omitted.

Although not shown in the drawings, similarly to the descriptions with reference to FIGS. 16A to 16D, the first base layer 212 and the second base layer 214 of the semiconductor device 2 may each include the first recess 212R and the second recess 214R, the gate dielectric layer 140 may include the first dielectric layer protrusion 140P1 and the second dielectric layer protrusion 140P2, and the first gate line GL11 and the second gate line G12 may include the first gate protrusion GL1P and the second gate protrusion GLP2, and thus, detailed descriptions thereof are omitted.

Also, although not shown in the drawings, similarly to the descriptions with reference to FIGS. 17A to 17D, the first base layer 212 and the second base layer 214 of the semiconductor device 2 may each include the first recess 212R and the second recess 214R, and the semiconductor device 2 may further include the buried layer 130 filling the first recess 212R and the second recess 214R. Detailed descriptions thereof are omitted.

According to the semiconductor device 2 of example embodiments, the plurality of gate lines GL11, GL12, GL21, and GL22 having various line widths and pitches may not be separately formed by the etching process for separate line pattern, but formed by the etching process according to regions, which is relatively easy to be performed, reliability may be ensured even with the various line widths and various pitches and increase in manufacturing costs of the manufacturing method may be reduced through simplification of the processes.

Figure 33A:
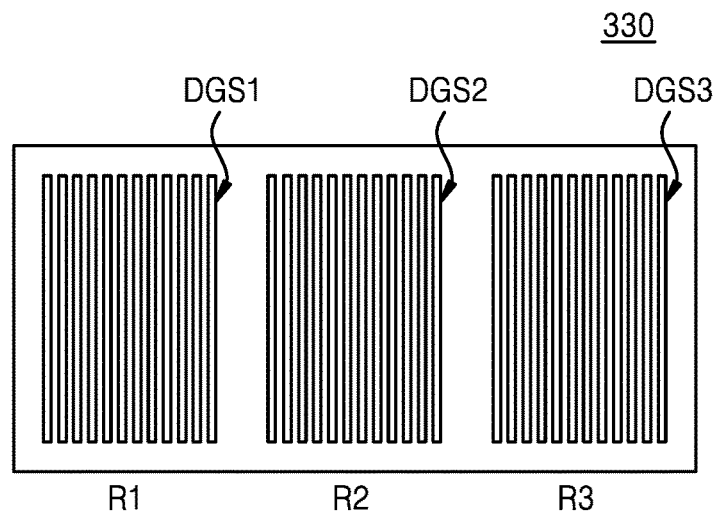
FIGS. 33A-33C are plan views for describing the layout of photomasks used in the method of manufacturing the semiconductor device, according to one or more example embodiments.
Figure 33B:
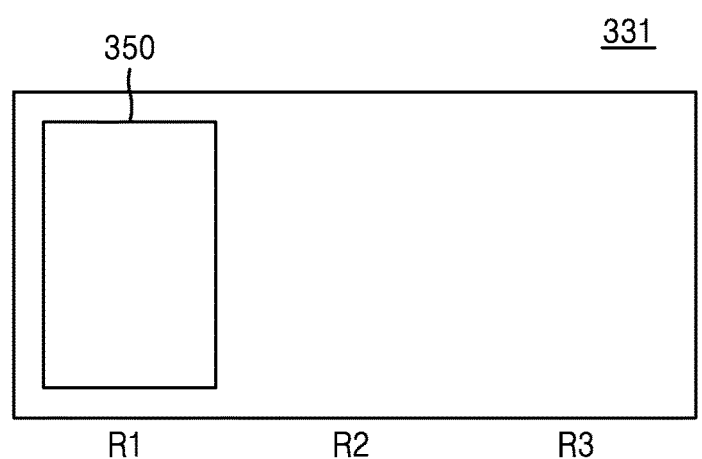
Figure 33C:
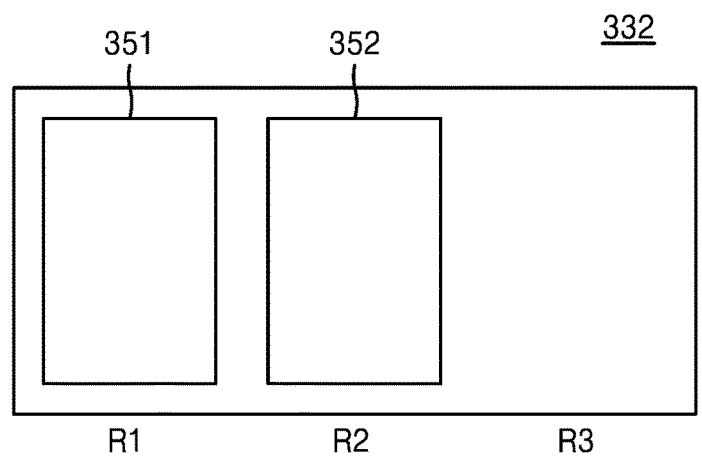

FIGS. 33A-33C are plan views showing the layout of photomasks used in the manufacturing of the semiconductor device 1, according to some example embodiments.

Referring to FIG. 33A, the first photomask 330 may include a plurality of dummy gate patterns DGS1, DGS2, DGS3, in each of three regions R1, R2, and R3. The plurality of dummy gate patterns DGS1, DGS2, and DGS3 may correspond to the plurality of dummy gate patterns DGS described with reference to FIGS. 1-32.

Each of the plurality of dummy gate patterns DGS1, DGS2, and DGS3 may extend in the first direction (X direction). In the second direction (Y direction), each of the pitches of the plurality of dummy gate patterns DGS1, DGS2, and DGS3 may be the same in each of the regions R1, R2, and R3. Furthermore, each of the widths of the plurality of dummy gate patterns DGS1, DGS2, and DGS3 may be the same in each of the regions R1, R2, and R3. The first photomask may be used in a DUV process, an EUV process, a DPT process, a QPT process, an immersion process, and/or an EUV process.

Referring to FIG. 33B, the second photomask 331 may have a first pattern 350 corresponding to the first region R1. There may not be a pattern in regions R2 or R3. The second photomask 331 may not be used in a DUV process, an EUV process, a DPT process, a QPT process, an immersion process to increase the numerical aperture of the photolithographic process above 1.0, and/or an EUV process. For example, the photolithographic process may be a dry photolithographic process. For example, the photolithographic process may be a MUV photolithographic process and/or an i-line photolithographic process.

Referring to FIG. 33C, the third photomask 332 may have a third pattern 351 corresponding to the first region R1, and a fourth pattern 352 corresponding to the second region R2. There may not be a pattern corresponding to the third regions R3. The third photomask 352 may not be used in a DUV process, an EUV process, a DPT process, a QPT process, an immersion process to increase the numerical aperture of the photolithographic process above 1.0, and/or an EUV process. For example, the photolithographic process may be a dry photolithographic process. For example, the photolithographic process may be a MUV photolithographic process and/or an i-line photolithographic process.

While inventive concepts has been particularly shown and described with reference to embodiments thereof, it will be understood that various changes in form and details may be made therein without departing from the spirit and scope of the following claims.

What is claimed is:

1. A method of manufacturing a semiconductor device, the method comprising:
    forming a plurality of dummy gate structures on a substrate, the substrate including a first region and a second region, the plurality of dummy gate structures extending in a first direction and arranged in the first region and the second region, the plurality of dummy gate structures in the first region and the second region having uniform pitches in a second direction, the second direction being different from the first direction, the plurality of dummy gate structures in the first region and the second region having uniform widths in the second direction;
    forming a first cover layer conformally covering, in the first region, the substrate and the plurality of dummy gate structures;
    forming a second cover layer conformally covering the first cover layer in the first region and conformally covering, in the second region, the substrate and the plurality of dummy gate structures;
    forming a spacer layer covering a) the second cover layer that covers opposite side walls of the plurality of dummy gate structures in the first region and b) the first cover layer that covers opposite side walls of the plurality of dummy gate structures in the second region;
    forming a plurality of first gate spaces in the first region and a plurality of second gate spaces in the second region by removing together, from the first region and the second region, the plurality of dummy gate structures, a portion of the first cover layer, and a portion of the second cover layer; and
    forming a) a plurality of first gate lines filling the plurality of first gate spaces and b) a plurality of second gate lines filling the plurality of second gate spaces.

2. The method of claim 1, wherein the forming of the first cover layer comprises:
    forming the first cover layer in both the first region and the second region, the first cover layer conformally covering the substrate and the plurality of dummy gate structures in the first region and the second region; and
    removing the first cover layer formed in the second region.

3. The method of claim 1, wherein, in the second direction, a first gap of each of the plurality of first gate spaces is greater than a second gap of each of the plurality of second gate spaces.

4. The method of claim 1, wherein, in the second direction, a first width of each of the plurality of first gate lines is greater than a second width of each of the plurality of second gate lines.

5. The method of claim 4, wherein a difference between the first width and the second width is twice a thickness of the first cover layer.

6. The method of claim 1, wherein the substrate further comprises a third region,
    the forming of the plurality of dummy gate structures comprises forming the plurality of dummy gate structures in the third region,
    a. the forming of the first cover layer comprises,
    forming the first cover layer in the first region, the second region, and the third region, the first cover layer conformally covering the substrate and the plurality of dummy gate structures, and
    removing the first cover layer formed in the second region and the third region, and
    b. the forming of the second cover layer comprises,
    forming the second cover layer conformally covering the first cover layer in the first region and conformally covering the substrate and the plurality of dummy gate structures in the second region and the third region, and
    removing the second cover layer formed in the third region.

7. The method of claim 6, wherein the forming of the plurality of first gate spaces and the plurality of second gate spaces further comprises:
    removing the plurality of dummy gate structures in the third region to further form a plurality of third gate spaces in the third region; and
    forming a plurality of third gate lines respectively filling the plurality of third gate spaces.

8. The method of claim 7, wherein the plurality of first gate lines, the plurality of second gate lines, and the plurality of third gate lines are simultaneously formed in the first region, the second region, and the third region, respectively.

9. The method of claim 7, wherein a first width of each of the plurality of first gate lines in the second direction is greater than a second width of each of the plurality of second gate lines, and the second width of each of the second gate lines is greater than a third width of each of the plurality of third gate lines.

10. The method of claim 9, wherein differences among the first width, the second width, and the third width are in proportion to differences between an upper surface of the substrate and a bottom surface of the spacer layer in the first region, the second region, and the third region, respectively.

11. A method of manufacturing a semiconductor device, the method comprising:
    preparing a substrate including a first region, a second region, a third region, and a fourth region;
    forming a plurality of first dummy gate structures in the first region and the second region, the plurality of first dummy gate structures extending in a first direction and each having a first pitch in a second direction, the second direction different from the first direction, the plurality of first dummy gate structures having a first width in the second direction;
    forming a plurality of second dummy gate structures in the third region and the fourth region, the plurality of second dummy gate structures extending in the first direction and each having a second pitch in the second direction, the second pitch being different from the first pitch, each of the plurality of second dummy gate structures having a second width in the second direction;

forming a first cover layer in the first region and the third region, the first cover layer conformally covering the substrate and the plurality of first dummy gate structures;

forming a second cover layer conformally covering a) the first cover layer in the first region and the third region, and b) the substrate in the second region and the further region and the plurality of first and second dummy gate structures in the second region and the fourth region;

forming a spacer layer covering opposite side walls of each of the plurality of first and second dummy gate structures in the first region and the third region, and covering opposite side walls of each of the plurality of first and second dummy gate structures in the second region and the fourth region;

forming a plurality of first gate spaces, a plurality of second gate spaces, a plurality of third gate spaces, and a plurality of fourth gate spaces respectively in the first region, the second region, the third region, and the fourth region by removing the plurality of first and second dummy gate structures, a portion of the first cover layer, and a portion of the second cover layer; and forming a plurality of first gate lines filling the plurality of first gate spaces, a plurality of second gate lines filling the plurality of second gate spaces, a plurality of third gate lines filling the plurality of third gate spaces, and a plurality of fourth gate lines filling the plurality of fourth gate spaces.

12. The method of claim 11, wherein the forming of the plurality of first gate spaces, the plurality of second gate spaces, the plurality of third gate spaces, and the plurality of fourth gate spaces comprises:

forming a first base layer in which a remaining portion of the first cover layer and a remaining portion of the second cover layer are stacked under the spacer layer in the first region and the third region; and forming a second base layer including a remaining portion of the second cover layer under the spacer layer in the second region and the fourth region.

13. The method of claim 12, wherein the plurality of first gate lines in the first region and the plurality of second gate lines in the second region are have the first pitch in the second direction, and the plurality of third gate lines in the third region and the plurality of fourth gate lines in the fourth region have the second pitch in the second direction, and in the second direction, a third width of each of the plurality of first gate lines is greater than a fourth width of each of the plurality of second gate lines, and a fifth width of each of the plurality of third gate lines is greater than a sixth width of each of the plurality of fourth gate lines.

14. The method of claim 13, wherein each of a difference between the third width and the fourth width and a difference between the fifth width and the sixth width is twice a difference between a thickness of the first base layer and a thickness of the second base layer.

15. The method of claim 11, wherein the forming of the first cover layer comprises:

forming the first cover layer in the first region, the second region, the third region, and the fourth region, the first cover layer conformally covering the substrate and the plurality of first and second dummy gate structures; and removing the first cover layer formed in the second region and the fourth region.

16. A method of manufacturing a semiconductor device comprising:

forming a plurality of dummy gate structures on a substrate, the substrate including a first region and a second region, the plurality of dummy gate structures extending in a first direction and arranged in the first region and the second region, the plurality of dummy gate structures in the first region and the second region having uniform pitches in a second direction, the second direction being different from the first direction, the plurality of dummy gate structures in the first region and the second region having uniform widths in the second direction, the forming the plurality of dummy gate structures including forming the plurality of dummy gate structures in the first region and the second region using a first photomask, the first photomask including patterns corresponding to the dummy gate structures in the first region and the second region;

forming a first cover layer conformally covering, in the first region, the substrate and the plurality of dummy gate structures, the forming the first cover layer including using a second photomask, the second photomask including a pattern corresponding to the first region; and forming a second cover layer conformally covering, in the first region, the first cover layer and conformally covering, in the second region, the substrate and the plurality of dummy gate structures.

17. The method of claim 16, wherein the forming the plurality of dummy gates includes forming the plurality of dummy gates with a first photolithographic process, the first photolithographic process including at least one of a deep ultraviolet (DUV) photolithography technology, an immersion photolithography technology, a double patterning (DPT) technology, or an extreme ultraviolet (EUV) photolithography technology.

18. The method of claim 16, wherein the forming the first covering layer includes forming the first covering layer with a second photolithographic process, wherein the second photolithographic process is not one of a deep ultraviolet (DUV) photolithography technology, an immersion photolithography technology, a double patterning (DPT) technology, or an extreme ultraviolet (EUV) photolithography technology.

19. The method of claim 16, wherein the forming the plurality of dummy gate structures includes forming the plurality of dummy gate structures using a photolithography process having a first wavelength, and wherein the forming the first cover layer includes forming the first cover layer using a photolithography process having a second wavelength greater than the first wavelength.

20. The method of claim 16, wherein the forming the second cover layer includes forming the second cover layer using a third photomask, the third photomask including patterns corresponding to the first region and the second region.

* * * * *